(12) United States Patent
Yabe et al.

(10) Patent No.: US 9,365,767 B2
(45) Date of Patent: Jun. 14, 2016

(54) ORGANIC ELECTRIC FIELD LIGHT EMITTING ELEMENT AND PRODUCTION THEREFOR

(75) Inventors: Masayoshi Yabe, Yokohama (JP); Tomoyuki Ogata, Yokohama (JP); Hideki Sato, Yokohama (JP); Koichiro Iida, Yokohama (JP); Asato Tanaka, Yokohama (JP); Mitsuru Tanamura, Yokohama (JP); Yuichiro Kawamura, Ichihara (JP); Hironori Ishikawa, Yokohama (JP); Kazuki Okabe, Yokohama (JP)

(73) Assignee: Mitsubishi Chemical Corporation, Tokyo (JP)

( * ) Notice: Subject to any disclaimer, the term of this patent is extended or adjusted under 35 U.S.C. 154(b) by 307 days.

(21) Appl. No.: 11/816,672

(22) PCT Filed: Feb. 14, 2006

(86) PCT No.: PCT/JP2006/302502
§ 371 (c)(1),
(2), (4) Date: Aug. 20, 2007

(87) PCT Pub. No.: WO2006/095539
PCT Pub. Date: Sep. 14, 2006

(65) Prior Publication Data
US 2009/0066223 A1 Mar. 12, 2009

(30) Foreign Application Priority Data

Feb. 21, 2005 (JP) ................................. 2005-044250

(51) Int. Cl.
*H01L 51/54* (2006.01)
*C09K 11/06* (2006.01)
*H01L 51/50* (2006.01)
*H05B 33/14* (2006.01)
*H01L 51/00* (2006.01)

(52) U.S. Cl.
CPC ............ *C09K 11/06* (2013.01); *H01L 51/0067* (2013.01); *H01L 51/0072* (2013.01); *H01L 51/0085* (2013.01); *H01L 51/5016* (2013.01); *H01L 51/5048* (2013.01); *H05B 33/14* (2013.01); *C09K 2211/185* (2013.01); *H01L 51/0059* (2013.01)

(58) Field of Classification Search
None
See application file for complete search history.

(56) References Cited

U.S. PATENT DOCUMENTS

| | | | |
|---|---|---|---|
| 6,303,238 B1 * | 10/2001 | Thompson et al. | 428/690 |
| 6,366,017 B1 | 4/2002 | Antoniadis et al. | |
| 6,821,646 B2 * | 11/2004 | Tsuboyama et al. | 428/690 |
| 7,147,935 B2 * | 12/2006 | Kamatani et al. | 428/690 |
| 2003/0189191 A1 * | 10/2003 | Kunimoto et al. | 252/301.31 |
| 2004/0096570 A1 * | 5/2004 | Weaver et al. | 427/66 |
| 2004/0096698 A1 | 5/2004 | Kishimoto | |
| 2004/0169461 A1 * | 9/2004 | Moriyama et al. | 313/503 |
| 2004/0209115 A1 | 10/2004 | Thompson et al. | |
| 2004/0214040 A1 | 10/2004 | Lee et al. | |
| 2005/0127823 A1 * | 6/2005 | Iwakuma et al. | 313/504 |
| 2006/0186796 A1 * | 8/2006 | Yabe et al. | 313/504 |
| 2009/0191427 A1 * | 7/2009 | Liao et al. | 428/690 |

FOREIGN PATENT DOCUMENTS

| | | |
|---|---|---|
| EP | 0 954 205 A2 | 11/1999 |
| JP | 11-251060 | 9/1999 |
| JP | 11 273859 | 10/1999 |
| JP | 3069139 | 5/2000 |
| JP | 2003-45666 | 2/2003 |
| JP | 2003192691 A1 * | 7/2003 |
| JP | 2005-240008 | 9/2005 |
| JP | 2005-272803 | 10/2005 |
| JP | 2005-272805 | 10/2005 |
| JP | 2005-533349 | 11/2005 |
| JP | 2005-537354 | 12/2005 |
| JP | 2006 73992 | 3/2006 |
| KR | 10-2007-0015605 A | 2/2007 |

(Continued)

OTHER PUBLICATIONS

Machine translation of JP2003-192691. Date of publication: Jul. 9, 2003.*
Gufeng He, et al., "High-Efficiency and Low-Voltage p-i-n Electrophosphorescent Organic Light-Emitting Diodes with Double-Emission Layers", Applied Physics Letters, American Institute of Physics, vol. 85, No. 17, XP012063133, Oct. 25, 2004, pp. 3911-3913.
Shinjiro Okada, et al., "52.2: High Efficiency RED Organic Light Emitting Material and Device Based on Triplet Emission with Ir Complex", SID International Symposium, SID 02 Digest, vol. XXXIII, XP007008070, May 21, 2002, pp. 1360-1363.
Thompson, M. E.,"Efficient Utilization of Excitons", [online] NSF Workshop on Fundamental Research Needs in Photonic Materials Synthesis and Processing at the Interface 2003, internet <http://www.rochester.edu/College/workshop/presentations/markThompson/Mt_2003.ppt#615,25,FIr6 device structure>, 2006.

(Continued)

*Primary Examiner* — Andrew K Bohaty
(74) *Attorney, Agent, or Firm* — Oblon, McClelland, Maier & Neustadt, L.L.P

(57) ABSTRACT

A composition for an organic electroluminescent device is a composition for forming an organic light emitting layer of an organic electroluminescent device by wet coating process. The composition contains a phosphorescent material, a charge transport material, and a solvent, in which the phosphorescent material and the charge transport material are each an unpolymerized organic compound, and the first oxidation potential of the phosphorescent material $E_D^+$, the first reduction potential of the phosphorescent material $E_D^-$, the first oxidation potential of the charge transporting material $E_T^+$, and the first reduction potential of the charge transporting material $E_T^-$ satisfy the following condition: $E_T^- + 0.1 \leq E_D^- < E_T^+ \leq E_D^+ - 0.1$ or $E_D^- + 0.1 \leq E_T^- < E_D^+ \leq E_T^+ - 0.1$.

14 Claims, 4 Drawing Sheets

(56) References Cited

FOREIGN PATENT DOCUMENTS

| TW | 200305353 | | 10/2003 | |
|---|---|---|---|---|
| WO | WO 0244189 A1 | * | 6/2002 | |
| WO | WO 03078541 A1 | * | 9/2003 | |
| WO | 2005 011370 | | 2/2005 | |
| WO | 2005 019373 | | 3/2005 | |
| WO | WO 2005022962 A1 | * | 3/2005 | ............. H05B 33/22 |
| WO | WO 2005/115061 A1 | | 12/2005 | |

OTHER PUBLICATIONS

Organic EL Materials and Technologies, 2004, CMC Publishing Co., Ltd., Tokyo, Japan, pp. 226-227 (w/partial English translation).

Office Action issued Dec. 13, 2011 in Japan Application No. 2006-036880.

Mark Thompson, Efficient utilization of excitons, NSF Workshop on Fundamental Research Needs in Photonic Materials Synthesis and Processing at the Interface, URL <http://www.rochester.edu/college/workshop/presentations/MarkThompson/MT_2003.ppt>, May 56, 2006, 20 pages.

Chinese Office Action of the corresponding Chinese patent application 201010268701.5 issued Jun. 15, 2011 (with English Translation).

M. Baldo, et al., "Very high-efficiency green organic light-emitting devices based on electrophosphorescence", Applied Physics Letters, vol. 75, No. 1, Jul. 1999, pp. 4-6.

Office Action issued Jan. 6, 2012 in China Application No. 201010268701.5 (With English Translation).

Chinese Office Action issued Mar. 23, 2012, in Patent Application No. 200680005601.5 (with English translation).

Office Action issued Jun. 5, 2012, in Japanese Patent Application No. 2006-036880 (with English-language translation).

Office Action issued Dec. 20, 2011 in Japan Application No. 2009-027021.

Office Action issued Nov. 27, 2012, in Japanese patent application No. 2009-027021.

Korean Office Action Issued Apr. 30, 2013 in Patent Application No. 10-2007-7019151.

Office Action issued Aug. 29, 2012, in European patent application No. 06 713 643.2.

Office Action issued Aug. 20, 2012, in Taiwanese patent application No. 95105720.

He et al, *Ultra-high efficiency electrophosphorescent p-i-n OLEDs with double emission layers*, Proceedings of SPIE, vol. 5519, pp. 42-47 (2004).

Anthopoulos, *Applied Physics Letters*, vol. 82(26), pp. 4824-4826, (2003).

European Office Action issued Jul. 23, 2013 in Patent Application No. 06 713 643.2.

Office Action issued Oct. 14, 2013, in Taiwanese patent application No. 95105720 (w/ English translation).

Connelly et al, "Chemical Redox Agents for Organometallic Chemistry", Chem. Rev. (1996), vol. 96, pp. 877-910.

Ajloo et al, "Solvent Effect on the Reduction Potential of Anthraquinones Derivatives. The Experimental and Computational Studies", Int. J. Electrochem. Sci., (2010) vol. 5, pp. 459-477.

Hino et al, "Efficient low-molecule phosphorescent organic light-emitting diodes fabricated by wet-processing", Organic Electronics (2004) vol. 5, pp. 265-270.

Miscellaneous documents "describing conducted measurement method and results obtained", submitted with opposition filed Dec. 19, 2014, to European patent application No. 06713643.2.

* cited by examiner

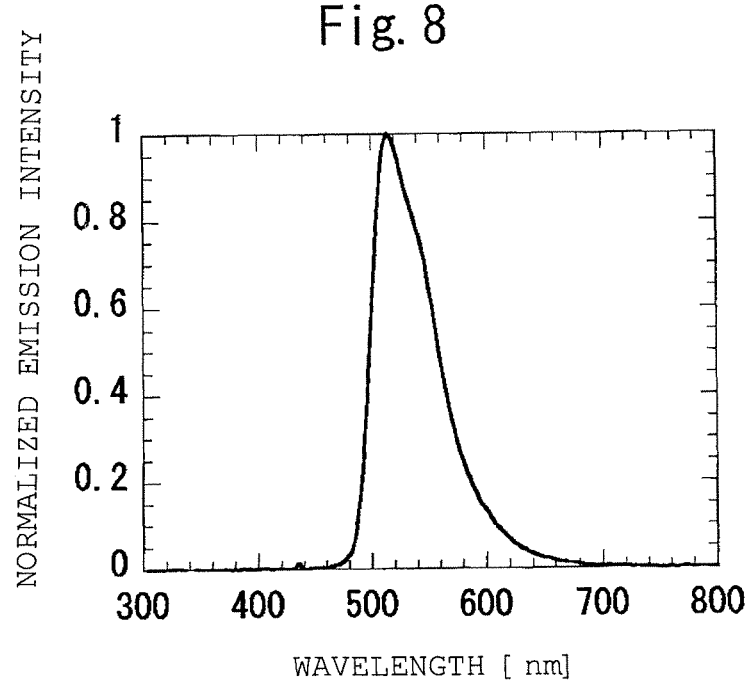

ORGANIC ELECTRIC FIELD LIGHT EMITTING ELEMENT AND PRODUCTION THEREFOR

FIELD OF THE INVENTION

The present invention relates to a composition for an organic electroluminescent device which can easily yield an organic electroluminescent device through wet coating process, and the resulting organic electroluminescent device has an excellent luminous efficiency and a satisfactory operating life. It also relates to a thin film for an organic electroluminescent device, a transfer member for a thin film for an organic electroluminescent device, and an organic electroluminescent device, each of which is formed by using the composition for an organic electroluminescent device. In addition, it relates to a method of manufacturing the organic electroluminescent device.

BACKGROUND OF THE INVENTION

There have been developed electroluminescent devices using organic thin films (organic electroluminescent devices). Materials for organic electroluminescent devices can be roughly classified into low molecular weight materials and high molecular weight materials.

There have been developed organic electroluminescent devices using low molecular weight materials. Examples of such devices include an organic electroluminescent device having a hole transport layer formed from an aromatic diamine, and a light emitting layer formed from aluminum 8-hydroxyquinoline complex; and an organic electroluminescent device using aluminum 8-hydroxyquinoline complex as a host material, doped with a fluorescent dye for laser, such as coumarin. Low molecular weight materials such as the following platinum complex and iridium complex are also used as materials for light emitting layers.

[Chemical Formula 1]

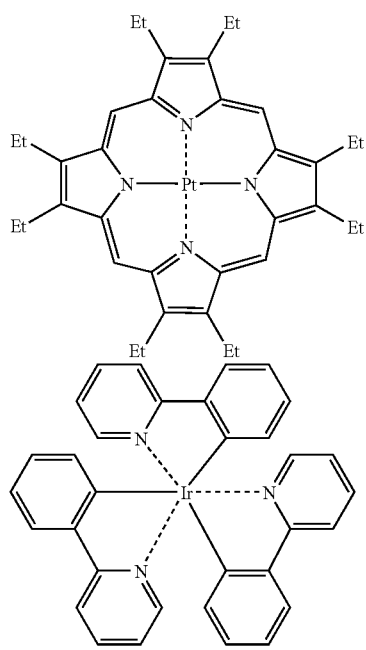

There have also been developed organic electroluminescent devices using high molecular weight materials such as poly(p-phenylenevinylene)s, poly[2-methoxy-5-(2-ethylhexyloxy)-1,4-phenylenevinylene]s, and poly(3-alkylthiophene)s; and devices using high molecular weight materials such as polyvinylcarbazoles, in combination with low molecular weight luminescent materials and electron transfer materials. Most of such devices using high molecular weight materials are manufactured by wet coating process such as spin coating or an ink jet process, in consideration of properties of the materials.

Focusing attention on processes for forming thin films, films of most low molecular weight materials have been formed by vacuum deposition, and films of most high molecular weight materials have been formed by wet coating process. The vacuum deposition is advantageous typically in that a film with good quality can be uniformly formed on a substrate, that a multilayer film can be easily formed to yield a device having excellent properties easily, and that contamination of impurities derived from the manufacturing process is very little. Accordingly, most of organic electroluminescent devices currently used in practice are formed by vacuum deposition using low molecular weight materials.

In contrast, the wet coating process is advantageous typically in that no vacuum process is required, that a film with a larger area can be easily obtained, and that one layer (coating composition) can contain plural materials having different functions. The wet coating process, however, has following problems, and most devices formed by wet coating process are not developed to a practical level, except for those using some high molecular weight materials.

It is difficult to control the degrees of polymerization and the molecular weight distributions of high molecular weight materials (polymerized organic compounds).

When devices are operated continuously, terminal residues cause deterioration of the devices.

It is difficult to purify high molecular weight materials highly, and the resulting materials may contain impurities.

As an attempt to solve these problems, following Patent Document 1 and Patent Document 2 each disclose the use of low molecular weight materials (unpolymerized organic compounds) each containing a fluorescent substance, a hole transport material, and an electron transport material, instead of high molecular weight materials (polymerized organic compounds). This attempt is intended to reduce the drive voltage by allowing the hole transport material and the electron transport material to transport holes and electrons injected from an anode and a cathode, respectively. The resulting devices, however, operate at high drive voltages and have insufficient luminous efficiencies, because holes and electrons are not sufficiently injected from the anode and cathode, respectively. Oxadiazole derivatives used as the electron transport material are insufficient in drive stability (operation stability) and thereby insufficient in operating life.

In addition, it is difficult to adopt a phosphorescent material or a blue-emitting material as a luminescent material, because the resulting luminescent material has a large energy gap.

Patent Document 1: Japanese Patent No. 3069139
Patent Document 2: Japanese Unexamined Patent Application Publication No. 11-273859

DISCLOSURE OF INVENTION

An object of the present invention is to provide an organic electroluminescent device which has an organic light emitting layer formed by wet coating process, enables charges to be injected from electrodes into the organic light emitting layer satisfactorily, and shows an excellent luminous efficiency and a satisfactory operating life.

According to a first aspect of the present invention, there is provided a composition for an organic electroluminescent device, including a phosphorescent material, a charge transport material, and a solvent. Each of the phosphorescent material and the charge transport material is independently an unpolymerized organic compound.

In the composition, the first oxidation potential of the phosphorescent material $E_D^+$, the first reduction potential of the phosphorescent material $E_D^-$, the first oxidation potential of the charge transporting material $E_T^+$, and the first reduction potential of the charge transporting material $E_T^-$ satisfy the following condition:

$$E_T^- + 0.1 \leq E_D^- < E_T^+ \leq E_D^+ - 0.1$$

or $$E_D^- + 0.1 \leq E_T^- < E_D^+ \leq E_T^+ - 0.1$$

According to a second aspect, there is provided a thin film for an organic electroluminescent device, which is a thin film formed from the composition for an organic electroluminescent device according to the first aspect through wet coating process.

According to a third aspect, there is provided a transfer member for a thin film for an organic electroluminescent device, which includes a base material and a thin film arranged on the base material, in which the thin film is formed from the composition for an organic electroluminescent device according to the first aspect through wet film-formation.

According to a fourth aspect, there is provided an organic electroluminescent device including a substrate bearing an anode, a cathode, and an organic light emitting layer arranged between the two electrodes, in which the organic light emitting layer is a layer formed by using the transfer member for a thin film for an organic electroluminescent device according to the third aspect.

According to a fifth aspect, there is provided an organic electroluminescent device including a substrate bearing an anode, a cathode, and an organic light emitting layer arranged between the two electrodes, in which the organic light emitting layer is a layer formed from the composition for an organic electroluminescent device according to the first aspect through wet film-formation.

According to a six aspect, there is provided a method of manufacturing an organic electroluminescent device including a substrate bearing an anode, a cathode, and an organic light emitting layer arranged between the two electrodes. The method includes the step of forming the organic light emitting layer by wet film-formation using the composition for an organic electroluminescent device according to the first aspect.

BRIEF DESCRIPTION OF THE DRAWINGS

FIG. 8 is a graph showing an electroluminescence spectrum of a device prepared according to Example 1.

DETAILED DESCRIPTION

Figure 1:
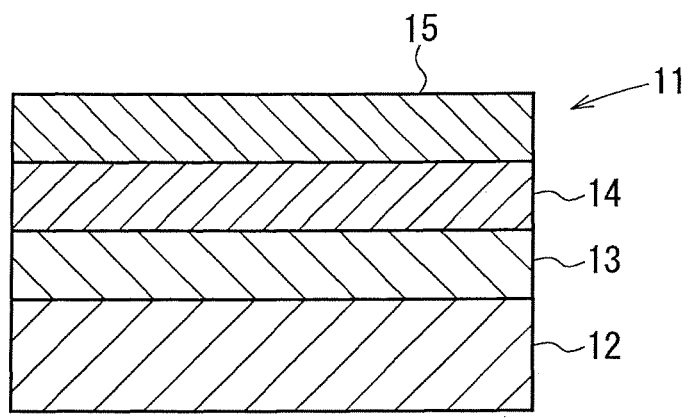
FIG. 1 is a schematic cross-sectional view illustrating an embodiment of a transfer member for a thin film for an organic electroluminescent device.

A composition for an organic electroluminescent device according to the present invention has a long pot life, excellent heat resistance, and a low viscosity, and is satisfactorily homogenous. In addition, the thickness of a film of the composition upon film-formation can be easily adjusted. By using the composition for an organic electroluminescent device, an organic electroluminescent device can be easily obtained through wet film-formation, and the resulting device enables charges to be satisfactorily injected from electrodes into an organic light emitting layer and has an excellent luminous efficiency and a satisfactory operating life.

Known organic electroluminescent devices prepared through wet film-formation fail to enable charges to be satisfactorily injected from electrodes into an organic light emitting layer. They also operate at high drive voltages and have insufficient luminous efficiencies, unsatisfactory drive stability and operating lives. In addition, they have such energy gaps in their luminescent materials as to inhibit practical use of such devices. In contrast, the composition for an organic electroluminescent device according to the present invention solves these problems in related art. The reason for this has not yet been clarified but is supposed as follows.

It has been considered that wide-gap charge transporting materials (host materials) are required for light emission of wide-gap devices typically including phosphorescent materials and blue-emitting materials. A phosphorescent material and a charge transporting material can be significantly involved in injection of either one of hole and electron, and as a result the device can be driven at low voltage, when:

the first oxidation potential of the phosphorescent material $E_D^+$, the first reduction potential of the phosphorescent material $E_D^-$, the first oxidation potential of the charge transporting material $E_T^+$, and the first reduction potential of the charge transporting material $E_T^-$ satisfy the following condition:

$$E_T^- + 0.1 \leq E_D^- < E_T^+ \leq E_D^+ - 0.1$$

or $$E_D^- + 0.1 \leq E_T^- < E_D^+ \leq E_T^+ - 0.1$$

When one of the charges (hole or electron) is trapped by the highest occupied molecular orbital (HOMO) or lowest unoccupied molecular orbital (LUMO) of the phosphorescent material, the phosphorescent material has an increased lowest unoccupied molecular orbital (LUMO) or a decreased highest occupied molecular orbital (HOMO) to such a level as to easily receive a charge from the lowest unoccupied molecular orbital (LUMO) or the highest occupied molecular orbital (HOMO) of the charge transporting material. Thus, the phosphorescent material can emit light with a high efficiency.

When materials satisfy the above-mentioned condition, satisfactory advantages are obtained in an organic electroluminescent device having a light emitting layer formed through wet coating process. When the light emitting layer is formed by vapor deposition, there is generally no difference between a device which satisfies the condition and a device which does not.

A thin film for an organic electroluminescent device according to the present invention is formed from the composition for an organic electroluminescent device according to the present invention through wet coating process. The thin film has excellent light-emitting properties, good quality, and excellent heat resistance and is resistant to deterioration even when being electrified over a long time.

A transfer member for a thin film for an organic electroluminescent device according to the present invention includes a base material and a thin film formed on the base material through wet coating process using the composition for an organic electroluminescent device according to the present invention. By using the transfer member, an organic thin film can be easily and conveniently obtained, and the organic thin film has excellent light-emitting properties, good quality, and excellent heat resistance and is resistant to deterioration even when being electrified over a long time.

An organic electroluminescent device according to the present invention includes an organic light emitting layer formed through wet coating process using the composition for an organic electroluminescent device according to the present invention. A method for manufacturing the organic electroluminescent device according to the present invention manufactures the organic electroluminescent device by forming an organic light emitting layer formed through wet coating process using the composition for an organic electroluminescent device according to the present invention. According to the organic electroluminescent device and the manufacturing method thereof, an organic electroluminescent device having high practicality can be easily manufactured through easy and convenient steps.

Accordingly, organic electroluminescent devices according to the present invention can supposedly be applied to flat panel displays such as those for office automation (OA) computers and those as wall-hanging televisions; onboard display devices; displays for cellular phones; light sources utilizing the characteristics as flat light-emitting devices, such as light sources for copying machines and backlight sources for liquid crystal displays or meters; indication panels; and marker lamps.

Some embodiments of the present invention will be illustrated in detail below. It should be noted, however, that following description on components is illustrated only as examples (representative examples) of embodiments according to the present invention, and they are not limitative at all unless departing from the scope and spirit of the present invention.

[Composition for Organic Electroluminescent Device]

A composition for an organic electroluminescent device according to the present invention includes a phosphorescent material, a charge transporting material, and a solvent. Each of the phosphorescent material and the charge transporting material is independently an unpolymerized organic compound.

The first oxidation potential of the phosphorescent material $E_D^+$,
the first reduction potential of the phosphorescent material $E_D^-$,
the first oxidation potential of the charge transporting material $E_T^+$, and
the first reduction potential of the charge transporting material $E_T^-$
satisfy the following condition:

$$E_T^- + 0.1 \leq E_D^- < E_T^+ \leq E_D^+ - 0.1$$

or $$E_D^- + 0.1 \leq E_T^- - E_D^+ \leq E_T^+ - 0.1$$

The terms "unpolymerized organic compound", "phosphorescent material", and "charge transporting material" herein are defined as follows.

Unpolymerized Organic Compound

The term "unpolymerized organic compound" as used herein refers to an organic compound other than a compound generally called polymer (polymerized organic compound). Namely, it refers to a substance other than a substance containing a high molecular weight polymer or a condensation product formed as a result of chain-like repetitions of the same or similar reactions of a low molecular weight compound. More specifically, it refers to a compound which has a substantially single molecular weight and differs from a high molecular weight organic compound formed as a result of regular or random polymerization of one or more polymerizable monomers, oligomers, or polymers, according to any process. The "unpolymerized organic compound" has a molecular structure that can be uniquely and quantitatively defined by a chemical formula.

Phosphorescent Material

The term "phosphorescent material" as used herein refers to a component which mainly acts to emit light and corresponds to a dopant component in an organic electroluminescent device according to the present invention. A component or material is defined as the luminescent material when generally 10% to 100%, preferably 20% to 100%, more preferably 50% to 100%, and most preferably 80% to 100% of light (unit: $cd/m^2$) emitted from the organic electroluminescent device is identified to be from the component or material.

However, the phosphorescent material may have charge transporting ability, as long as its light emitting function is not impaired. The phosphorescent material may include one compound alone or two or more different compounds in arbitrary combinations and proportions.

Hereinafter the "phosphorescent material" is also simply referred as "luminescent material".

Charge Transport Material

The term "charge transport material" refers to a material that can transfer a given charge (namely, electron or hole). The charge transporting material is not specifically limited, as long as it satisfy this condition, and can include any materials. Each of these charge transporting materials can be used alone or used in arbitrary combinations and proportions.

Methods of Measuring Oxidation Potentials and Reduction Potentials

The first oxidation potential and the first reduction potential can be determined according to the following electrochemical measurement (cyclic voltammetry). A supporting electrolyte, a solvent, and electrodes for use in the measurement are not limited to those described below, and any supporting electrolyte, solvent, and electrodes will do, as long as a similar measurement can be conducted.

Initially, a tested material (a luminescent material or charge transport material relating to the present invention) is dissolved in an organic solvent containing about 0.1 mol/L of a supporting electrolyte such as tetrabutylammonium perchlorate or tetrabutylammonium hexafluorophosphate, to yield about 0.1 to 2 mM solution. After removing oxygen from the solution by procedures such as bubbling of dry nitrogen, degassing under reduced pressure, or application of ultrasound, the solution in an electrically neutral state is subjected to electrolytic oxidation (or reduction) using a working electrode such as a glassy carbon electrode, and a counter electrode such as a platinum electrode at a sweep rate of 100 mV/sec. The potential of a first peak detected in electrolytic oxidation (or reduction) is compared with the oxidation/reduction potential of a reference material such as ferrocene, to thereby determine the oxidation (or reduction) potential of the tested material. The oxidation (or reduction) potential thus determined is further converted into a value versus saturated calomel electrode (SCE) as the reference electrode, and the converted value is defined as the first oxidation (or reduction) potential in the present invention.

An organic solvent for use in the measurement should be one having a sufficiently low water content. The organic solvent may be one that can satisfactorily dissolve a luminescent material or charge transport material relating to the present invention therein, is resistant to electrolytic oxidation (or reduction), and ensures a wide potential window. Examples of such organic solvents include acetonitrile, methylene chloride, N,N-dimethylformamide, and tetrahydrofuran.

Individual components constituting a composition for an organic electroluminescent device according to the present invention, and the conditions for their oxidation/reduction potentials, for example, will be described below.

<Phosphorescent Material>

Any known materials are applicable as the phosphorescent material, and each of such phosphorescent materials can be used alone or in combination. Phosphorescent materials are excellent from the viewpoint of internal quantum efficiency. If a fluorescent material is used herein instead of a phosphorescent material, the resulting device does not effectively have an improved efficiency or a prolonged life, even the condition between the charge transport material and the luminescent material is satisfied.

It is important to reduce the molecular symmetry or rigidity of the luminescent material and/or to introduce a lipophilic substituent such as an alkyl group into the luminescent material, in order to improve the solubility in a solvent.

Preferred examples of phosphorescent materials include organometallic complexes each containing a metal selected from transition metals belonging to Group 7 to Group 11 of the periodic table (periodic table of elements: IUPAC Periodic Table of the Elements, 2004).

Preferred metals in phosphorescent organometallic complexes each containing a metal selected from transition metals belonging to Group 7 to Group 11 of the periodic table include ruthenium, rhodium, palladium, silver, rhenium, osmium, iridium, platinum, and gold. Preferred examples of these organometallic complexes include compounds represented by following Formulae (4) and (5), and compounds described in PCT International Publication Numbers WO 2005/011370 and WO 2005/019373.

$$MG_{(q-j)}G'_j \quad (4)$$

In Formula (4), M represents a metal; "q" represents the valency of the metal M; G and G' each represent a bidentate ligand; and "j" represents 0, 1, or 2.

[Chemical Formula 2]

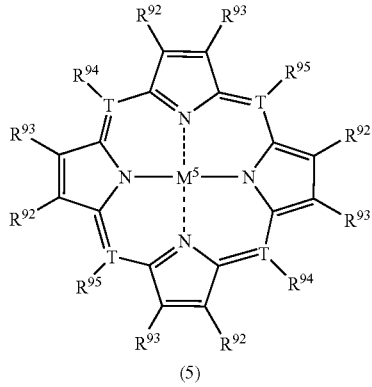

(5)

In Formula (5), $M^5$ represents a metal; T represents carbon or nitrogen; and $R^{92}$ to $R^{95}$ each independently represent a substituent, wherein $R^{94}$ and $R^{95}$ are absent when T is nitrogen.

Initially, compounds represented by Formula (4) will be illustrated below.

In Formula (4), M represents any metal. Preferred examples thereof include the metals listed as the metals selected from Group 7 to Group 11 of the periodic table.

The bidentate ligands G and G' in Formula (4) each independently represent a ligand having the following partial structure:

[Chemical Formula 3]

G:

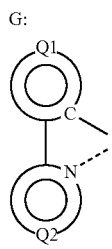

[Chemical Formula 4]

G':

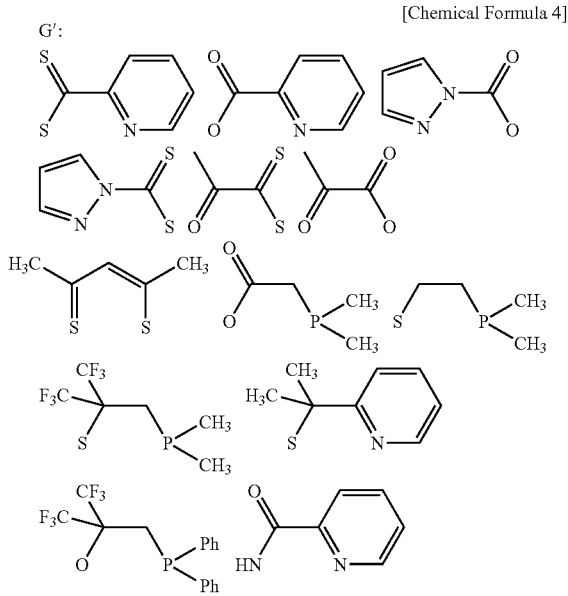

-continued

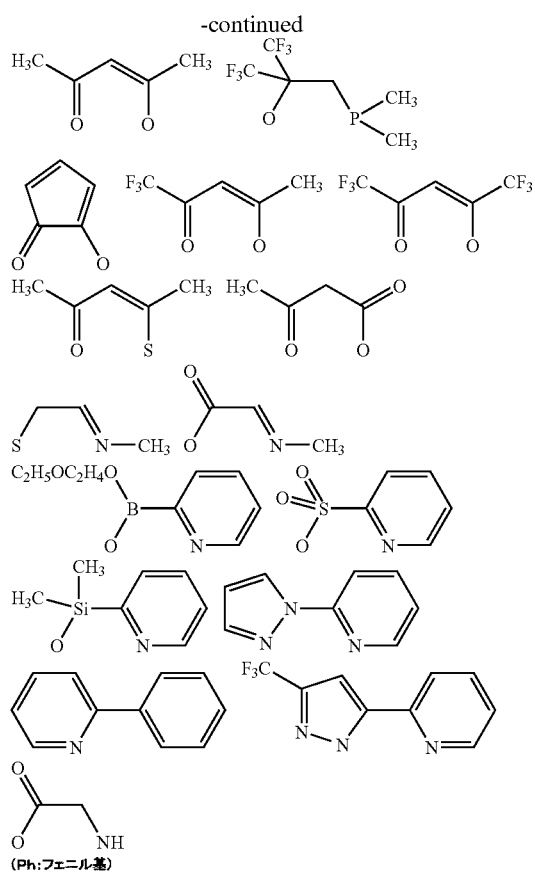

(Ph: phenyl group)

From the viewpoint of stability of the complex, G' is especially preferably:

[Chemical Formula 5]

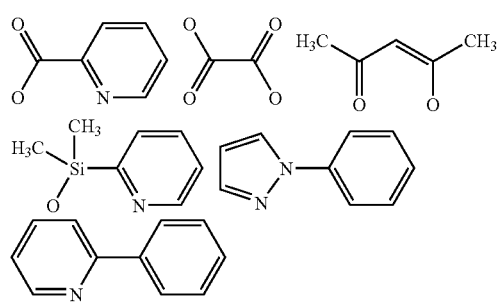

In the partial structures in G and G', Ring Q1 represents an aromatic hydrocarbon group or an aromatic heterocyclic group, each of which may have a substituent; and Ring Q2 represents a nitrogen-containing aromatic heterocyclic group which may have a substituent.

The phrase "which may have a substituent" as used herein means "which may have one or more substituents".

Preferred substituents on Rings Q1 and Q2 include halogen atoms such as fluorine atom; alkyl groups such as methyl group and ethyl group; alkenyl groups such as vinyl group; alkoxycarbonyl groups such as methoxycarbonyl group and ethoxycarbonyl group; alkoxy groups such as methoxy group and ethoxy group; aryloxy groups such as phenoxy group and benzyloxy group; dialkylamino groups such as dimethylamino group and diethylamino group; diarylamino groups such as diphenylamino group; carbazolyl group; acyl groups such as acetyl group; haloalkyl groups such as trifluoromethyl group; cyano group; and aromatic hydrocarbon groups such as phenyl group, naphthyl group, and phenantrhyl group.

More preferred examples of compounds represented by Formula (4) include compounds represented by following Formulae (4a), (4b), and (4c):

[Chemical Formula 6]

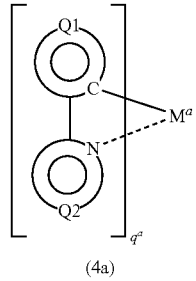

(4a)

In Formula (4a), $M^a$ represents a metal as with M; $q^a$ represents the valency of the metal $M^a$; Ring Q1 represents an aromatic hydrocarbon group or an aromatic heterocyclic group, each of which may have a substituent; and Ring Q2 represents a nitrogen-containing aromatic heterocyclic group which may have a substituent.

[Chemical Formula 7]

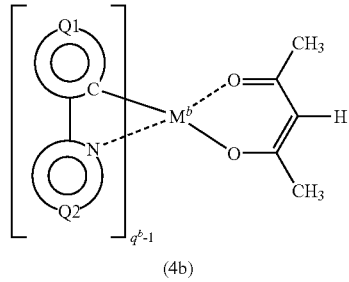

(4b)

In Formula (4b), $M^b$ represents a metal as with M; $q^b$ represents the valency of the metal $M^b$; Ring Q1 represents an aromatic hydrocarbon group or an aromatic heterocyclic group, each of which may have a substituent; and Ring Q2 represents a nitrogen-containing aromatic heterocyclic group which may have a substituent.

[Chemical Formula 8]

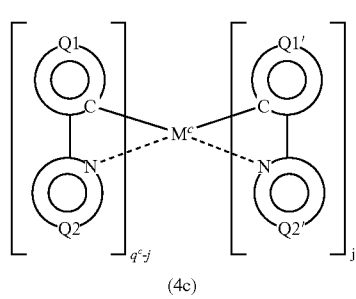

(4c)

In Formula (4c), $M^c$ represents a metal as with M; $q^c$ represents the valency of the metal $M^c$; "j" represents 0, 1, or 2; Ring Q1 and Ring Q1' each independently represent an aromatic hydrocarbon group or an aromatic heterocyclic group, each of which may have a substituent; and Ring Q2 and Ring Q2' each independently represent a nitrogen-containing aromatic heterocyclic group which may have a substituent.

Preferred examples as Ring Q1 and Ring Q1' in Formulae (4a), (4b), and (4c) include phenyl group, biphenyl group, naphthyl group, anthryl group, thienyl group, furyl group, benzothienyl group, benzofuryl group, pyridyl group, quinolyl group, isoquinolyl group, and carbazolyl group.

Preferred examples as Ring Q2 and Ring Q2' include pyridyl group, pyrimidyl group, pyrazyl group, triazyl group, benzothiazolyl group, benzoxazolyl group, benzimidazolyl group, quinolyl group, isoquinolyl group, quinoxalyl group, and phenanthrydyl group.

Examples of substituents which compounds represented by Formulae (4a), (4b), and (4c) may have include halogen atoms such as fluorine atom; alkyl groups such as methyl group and ethyl group; alkenyl groups such as vinyl group; alkoxycarbonyl groups such as methoxycarbonyl group and ethoxycarbonyl group; alkoxy groups such as methoxy group and ethoxy group; aryloxy groups such as phenoxy group and benzyloxy group; dialkylamino groups such as dimethylamino group and diethylamino group; diarylamino groups such as diphenylamino group; carbazolyl group; acyl groups such as acetyl group; haloalkyl groups such as trifluoromethyl group; and cyano group.

When the substituent is an alkyl group, it may generally have one or more and six or less carbon atoms. When the substituent is an alkenyl group, it may generally have two or more and six or less carbon atoms. When the substituent is an alkoxycarbonyl group, it may generally have two or more and six or less carbon atoms. When the substituent is an alkoxy group, it may generally have one or more and six or less carbon atoms. When the substituent is an aryloxy group, it may generally have six or more and fourteen or less carbon atoms. When the substituent is a dialkylamino group, it may generally have two or more and twenty-four or less carbon atoms. When the substituent is a diarylamino group, it may generally have twelve or more and twenty-eight or less carbon atoms. When the substituent is an acyl group, it may generally have one or more and fourteen or less carbon atoms. When the substituent is a haloalkyl group, it may generally have one or more and twelve or less carbon atoms.

These substituents may be combined to form a ring. More specifically, for example, a substituent of Ring Q1 and a substituent of Ring Q2 may be combined to form one condensed ring, or a substituent of Ring Q1' and a substituent of Ring Q2' may be combined to form one condensed ring. An example of the condensed ring includes 7,8-benzoquinoline group.

More preferred substituents on Ring Q1, Ring Q1', Ring Q2, and Ring Q2' include alkyl groups, alkoxy groups, aromatic hydrocarbon groups, cyano group, halogen atoms, haloalkyl groups, diarylamino groups, and carbazolyl group.

Preferred examples of $M^a$, $M^b$, and $M^c$ in Formulae (4a), (4b), and (4c) include ruthenium, rhodium, palladium, silver, rhenium, osmium, iridium, platinum, and gold.

Specific examples of organometallic complexes represented by Formulae (4), (4a), (4b), and (4c) are illustrated below, which, however, are not limitative at all. In the following formulae, Ph represents phenyl group.

[Chemical Formula 9]

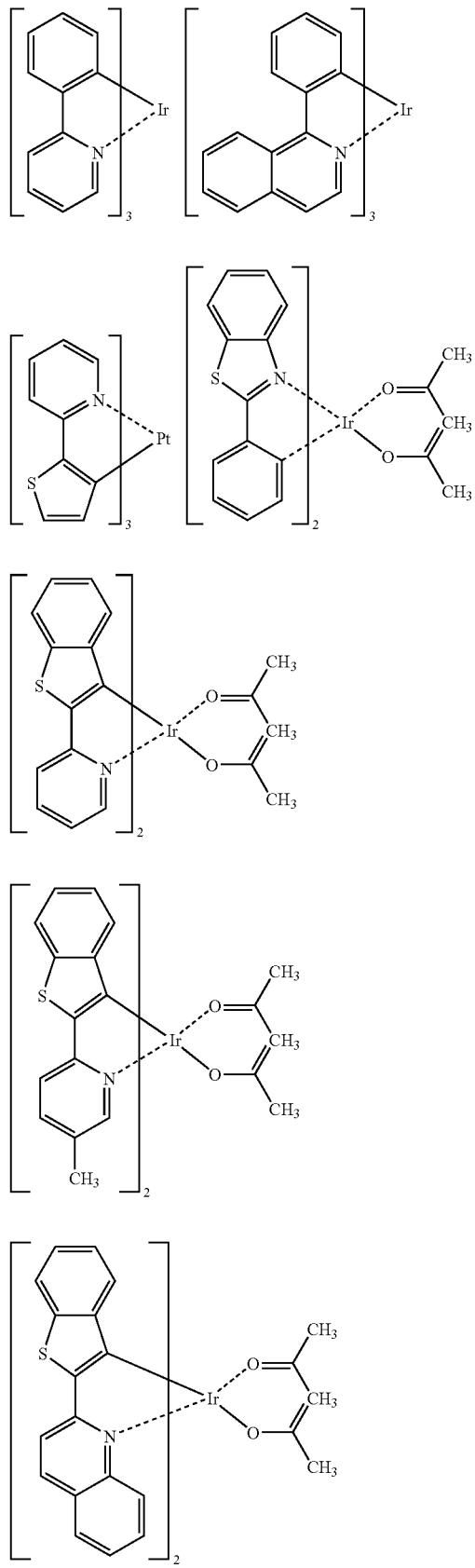

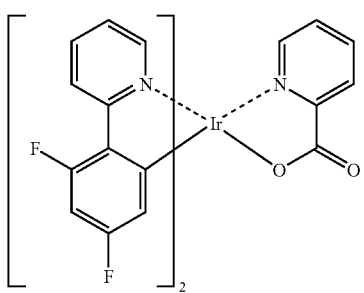
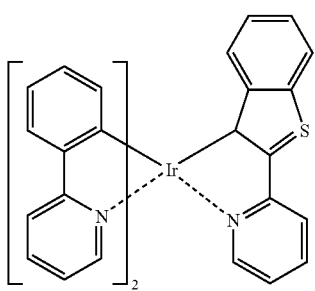
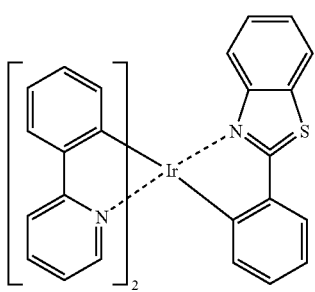
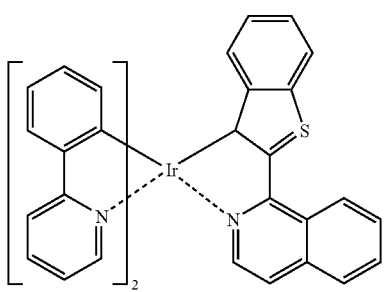
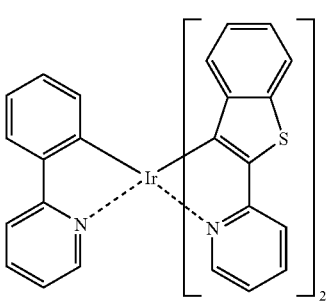
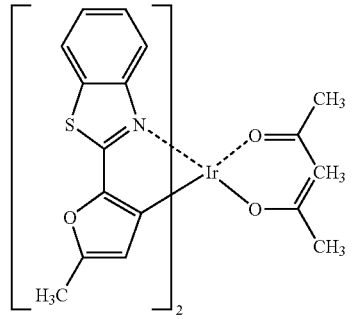
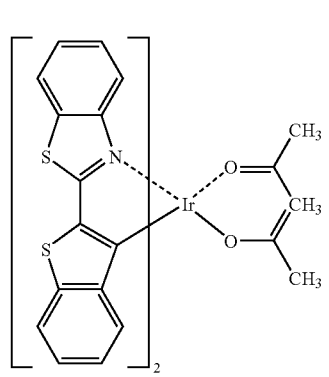
[Chemical Formula 10]
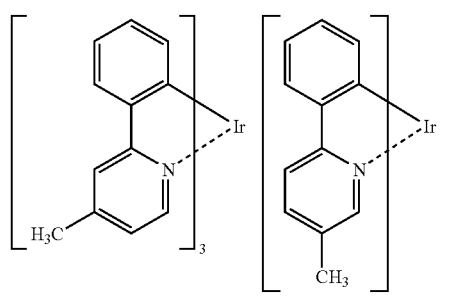
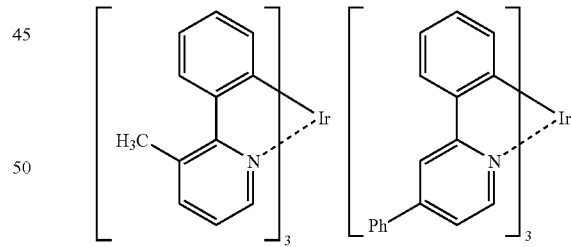
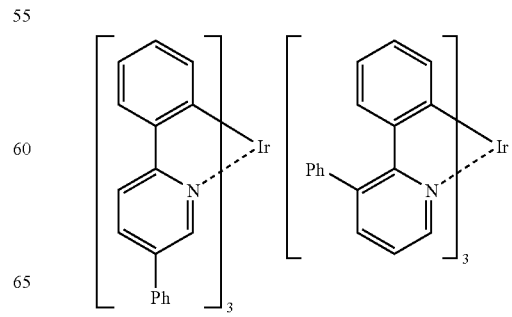

-continued

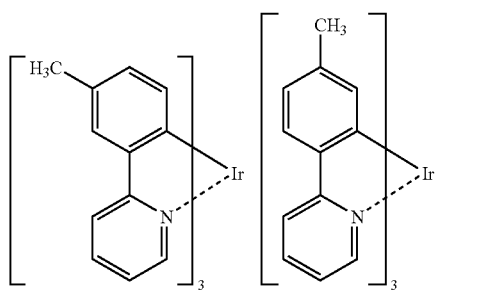
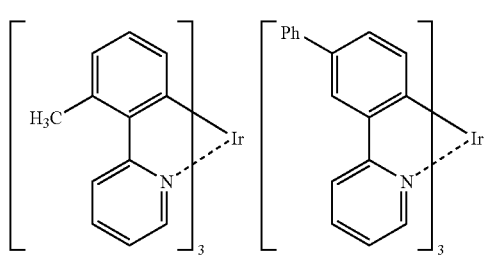
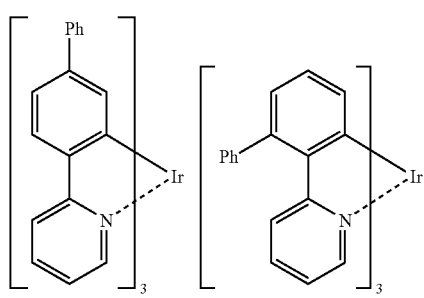
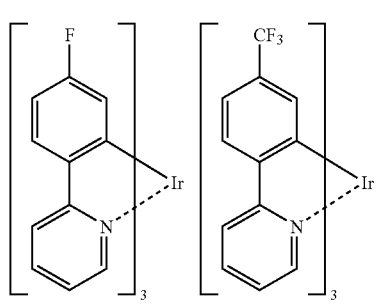
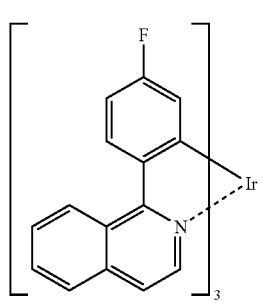

-continued

[Chemical Formula 11]

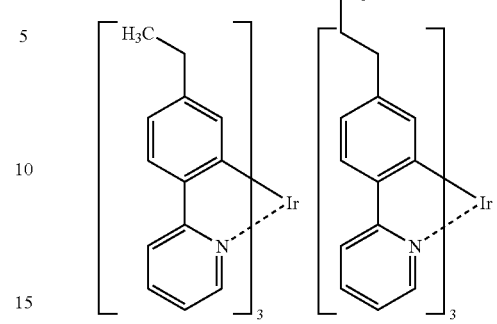
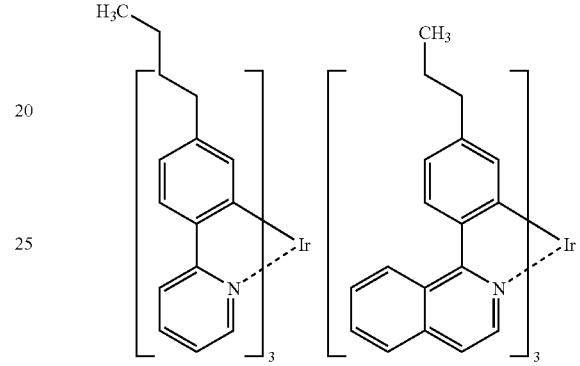
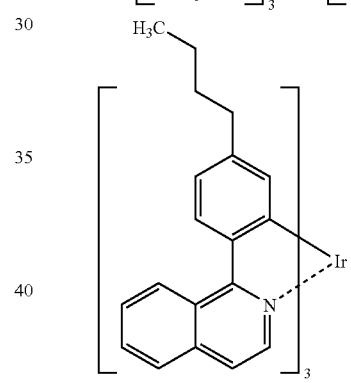

Of organometallic complexes represented by Formulae (4), (4a), (4b), and (4c), typically preferred are compounds each having, as ligand G and/or G', a 2-arylpyridine ligand such as an 2-arylpyridine, an 2-arylpyridine derivative having any substituent, or an 2-arylpyridine derivative condensed with any group.

Next, compounds represented by Formula (5) will be illustrated.

In Formula (5), $M^5$ represents a metal, and specific examples thereof include the metals listed as the metal selected from metals belonging to Group 7 to Group 11 of the periodic table. Among them, preferred are ruthenium, rhodium, palladium, silver, rhenium, osmium, iridium, platinum, and gold, of which bivalent metals such as platinum and palladium are more preferred.

In Formula (5), $R^{92}$ and $R^{93}$ each independently represent hydrogen atom, a halogen atom, an alkyl group, an aralkyl group, an alkenyl group, cyano group, an amino group, an acyl group, an alkoxycarbonyl group, carboxyl group, an alkoxy group, an alkylamino group, an aralkylamino group, a haloalkyl group, hydroxyl group, an aryloxy group, an aromatic hydrocarbon group, or an aromatic heterocyclic group.

When T is carbon, $R^{94}$ and $R^{95}$ each independently represent a substituent exemplified as with $R^{92}$ and $R^{93}$. When T is nitrogen, $R^{94}$ and $R^{95}$ are absent.

$R^{92}$ to $R^{95}$ may each further have a substituent. There is no limitation on substituents which these groups may further have, and any groups can be employed as the substituents.

Adjacent two of $R^{92}$ to $R^{95}$ may be combined to form a ring.

Specific examples (5-a, 5-b, 5-c, 5-d, 5-e, 5-f, and 5-g) of organometallic complexes represented by Formula (5) are illustrated below, which, however, are not limitative at all. In the following formulae, Me represents methyl group, and Et represents ethyl group.

[Chemical Formula 12]

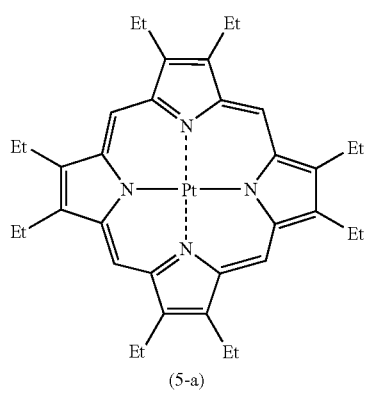

(5-a)

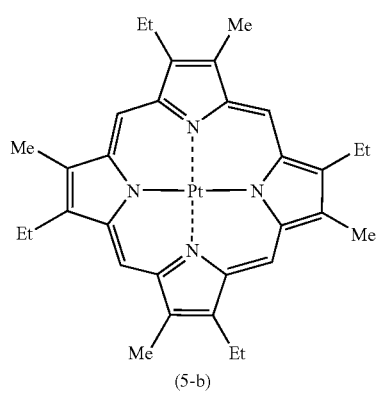

(5-b)

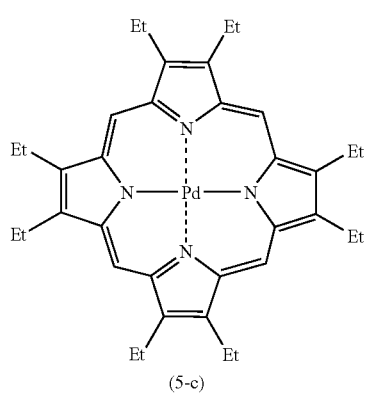

(5-c)

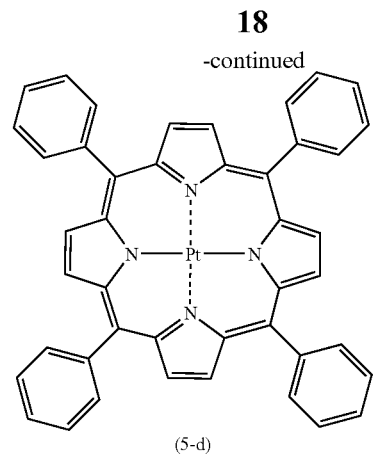

(5-d)

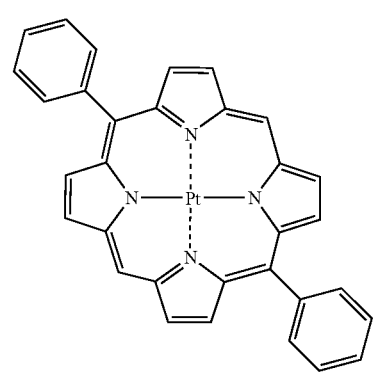

(5-e)

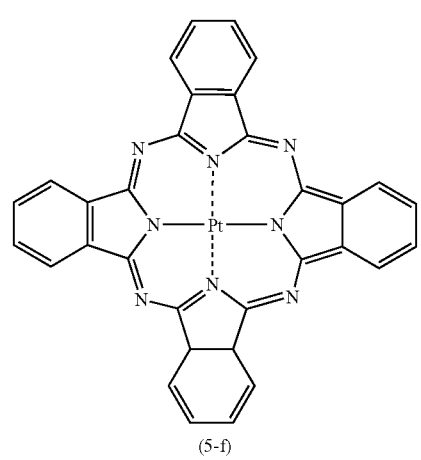

(5-f)

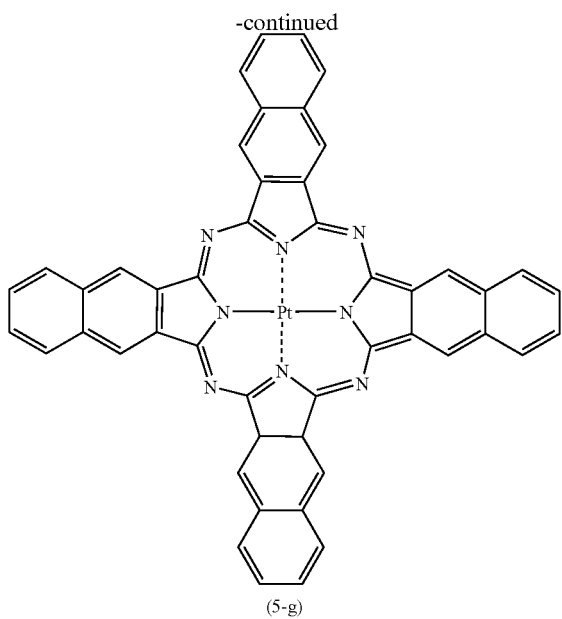

(5-g)

The molecular weight of a compound for use as a luminescent material in the present invention is generally 10000 or less, preferably 5000 or less, more preferably 4000 or less, and further preferably 3000 or less, and is generally 100 or more, preferably 200 or more, more preferably 300 or more, and further preferably 400 or more. If the molecular weight is less than 100, there may result in significant decrease of heat resistance, may cause gas generation, may invite decreased quality of a film formed from the composition, or may cause morphological change of the resulting organic electroluminescent device due typically to migration. If the molecular weight exceeds 10000, it may be difficult to purify the organic compound or it may possibly take a long time to dissolve the organic compound in a solvent.

The first oxidation potential $E_D^+$ of a luminescent material for use in the present invention is generally 0.1 V or more, preferably 0.2 V or more, more preferably 0.3 V or more, further preferably 0.4 V or more, and most preferably 0.5 V or more, and is generally 2.0 V or less, preferably 1.6 V or less, more preferably 1.4 V or less, further preferably 1.2 V or less, and most preferably 1.0 V or less.

If the first oxidation potential of the luminescent material $E_D^+$ is less than 0.1 V, the first reduction potential of the luminescent material $E_D^-$ must be set at a very low value. When this luminescent material is used in an organic electroluminescent device, there may result in significant imbalance between positive and negative charges, or there may cause decreased durability of the luminescent material against reduction, and the device may highly possibly fail to have a sufficient luminance and/or a satisfactory life. In contrast, if the first oxidation potential of the luminescent material $E_D^+$ exceeds 2.0 V, there may invite decreased durability of the luminescent material against oxidation, and the device may highly possibly fail to have a sufficient luminance and/or a satisfactory life.

The first reduction potential of the luminescent material $E_D^-$ for use in the present invention is generally −3.0 V or more, preferably −2.8 V or more, more preferably −2.7 V or more, further preferably −2.6 V or more, and most preferably −2.5 V or more, and is −1.0 V or less, preferably −1.2 V or less, more preferably −1.4 V or less, further preferably −1.6 V or less, and most preferably −1.8 V or less.

If a luminescent material having a first reduction potential $E_D^-$ less than −3.0 V is used in an organic electroluminescent device, there may result in significant imbalance between positive and negative charges, or there may cause decreased durability of the luminescent material against reduction, and the device may highly possibly fail to have a sufficient luminance and/or a satisfactory life. In contrast, if a luminescent material having a first reduction potential $E_D^-$ exceeding −1.0 V is used in an organic electroluminescent device, the first oxidation potential $E_D^+$ of the luminescent material must be set at a very high value, and there may invite decreased durability of the luminescent material against oxidation, and the device may highly possibly fail to have a sufficient luminance and/or a satisfactory life.

<Charge Transport Material>

A charge transport material for use in the present invention desirably has at least one of the following functions:

(i) Injection function: the function of receiving a hole from an anode or a hole injection layer when an electric field is applied, and/or the function of receiving an electron from a cathode or an electron injection layer when an electric field is applied.

(ii) Transporting function: the function of transporting injected charges by the action of an electric field.

(iii) Light emitting function: the function of providing a field for the recombination between an electron and a hole and using this for the light emission.

(iv) Blocking function: the function of controlling the transfer of charges so as to enable transportation and recombination of the charges in good balance.

There may be a difference in easiness between the hole injection and the electron injection, and there may be a difference in transportability as represented by mobility between hole and electron. However, a charge transport material for use herein should essentially be capable of efficiently transporting at least one of the two charges (hole and electron).

From these viewpoints, the compound for use as a charge transport material is typically preferably an organic compound represented by following Formula (1):

In Formula (1), "A" represents an aromatic hydrocarbon group or an aromatic heterocyclic group;

"n" represents an integer of 1 or more and 10 or less;

"Z" represents a hydrogen atom or a substituent when "n" is 1, and "Z" represents a direct bond or a linkage group having a valency of "n" when "n" is 2 or more; and when "n" is 2 or more, plural "A"s may be the same as or different from each other, and wherein "A" and "Z" may each further have a substituent.

Compounds represented by Formula (1) will be illustrated in detail below.

In Formula (1), "n" represents an integer which is generally 1 or more, and preferably 2 or more, and is generally 10 or less, and preferably 6 or less. If the number "n" exceeds this range, it may be difficult to reduce impurities sufficiently through purification procedures. If "n" is less than this range, the charge injecting/transporting ability may be significantly reduced.

When "n" is 1, "Z" is hydrogen atom or any substituent in Formula (1). When "Z" is a substituent, specific examples thereof include alkyl groups, alkenyl groups, alkynyl groups, amino groups, alkoxycarbonylamino groups, aryloxycarbonylamino groups, heterocyclic oxycarbonylamino groups, sulfonylamino groups, alkoxy groups, aryloxy groups, heterocyclic oxy groups, acyl groups, alkoxycarbonyl groups, aryloxycarbonyl groups, heterocyclic oxycarbonyl groups, acyloxy groups, sulfamoyl groups, carbamoyl groups, alkylthio groups, arylthio groups, heterocyclic thio groups, sulfonyl groups, sulfenyl groups, ureido groups, phosphoramido groups, hydroxyl group, mercapto group, cyano group, sulfo group, carboxyl group, nitro group, hydroxamate group, sulfino group, hydrazino group, silyl groups, boryl groups, phosphino groups, aromatic hydrocarbon groups, aromatic heterocyclic groups, groups represented by following Formula (2), and groups represented by following Formula (3):

[Chemical Formula 13]

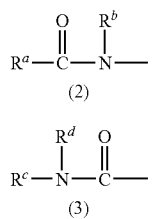

(2)

[Chemical Formula 14]

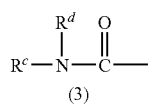

(3)

In Formula (2), $R^a$ represents any substituent. The substituent $R^a$ is generally a substituent having one or more and ten or less carbon atoms, and is preferably one having six or less carbon atoms. Specific examples of $R^a$ include alkyl groups, aralkyl groups, and aromatic hydrocarbon groups.

In Formulae (2) and (3), $R^b$, $R^c$, and $R^d$ each independently represent hydrogen atom or any substituent. When $R^b$, $R^c$, and $R^d$ are arbitrary substituents, their carbon numbers and specific examples are independently as with the carbon number and specific examples of $R^a$.

When Z is an alkyl group, it is a linear or branched alkyl group which preferably has one or more and thirty or less carbon atoms, and more preferably has one or more and twelve or less carbon atoms. Examples thereof include methyl, ethyl, n-propyl, 2-propyl, n-butyl, isobutyl, tert-butyl, and n-octyl groups.

When Z is an alkenyl group, it preferably has two or more carbon atoms and preferably has thirty or less, and further preferably twelve or less carbon atoms. Examples thereof include vinyl, allyl, and 1-butenyl groups.

When Z is an alkynyl group, it preferably has two or more and thirty or less carbon atoms, and further preferably has twelve or less carbon atoms. Example thereof include ethynyl and propargyl groups.

When Z is an amino group, it can also be an amino group substituted with a hydrocarbon group such as an alkyl group or an aromatic hydrocarbon group. The amino group generally has zero or more and thirty-six or less carbon atoms, and preferably has twenty or less, and more preferably twelve or less carbon atoms. Specific examples of such amino groups include amino group, methylamino group, dimethylamino group, ethylamino group, diethylamino group, phenylamino group, diphenylamino group, dibenzylamino group, thienylamino group, dithienylamino group, pyridylamino group, and dipyridylamino group.

When Z is an alkoxycarbonylamino group, it generally has two or more and twenty or less carbon atoms, and preferably has sixteen or less, and more preferably twelve or less carbon atoms. Specific examples thereof include methoxycarbonylamino group.

When Z is an aryloxycarbonylamino group, it generally has seven or more and twenty or less carbon atoms, and preferably has sixteen or less, and more preferably twelve or less carbon atoms. Specific examples thereof include phenoxycarbonyl group.

When Z is a heterocyclic oxycarbonylamino group, it generally has two or more, preferably five or more carbon atoms, and generally has twenty-one or less, preferably fifteen or less, and more preferably eleven or less carbon atoms. Specific examples thereof include thienyloxycarbonylamino group.

When Z is a sulfonylamino group, it generally has one or more carbon atoms and generally has twenty or less, preferably sixteen or less, and more preferably twelve or less carbon atoms. Specific examples thereof include methanesulfonylamino group, benzenesulfonylamino group, and thiophenesulfonylamino group.

When Z is an alkoxy group, it generally has one or more carbon atoms, and generally has twenty or less, preferably twelve or less, and more preferably eight or less carbon atoms. Specific examples thereof include methoxy group, ethoxy group, isopropoxy group, n-butoxy group, and t-butoxy group.

When Z is an aryloxy group, it generally has six or more carbon atoms, and generally has ten or less, preferably eight or less, and more preferably six carbon atoms. Specific examples thereof include phenoxy group.

When Z is a heterocyclic oxy group, it generally has one or more, preferably two or more, and more preferably four or more carbon atoms, and generally has ten or less, preferably eight or less, and more preferably five or less carbon atoms. Specific examples thereof include thienyloxy group and pyridyloxy group.

When Z is an acyl group, it generally has one or more carbon atoms, and generally has twenty or less, preferably sixteen or less, and more preferably twelve or less carbon atoms. Specific examples thereof include acetyl group, benzoyl group, formyl group, pivaloyl group, thenoyl group, and nicotinoyl group.

When Z is an alkoxycarbonyl group, it generally has two or more carbon atoms and generally has twenty or less, preferably sixteen or less, and more preferably twelve or less carbon atoms. Specific examples thereof include methoxycarbonyl group and ethoxycarbonyl group.

When Z is an aryloxycarbonyl group, it generally has seven or more carbon atoms, and generally has twenty or less, preferably sixteen or less, and more preferably seven carbon atoms. Specific examples thereof include phenoxycarbonyl group.

When Z is a heterocyclic oxycarbonyl group, it generally has two or more, and preferably five or more carbon atoms, and generally has twenty or less, preferably twelve or less, and more preferably six or less carbon atoms. Specific examples thereof include thienyloxycarbonyl group and pyridyloxycarbonyl group.

When Z is an acyloxy group, it generally has two or more carbon atoms, and generally has twenty or less, preferably sixteen or less, and more preferably twelve or less carbon atoms. Specific examples thereof include acetoxy group, ethylcarbonyloxy group, benzoyloxy group, pivaloyloxy group, thenoyloxy group, and nicotinoyloxy group.

When Z is a sulfamoyl group, it can also be a sulfamoyl group substituted with a hydrocarbon group such as an alkyl group or an aromatic hydrocarbon group. The sulfamoyl group generally has zero or more carbon atom, and generally has twenty or less, and preferably twelve or less carbon atoms. Specific examples thereof include sulfamoyl group, methylsulfamoyl group, dimethylsulfamoyl group, phenylsulfamoyl group, and thienylsulfamoyl group.

When Z is a carbamoyl group, it can also be a carbamoyl group substituted with a hydrocarbon group such as an alkyl group or an aromatic hydrocarbon group. The carbamoyl group generally has one or more carbon atoms, and generally has twenty or less, preferably sixteen or less, and more preferably twelve or less carbon atom. Specific examples thereof include carbamoyl group, methylcarbamoyl group, diethylcarbamoyl group, and phenylcarbamoyl group.

When Z is an alkylthio group, it generally has one or more carbon atoms, and generally has twenty or less, preferably sixteen or less, and more preferably twelve or less carbon atoms. Specific examples thereof include methylthio group, ethylthio group, and n-butylthio group.

When Z is an arylthio group, it generally has six or more carbon atoms, and generally has twenty-six or less, preferably twenty or less, and more preferably twelve or less carbon atoms. Specific examples thereof include phenylthio.

When Z is a heterocyclic thio group, it generally has one or more, preferably two or more, and more preferably five or more carbon atoms, and generally has twenty-five or less, preferably nineteen or less, and more preferably eleven or less carbon atoms. Specific examples thereof include thienylthio group and pyridylthio group.

When Z is a sulfonyl group, such sulfonyl groups further include a sulfonyl group substituted with a hydrocarbon group such as an alkyl group or an aromatic hydrocarbon group. The sulfamoyl group generally has one or more carbon atoms, and generally has twenty or less, preferably sixteen or less, and more preferably twelve or less carbon atoms. Specific examples thereof include tosyl group and mesyl group.

When Z is a sulfinyl group, it can also be a sulfinyl group substituted with a hydrocarbon group such as an alkyl group or an aromatic hydrocarbon group. The sulfinyl group has one or more carbon atoms, and generally has twenty or less, preferably sixteen or less, and more preferably twelve or less carbon atoms. Specific examples thereof include methylsulfinyl group and phenylsulfinyl group.

When Z is a ureido group, it can also be a ureido group substituted with a hydrocarbon group such as an alkyl group or an aromatic hydrocarbon group. The ureido group generally has one or more carbon atoms, and generally has twenty or less, preferably sixteen or less, and more preferably twelve or less carbon atoms. Specific examples thereof include ureido group, methylureido group, and phenylureido group.

When Z is a phosphoramido group, it can also be a phosphoramido group substituted with a hydrocarbon group such as an alkyl group or an aromatic hydrocarbon group. The phosphoramido group generally has one or more carbon atoms, and generally has twenty or less, preferably sixteen or less, and more preferably twelve or less carbon atoms. Specific examples thereof include diethylphosphoramido group and phenylphosphoramido group.

When Z is a silyl group, it can also be a silyl group substituted with a hydrocarbon group such as an alkyl group or an aromatic hydrocarbon group. The silyl group generally has one or more carbon atoms, and generally has ten or less, and preferably six or less carbon atoms. Specific examples thereof include trimethylsilyl group and triphenylsilyl group.

When Z is a boryl group, it can also be a boryl group substituted with a hydrocarbon group such as an alkyl group or an aromatic hydrocarbon group. The boryl group generally has one or more carbon atoms, and generally has ten or less, and preferably six or less carbon atoms. Specific examples thereof include dimesitylboryl group.

When Z is a phosphino group, it can also be a phosphino group substituted with a hydrocarbon group such as an alkyl group or an aromatic hydrocarbon group. The phosphino group generally has one or more carbon atoms, and generally has ten or less, and preferably six or less carbon atoms. Specific examples thereof include diphenylphosphino group.

When Z is an aromatic hydrocarbon group, it generally has six or more carbon atoms, and generally has twenty or less, and preferably fourteen or less carbon atoms. Specific examples thereof include groups derived from six-membered monocyclic rings, or bicyclic, tricyclic, tetracyclic or pentacyclic condensed rings containing such six-membered rings, such as benzene ring, naphthalene ring, anthracene ring, phenanthrene ring, perylene ring, tetracene ring, pyrene ring, benzopyrene ring, chrysene ring, triphenylene ring, and fluoranthene ring.

When Z is an aromatic heterocyclic group, constitutive hetero atoms thereof include nitrogen atom, oxygen atom, and sulfur atom. In this case, Z generally has one or more, preferably three or more carbon atoms, and generally has nineteen or less, and preferably thirteen or less carbon atoms. Specific examples thereof include groups derived from five-membered or six-membered monocyclic rings, or bicyclic, tricyclic, or tetracyclic condensed rings containing such five-membered or six-membered rings, such as furan ring, benzofuran ring, thiophene ring, benzothiophene ring, pyrrole ring, pyrazole ring, oxazole ring, imidazole ring, oxadiazole ring, indole ring, carbazole ring, pyrroloimidazole ring, pyrrolopyrazole ring, pyrrolopyrrole ring, thienopyrrole ring, thienothiophene ring, furopyrrole ring, furofuran ring, thienofuran ring, benzisoxazole ring, benzisothiazole ring, benzimidazole ring, pyridine ring, pyrazine ring, pyridazine ring, pyrimidine ring, triazine ring, quinoline ring, isoquinoline ring, cinnoline ring, quinoxaline ring, benzimidazole ring, perimidine ring, quinazoline ring, quinazolinone ring, and azulene ring.

When "n" is two or more, Z represents a direct bond or a linkage group having a valency of "n".

When Z is a linkage group having a valency of "n", specific examples thereof include a group represented by the following formula:

[Chemical Formula 15]

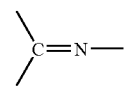

When Z is a linkage group having a valency of "n", specific examples of Z further include groups corresponding to the groups listed as the specific examples of Z when Z is a substituent, except for removing (n−1) hydrogen atom(s) therefrom.

When Z is an alkynyl group, it generally has two or more carbon atoms, and generally has eight or less, and preferably four or less carbon atoms. Specific examples thereof include ethynyl group and propargyl group.

Among them, Z is preferably an aromatic hydrocarbon group or an aromatic heterocyclic group, from the viewpoints of improving durability against electric oxidation/reduction and improving heat resistance.

Z may further have a substituent and/or may be condensed with another group. When Z has two or more substituents, they may be the same as or different from each other. If possible, these substituents may be combined with each other to form a ring.

Z may have any substituent(s) such as alkyl groups, alkenyl groups, alkynyl groups, aromatic hydrocarbon groups, acyl groups, alkoxy groups, aryloxy groups, alkylthio groups, arylthio groups, alkoxycarbonyl groups, aryloxycarbonyl groups, arylamino groups, alkylamino groups, and aromatic heterocyclic groups. Among them, alkyl groups, aromatic hydrocarbon groups, and aromatic heterocyclic groups are preferred, of which aromatic hydrocarbon groups are more preferred. Specific examples of the substituents listed herein are as with the specific examples of Z when Z is a substituent.

Z may have any molecular weight. When Z is a substituent or a linkage group, the molecular weight thereof is generally 5000 or less, and preferably 2000 or less.

In Formula (1), "A" represents any aromatic hydrocarbon group or any aromatic heterocyclic group.

When "A" is an aromatic hydrocarbon group, it generally has six or more carbon atoms, and generally has thirty or less, and preferably twenty or less carbon atoms. Specific examples thereof include groups derived from six-membered monocyclic rings, or bicyclic, tricyclic, tetracyclic, or pentacyclic fused rings containing such six-membered rings, such as benzene ring, naphthalene ring, anthracene ring, phenanthrene ring, perylene ring, tetracene ring, pyrene ring, benzopyrene ring, chrysene ring, triphenylene ring, and fluoranthene ring.

When "A" is an aromatic heterocyclic group, it generally has one or more, and preferably three or more carbon atoms, and generally has twenty-nine or less, and preferably nineteen or less carbon atoms. Specific examples thereof include groups derived from five-membered or six-membered monocyclic rings, or bicyclic, tricyclic, or tetracyclic fused rings containing such five-membered or six-membered rings, such as furan ring, benzofuran ring, thiophene ring, benzothiophene ring, pyrrole ring, pyrazole ring, oxazole ring, imidazole ring, oxadiazole ring, indole ring, carbazole ring, pyrroloimidazole ring, pyrrolopyrazole ring, pyrrolopyrrole ring, thienopyrrole ring, thienothiophene ring, furopyrrole ring, furofuran ring, thienofuran ring, benzisoxazole ring, benzisothiazole ring, benzimidazole ring, pyridine ring, pyrazine ring, pyridazine ring, pyrimidine ring, triazine ring, quinoline ring, isoquinoline ring, cinnoline ring, quinoxaline ring, benzimidazole ring, perimidine ring, quinazoline ring, quinazolinone ring, azulene ring, tetrazole ring, and imidazopyridine ring.

Of the above listed groups, "A" is preferably a group derived from benzene ring, naphthalene ring, pyridine ring, pyrimidine ring, pyrazine ring, triazine ring, quinoline ring, isoquinoline ring, thiazole ring, oxazole ring, imidazole ring, indole ring, benzimidazole ring, imidazopyridine ring, or carbazole ring. This is from the points of durability against electric oxidation/reduction, and a wide band gap between the highest occupied molecular orbital (HOMO) and the lowest unoccupied molecular orbital (LUMO).

Of these, "A" is more preferably a group derived from benzene ring, naphthalene ring, pyridine ring, triazine ring, oxazole ring, thiazole ring, imidazole ring, quinoline ring, isoquinoline ring, benzimidazole ring, imidazopyridine ring, or carbazole ring, and is further more preferably a group derived from benzene ring, pyridine ring, quinoline ring, isoquinoline ring, benzimidazole ring, imidazopyridine ring, or carbazole ring.

"A" is especially preferably a group derived from pyridine ring or carbazole ring.

Of such groups derived from pyridine ring, bipyridyl group or a group derived from a pyridine ring having substituent(s) at the 2-, 4-, and/or 6-position of pyridine ring is preferred for more satisfactory stability against electric reduction. A substituent to be combined with the bipyridyl group or the group derived from a pyridine ring having substituent(s) at the 2-, 4-, and/or 6-position of pyridine ring is arbitrary, but it is preferably an aromatic hydrocarbon group or an aromatic heterocyclic group.

In Formula (1), "A" may have a substituent. "A" may have any substituent, and specific examples of such substituents are as with the above-listed substituents which Z may have. When "A" has two or more substituents, they may be the same as or different from each other. If possible, these substituents may be combined with each other to form a ring.

The molecular weight of "A" including its substituent(s) is generally 5000 or less, and preferably 2000 or less.

Specific examples of "A" and Z will be illustrated below.

Initially, specific examples of "A" and Z when "n" is 1 include the following groups R-1 to R-99. In the following specific examples, $L^1$, $L^2$, and $L^3$ each independently represent hydrogen atom or any substituent. They are each independently preferably an alkyl group, an aromatic hydrocarbon group, or an aromatic heterocyclic group and most preferably phenyl group, from the viewpoint of electric durability. The groups listed herein may each further have a substituent, in addition to $L^1$, $L^2$, and $L^3$.

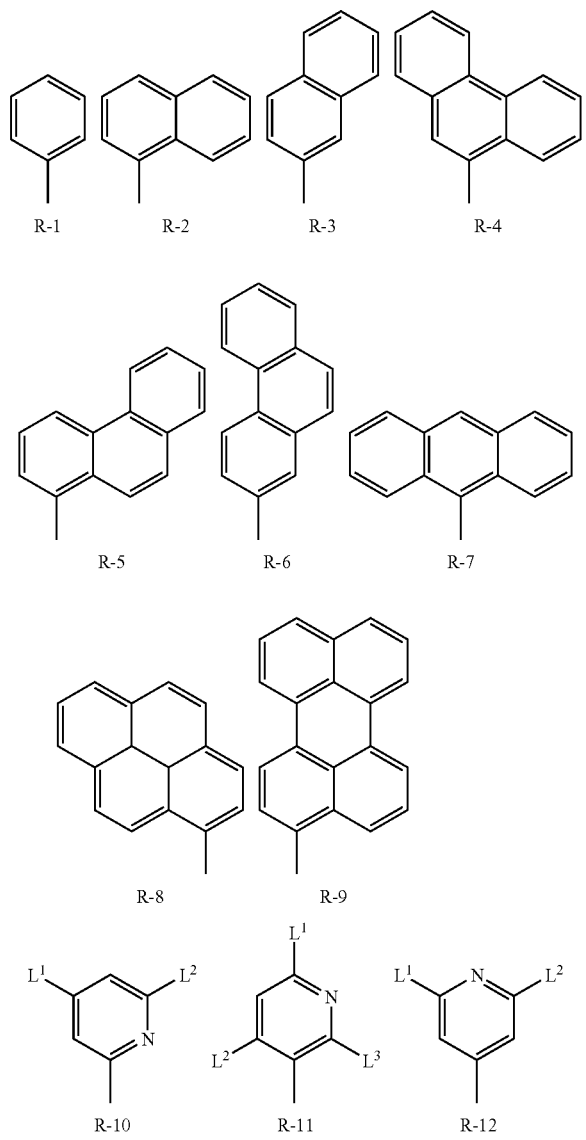

[Chemical Formula 16]

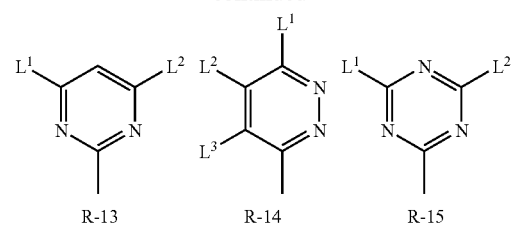
R-13   R-14   R-15
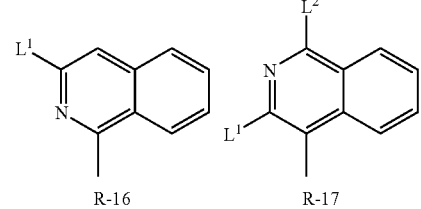
R-16   R-17
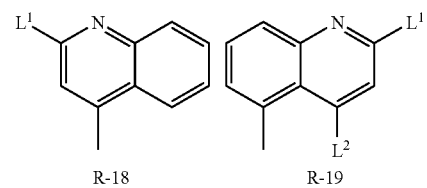
R-18   R-19
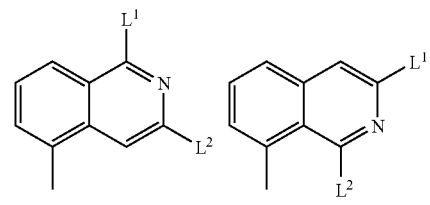
R-20   R-21
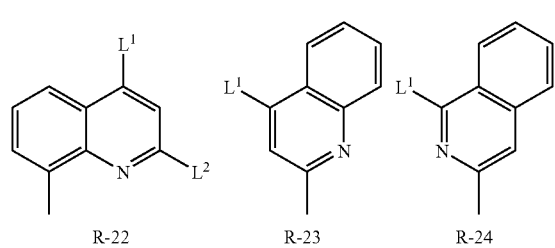
R-22   R-23   R-24
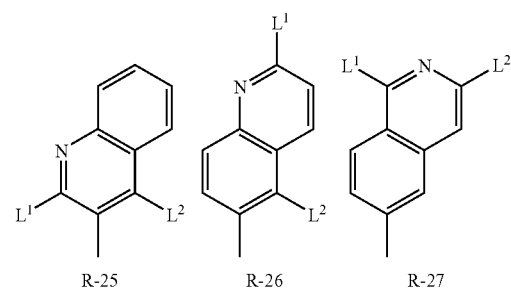
R-25   R-26   R-27
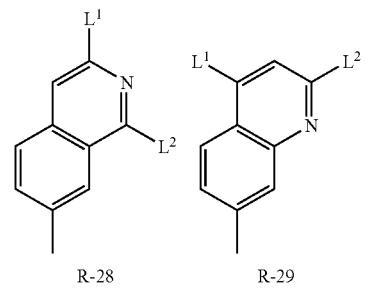
R-28   R-29
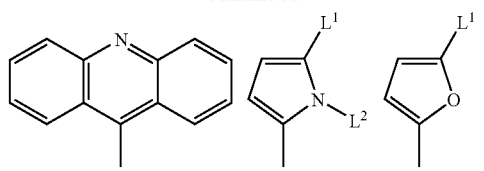
R-30   R-31   R-32
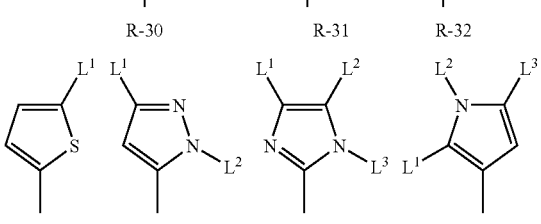
R-33   R-34   R-35   R-36
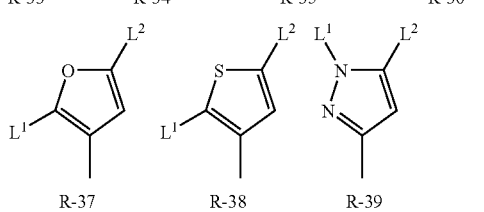
R-37   R-38   R-39
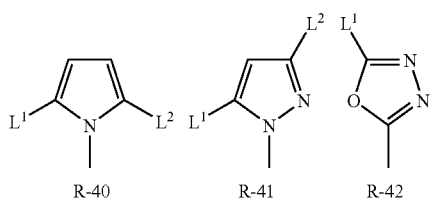
R-40   R-41   R-42
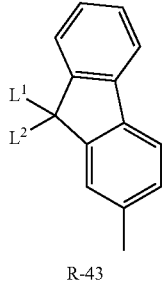
R-43
[Chemical Formula 17]
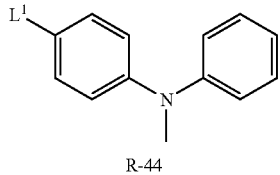
R-44
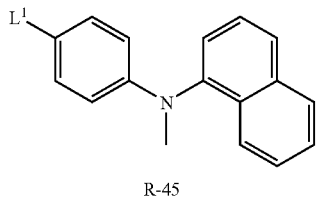
R-45
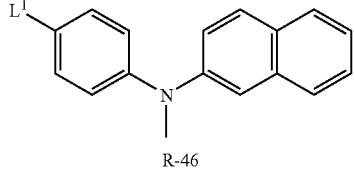
R-46

-continued
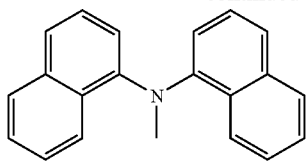
R-47
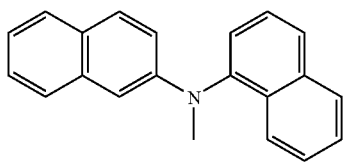
R-48
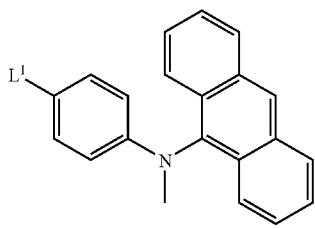
R-49
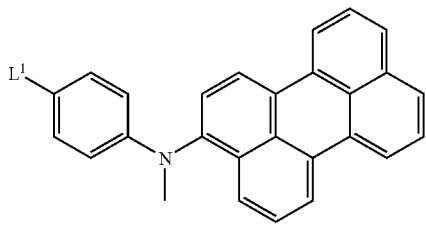
R-50
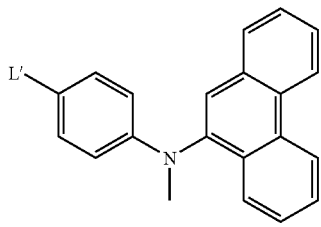
R-51
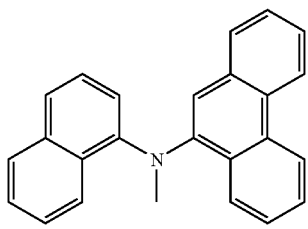
R-52
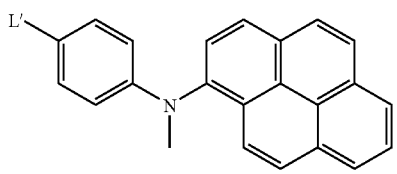
R-53
-continued
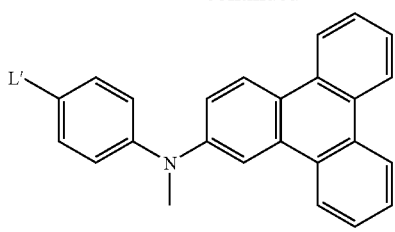
R-54
[Chemical Formula 18]
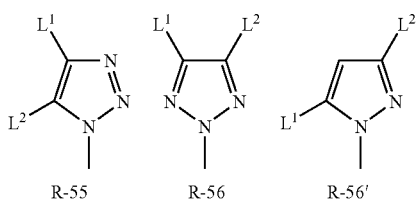
R-55    R-56    R-56'
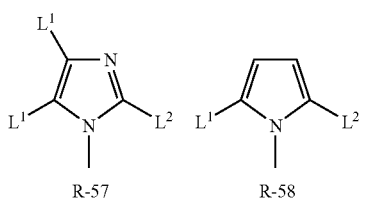
R-57    R-58
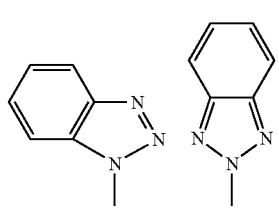
R-59    R-60
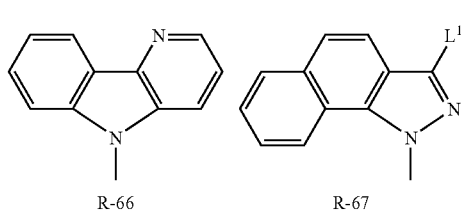
R-66    R-67
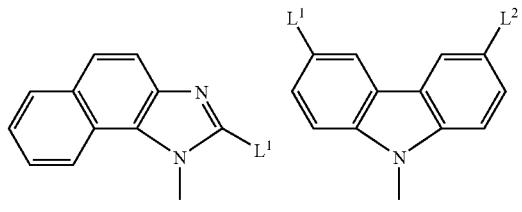
R-68    R-69
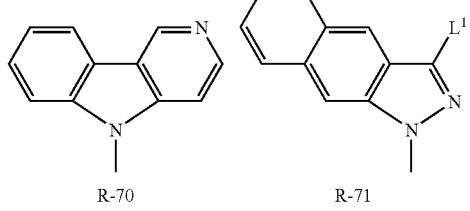
R-70    R-71

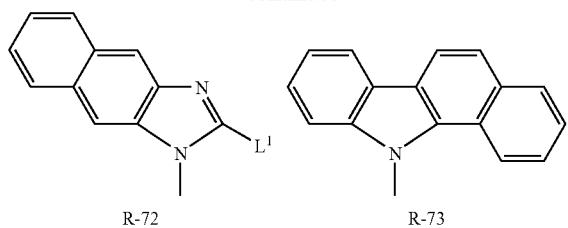
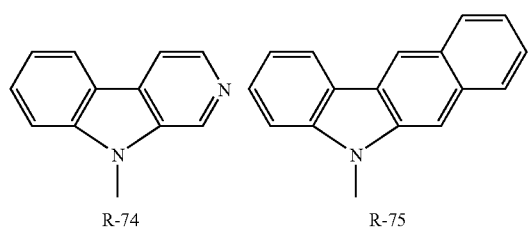
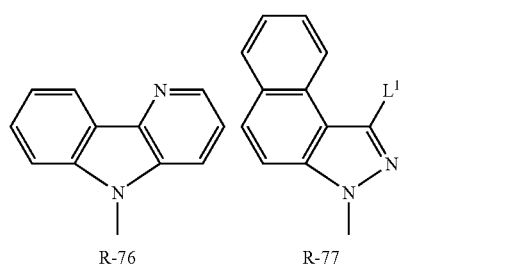
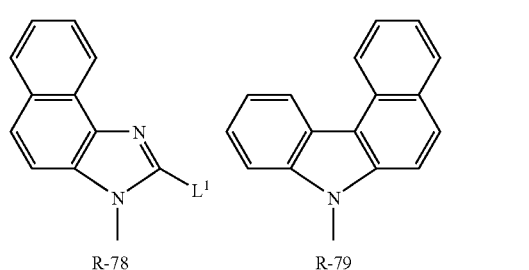
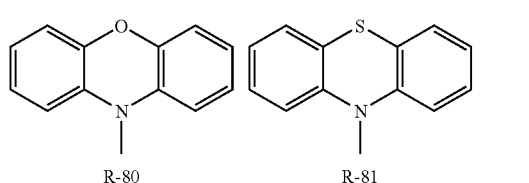
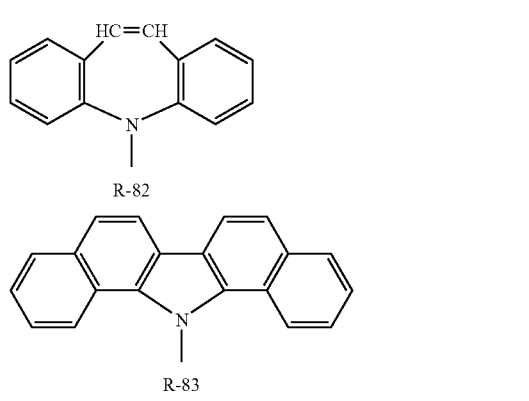
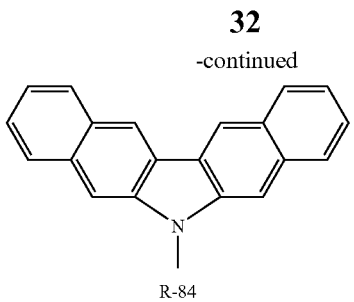
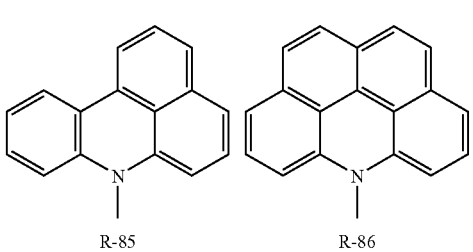
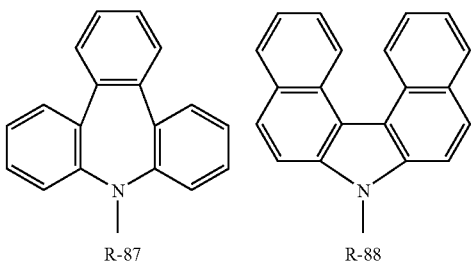
[Chemical Formula 19]
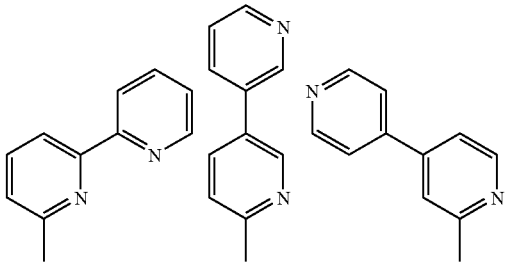
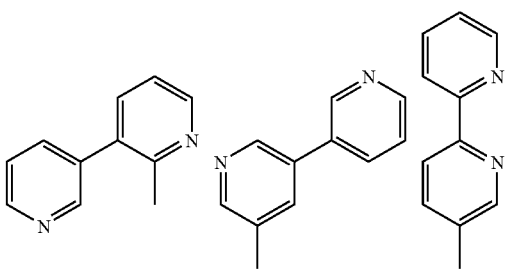
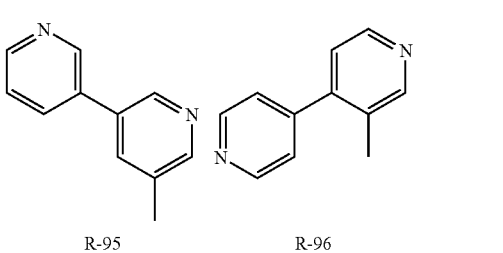

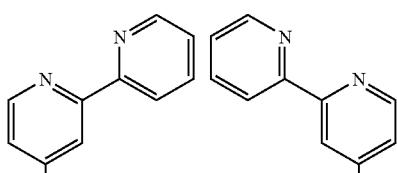

R-97　　　　R-98

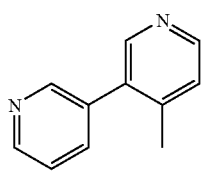

R-99

Specific examples of Z when "n" is 2 or more include following bonds and linkage groups, and each of these can be adopted alone, or two or more of the same or different bonds or linkage groups can be combined to be adopted. In the following formulae, Z-1 represents a direct bond, and Z-2 to Z-187 each represent a linkage group. In the following specific examples, $L^1$, $L^2$, and $L^3$ each independently represent hydrogen atom or any substituent. They are each independently preferably an alkyl group, an aromatic hydrocarbon group, or an aromatic heterocyclic group, and are each most preferably phenyl group, from the viewpoint of electric durability. The groups listed herein may each further have a substituent, in addition to $L^1$, $L^2$, and $L^3$.

[Chemical Formula 20]

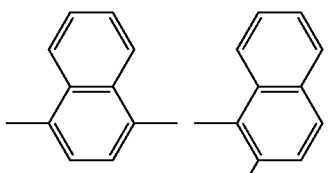

Z-1　Z-2　Z-3　Z-4

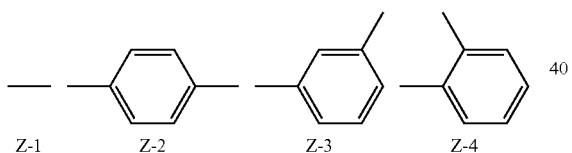

Z-5　　Z-6　　Z-7

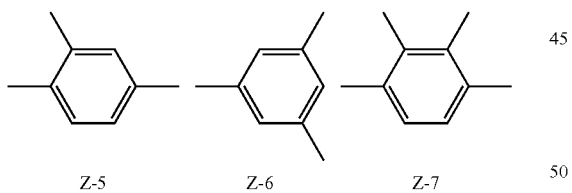

Z-8　　　Z-9

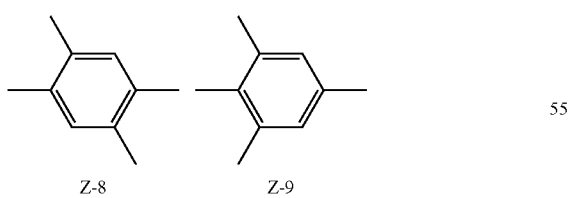

Z-10　　Z-11

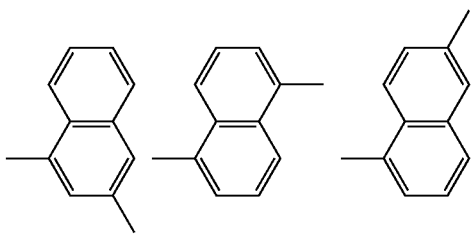

Z-12　　　Z-13

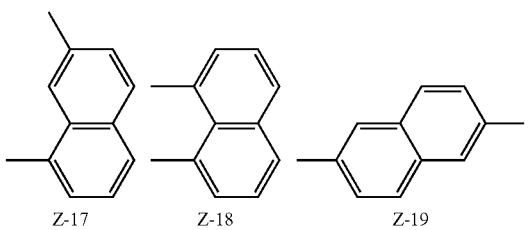

Z-14　　　Z-15　　　Z-16

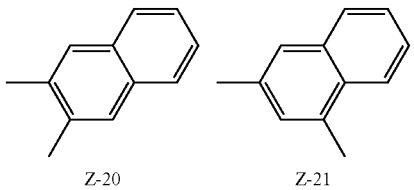

Z-17　　Z-18　　Z-19

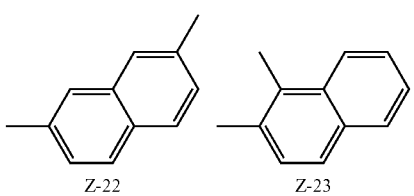

Z-20　　　Z-21

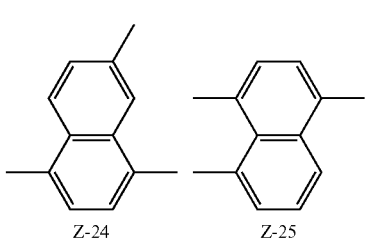

Z-22　　　Z-23

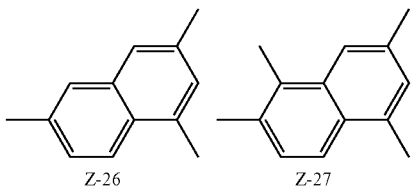

Z-24　　　Z-25

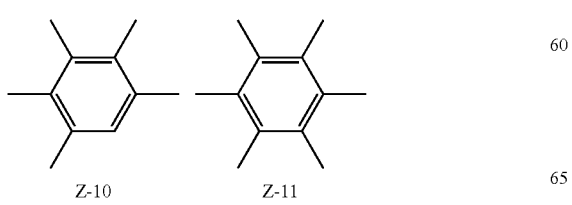

Z-26　　　Z-27

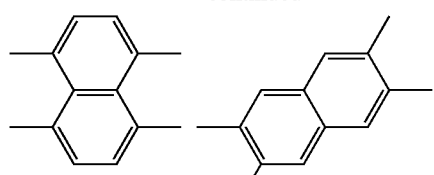
Z-28    Z-29
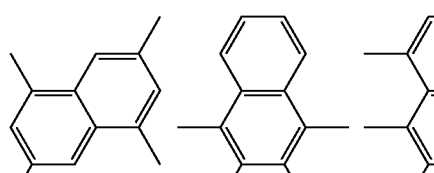
Z-30    Z-31    Z-32
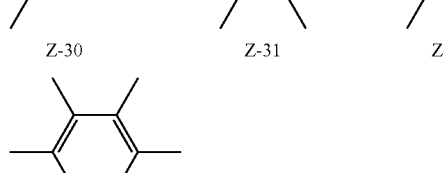
Z-33    Z-34
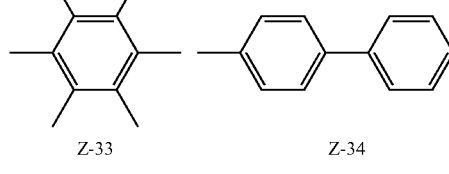
Z-35    Z-36
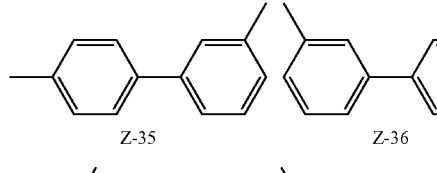
Z-37    Z-38
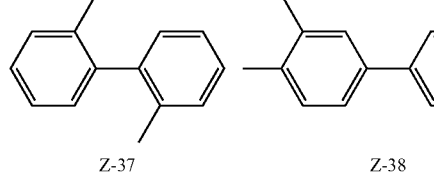
Z-39
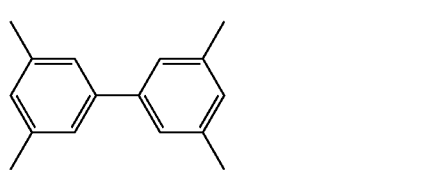
Z-40
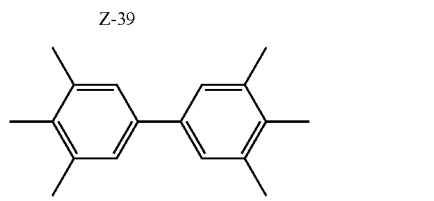
Z-41
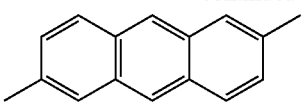
Z-42
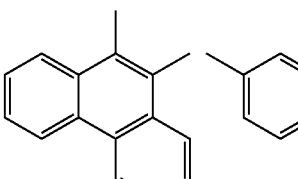
Z-43    Z-44
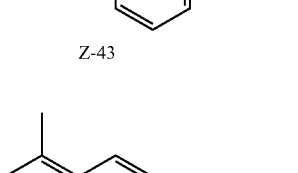
Z-45
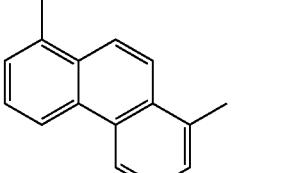
Z-46
[Chemical Formula 21]
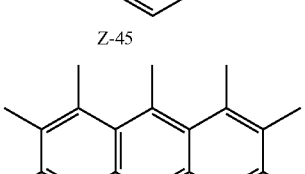
Z-47
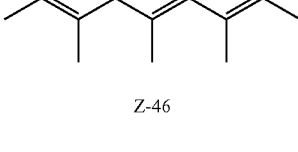
Z-48    Z-49    Z-50
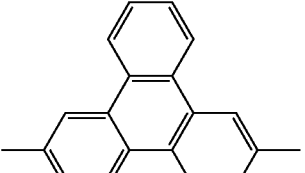
Z-51    Z-52    Z-53

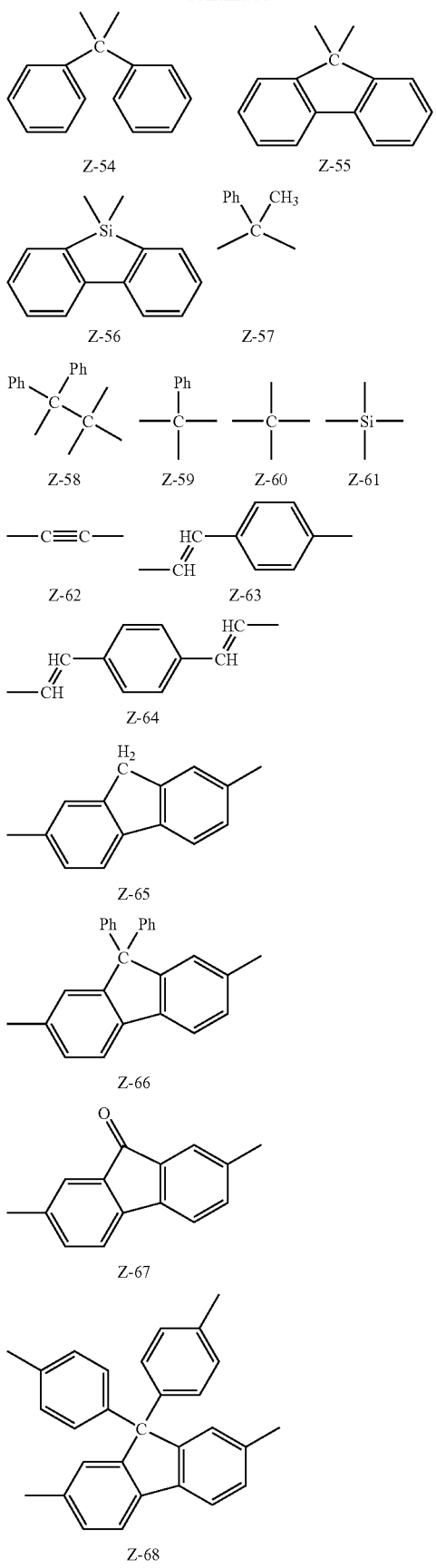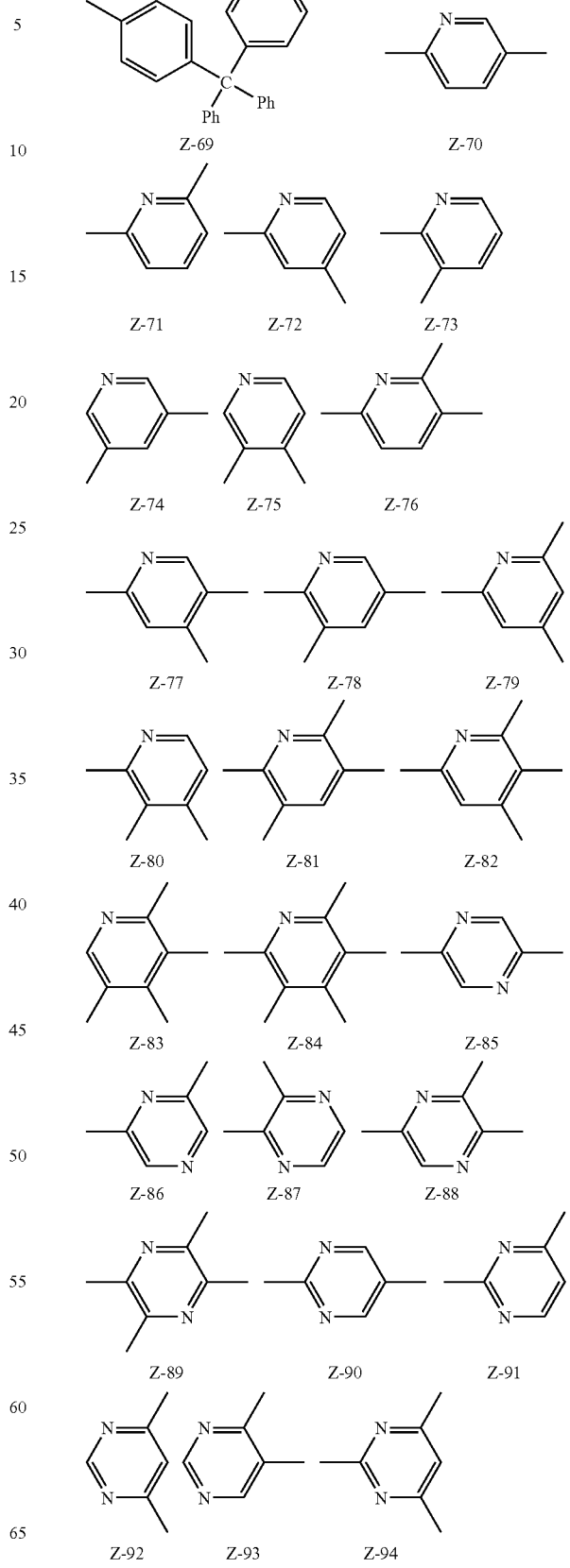

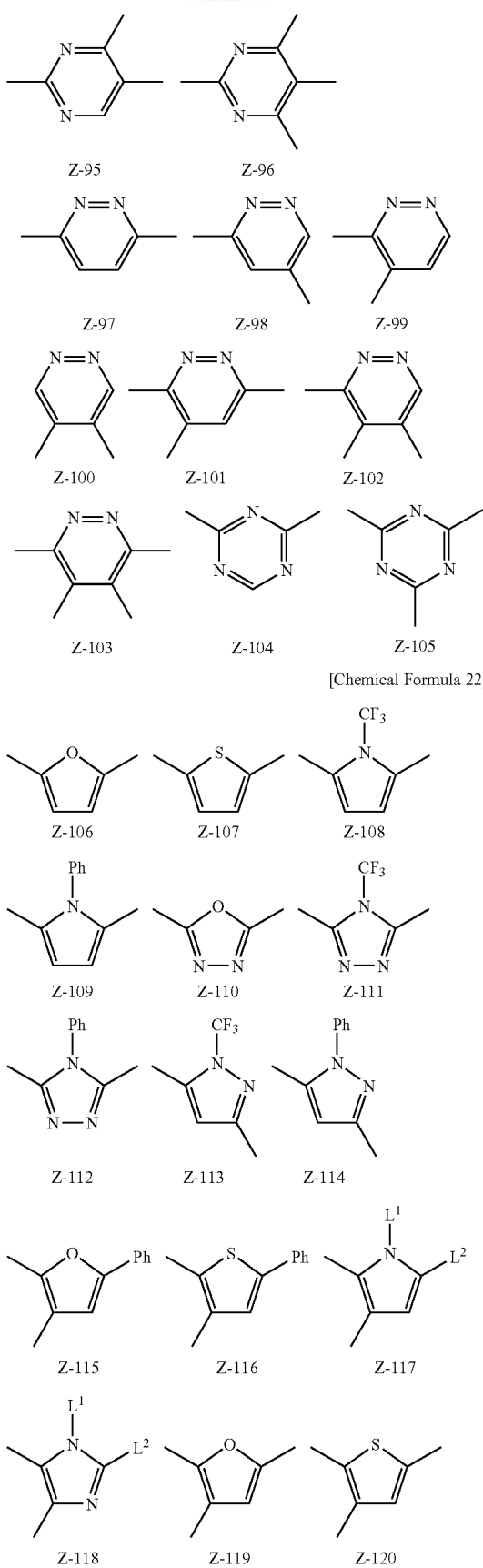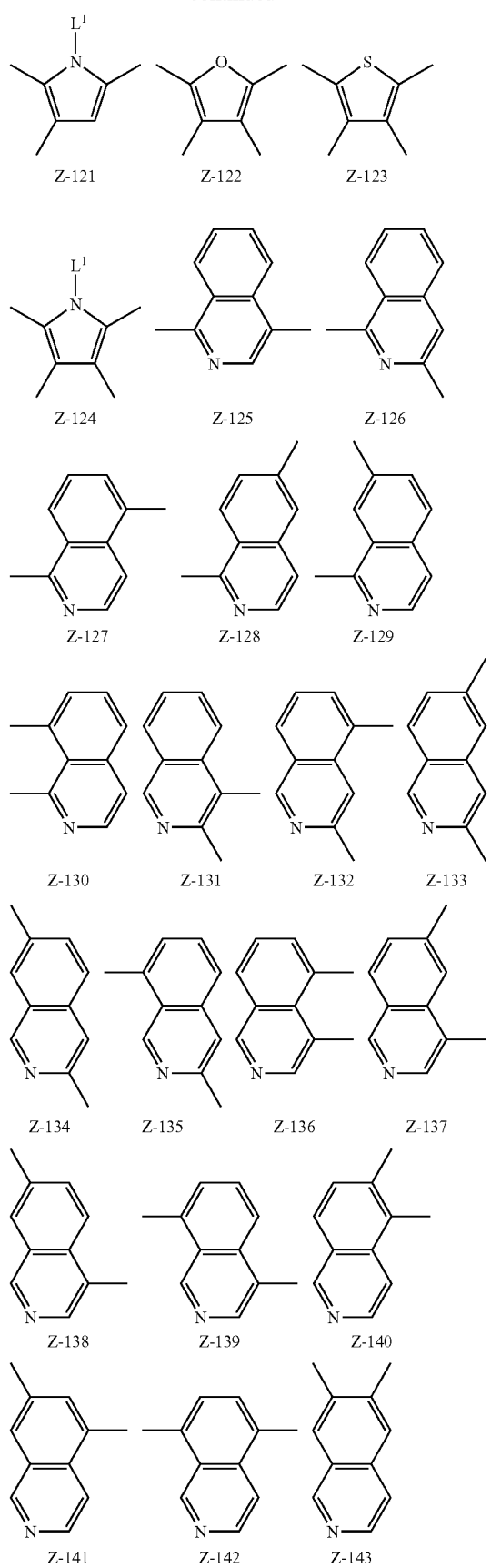

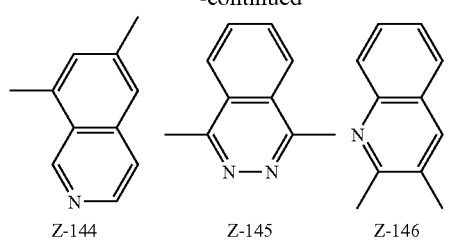
Z-144　　Z-145　　Z-146
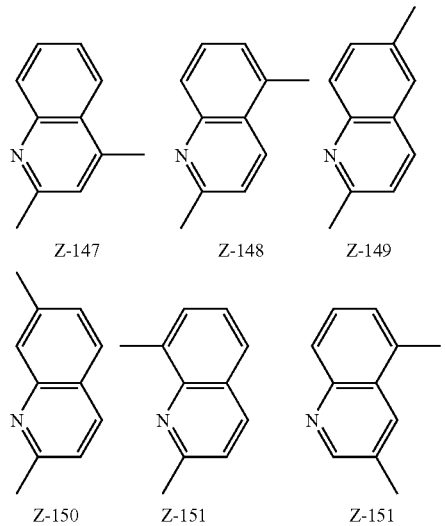
Z-147　　Z-148　　Z-149
Z-150　　Z-151　　Z-151
Z-152　Z-153　Z-154　Z-155
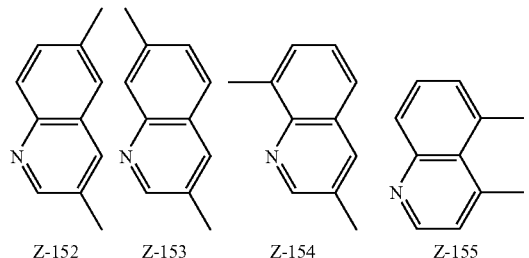
Z-156　　Z-157　　Z-158
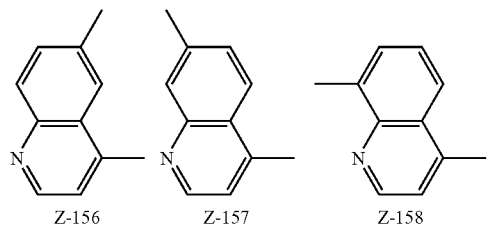
Z-159　　Z-160　　Z-161
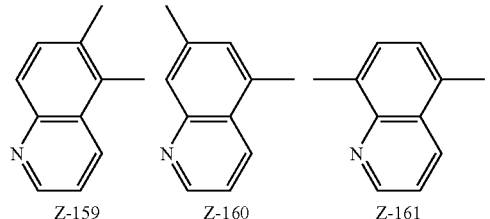
Z-162　　Z-163　　Z-164
[Chemical Formula 23]
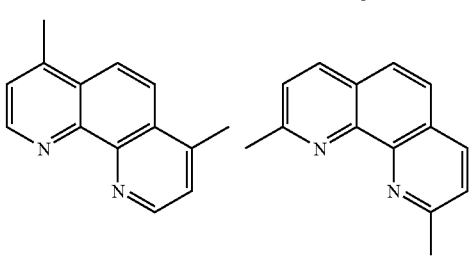
Z-165　　Z-166
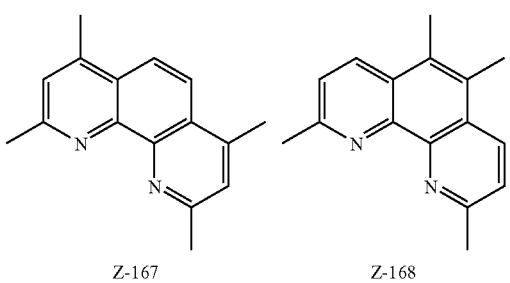
Z-167　　Z-168
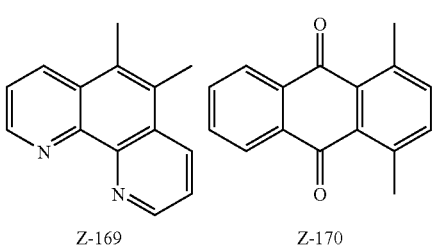
Z-169　　Z-170
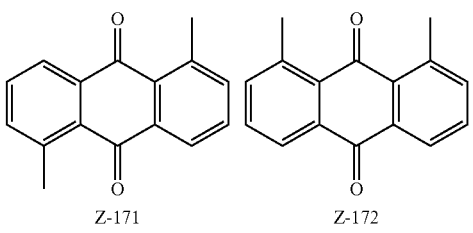
Z-171　　Z-172
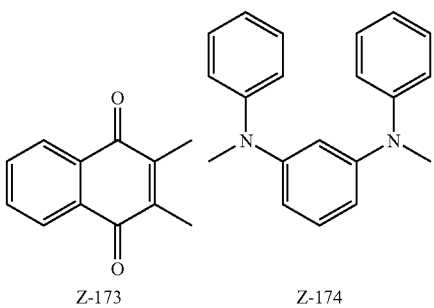
Z-173　　Z-174

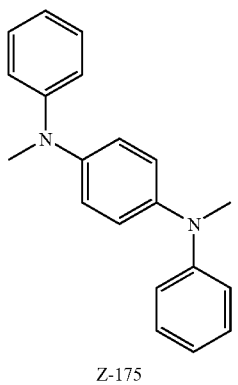

Z-175

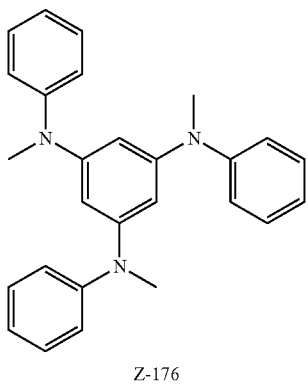

Z-176

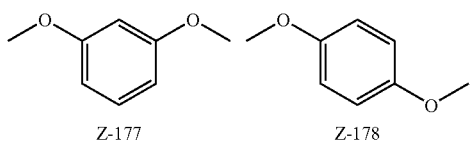

Z-177    Z-178

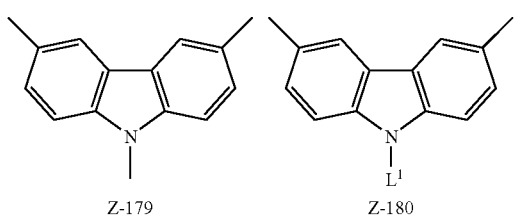

Z-179    Z-180

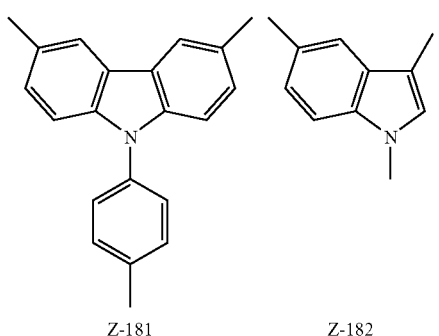

Z-181    Z-182

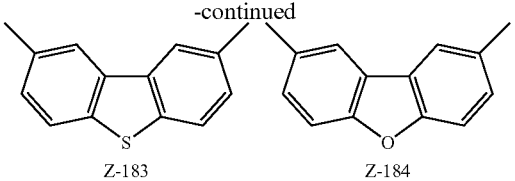

Z-183    Z-184

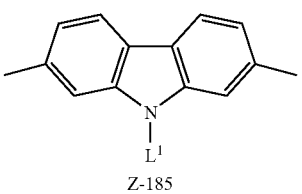

Z-185

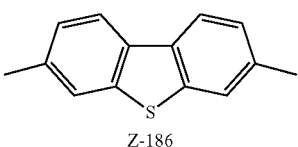

Z-186

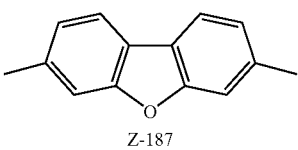

Z-187

Specific examples of compounds represented by Formula (1) are illustrated below.

Examples as carbazole compounds (including triarylamine compounds) include compounds described as charge transport materials typically in Japanese Unexamined Patent Application Publications No. 63-235946, No. 2-285357, No. 2-261889, No. 3-230584, No. 3-232856, No. 5-263073, No. 6-312979, No. 7-053950, No. 8-003547, No. 9-157643, No. 9-268283, No. 9-165573, No. 9-249876, No. 9-310066, No. 10-041069, and No. 10-168447; EP Patent No. 847228; Japanese Unexamined Patent Application Publications No. 10-208880, No. 10-226785, No. 10-312073, No. 10-316658, No. 10-330361, No. 11-144866, No. 11-144867, No. 11-144873, No. 11-149987, No. 11-167990, No. 11-233260, and No. 11-241062; PCT International Publication Number WO-00/70655; U.S. Pat. No. 6,562,982; Japanese Unexamined Patent Application Publications No. 2003-040844, No. 2001-313179, No. 2001-257076, and No. 2005-47811; Japanese Patent Application No. 2003-204940; and Japanese Unexamined Patent Application Publication No. 2005-068068.

Examples as phenylanthracene derivatives include compounds described as charge transport materials typically in Japanese Unexamined Patent Application Publication No. 2000-344691.

Examples as fused arylene star-burst compounds include compounds described as charge transport materials typically in Japanese Unexamined Patent Application Publications No. 2001-192651 and No. 2002-324677.

Examples as fused imidazole compounds include compounds described as charge transport materials typically in "Appl. Phys. Lett., vol. 78, p. 1622, 2001", Japanese Unexamined Patent Application Publication No. 2001-335776, No. 2002-338579, No. 2002-319491, No. 2002-367785, and No. 2002-367786.

Examples as azepine compounds include compounds described as charge transport materials typically in Japanese Unexamined Patent Application Publication No. 2002-235075.

Examples as fused triazole compounds include compounds described as charge transport materials typically in Japanese Unexamined Patent Application Publication No. 2002-356489.

Examples as propeller-like arylene compounds include compounds described as charge transport materials typically in Japanese Unexamined Patent Application Publication No. 2003-027048.

Examples as monotriarylamine compounds include compounds described as charge transport materials typically in Japanese Unexamined Patent Application Publications No. 2002-175883, No. 2002-249765, and No. 2002-324676.

In addition, examples as arylbenzidine compounds include compounds described as charge transport materials typically in Japanese Unexamined Patent Application Publication No. 2002-329577.

Examples as triarylboron compounds include compounds described as charge transport materials typically in Japanese Unexamined Patent Application Publications No. 2003-031367 and No. 2003-031368.

Examples as indole compounds include compounds described as charge transport materials typically in Japanese Unexamined Patent Application Publications No. 2002-305084, No. 2003-008866, and No. 2002-015871.

Examples as indolizine compounds include compounds described as charge transport materials typically in Japanese Unexamined Patent Application Publication No. 2000-311787.

Examples as pyrene compounds include compounds described as charge transport materials typically in Japanese Unexamined Patent Application Publication No. 2001-118682.

Examples as dibenzoxazole (or dibenzothiazole) compounds include compounds described as charge transport materials typically in Japanese Unexamined Patent Application Publication No. 2002-231453.

Examples as bipyridyl compounds include compounds described as charge transport materials typically in Japanese Unexamined Patent Application Publication No. 2003-123983.

Examples as pyridine compounds include compounds described as charge transport materials typically in Japanese Unexamined Patent Application Publications No. 2005-276801 and No. 2005-268199.

Of these, preferred examples are carbazole compounds (including triarylamine compounds), fused arylene star-burst compounds, fused imidazole compounds, propeller-like arylene compounds, monotriarylamine compounds, indole compounds, indolizine compounds, bipyridyl compounds, and pyridine compounds, from the point of excellent light emission properties when used in organic electroluminescent devices.

Among them, carbazole compounds, bipyridyl compounds, and pyridine compounds are more preferred, and the combination use of a carbazole compound with a bipyridyl compound or the combination use of a carbazole compound and a pyridine compound is most preferred. This is because, when they are used in organic electroluminescent devices, the devices can have further satisfactory operating lives. Likewise, compounds having both a carbazolyl group and a pyridyl group are preferably used. For example, the charge transport materials described in Japanese Patent Applications No. 2004-358592 and No. 2004-373981 are preferred.

It is also important to reduce the molecular symmetry or rigidity of these materials and/or to introduce a lipophilic substituent such as an alkyl group into the materials, in order to improve the solubility in a solvent.

Specific examples of especially preferred compounds as the charge transport material are illustrated below. In the following illustrated structural formulae, —N-Cz represents N-carbazolyl group.

[Chemical Formula 24]

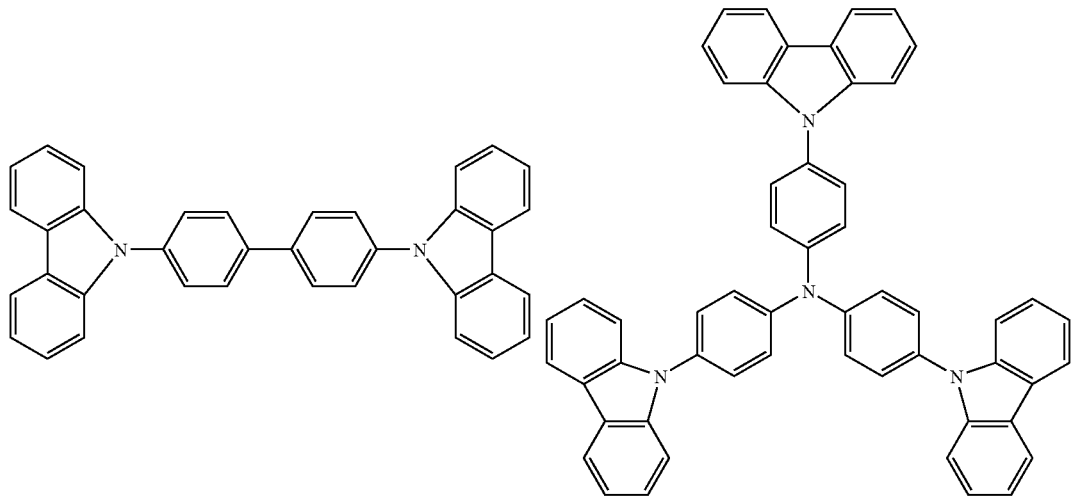

-continued
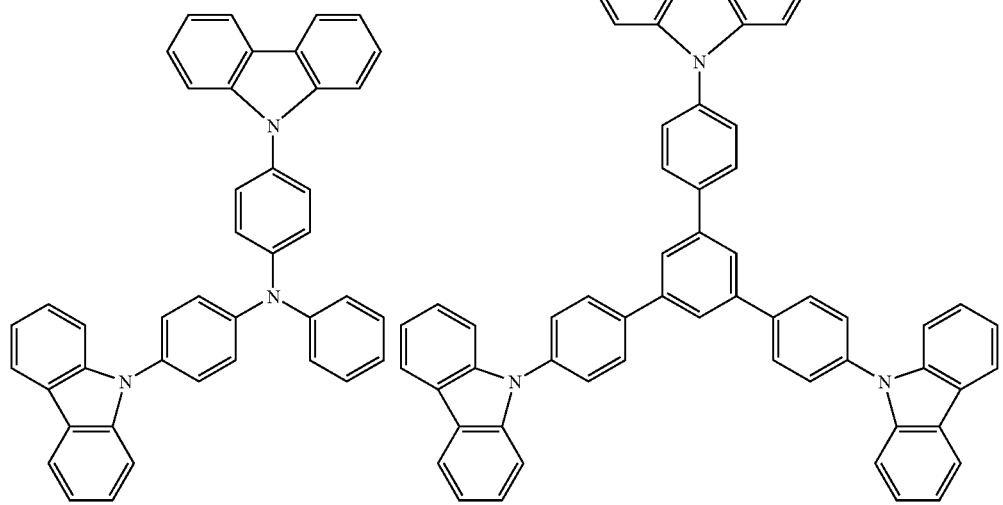
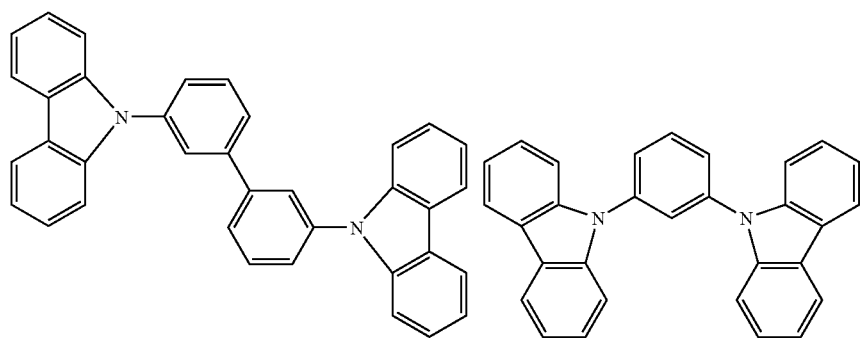
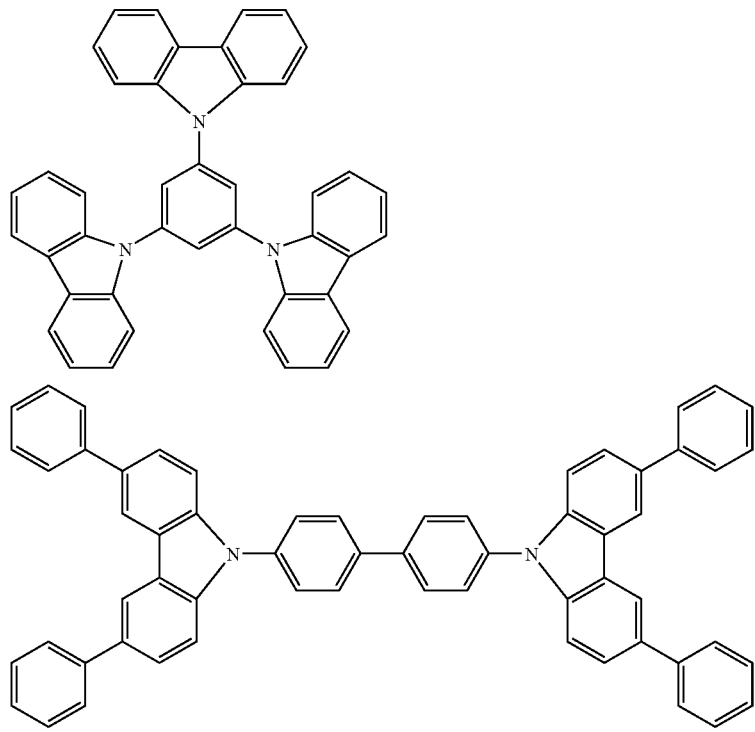

-continued
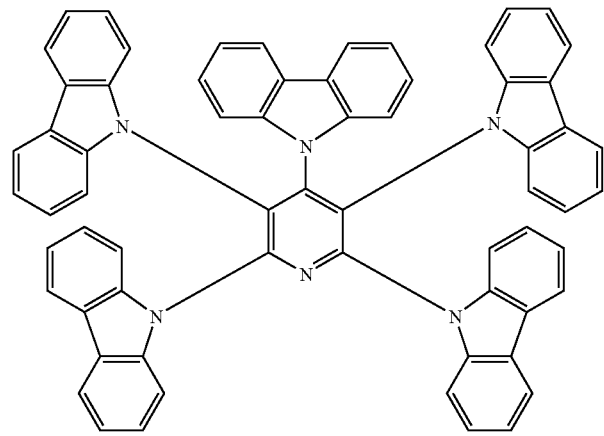
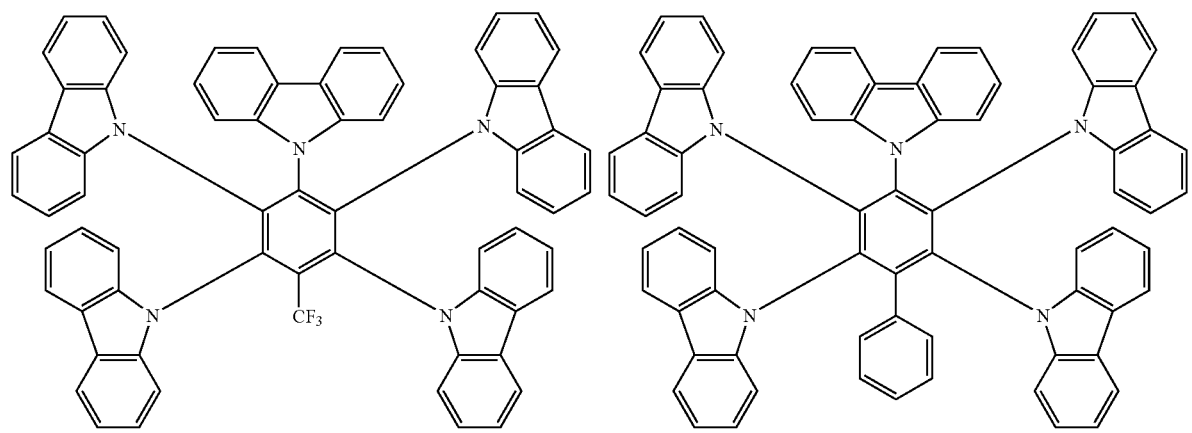
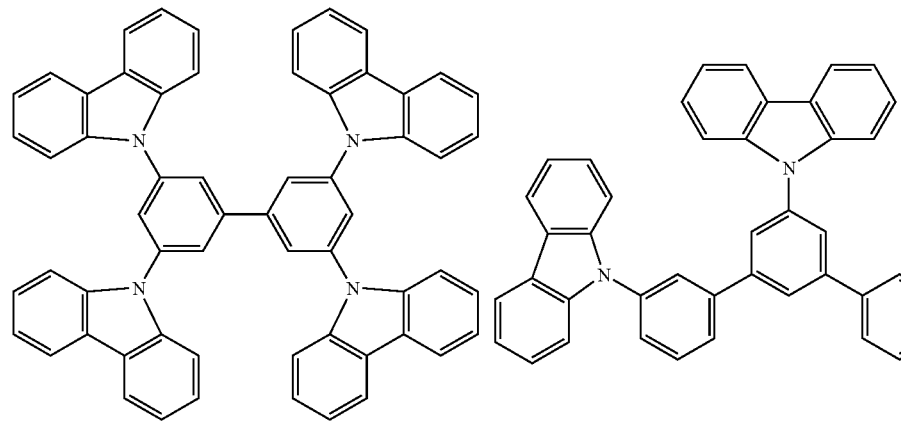
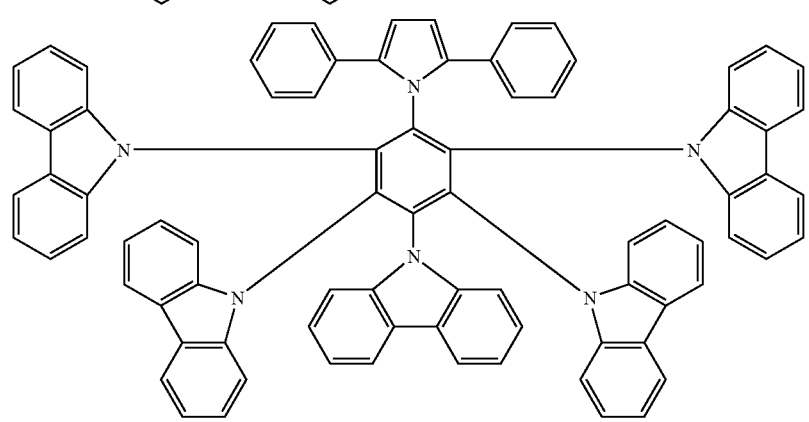

-continued
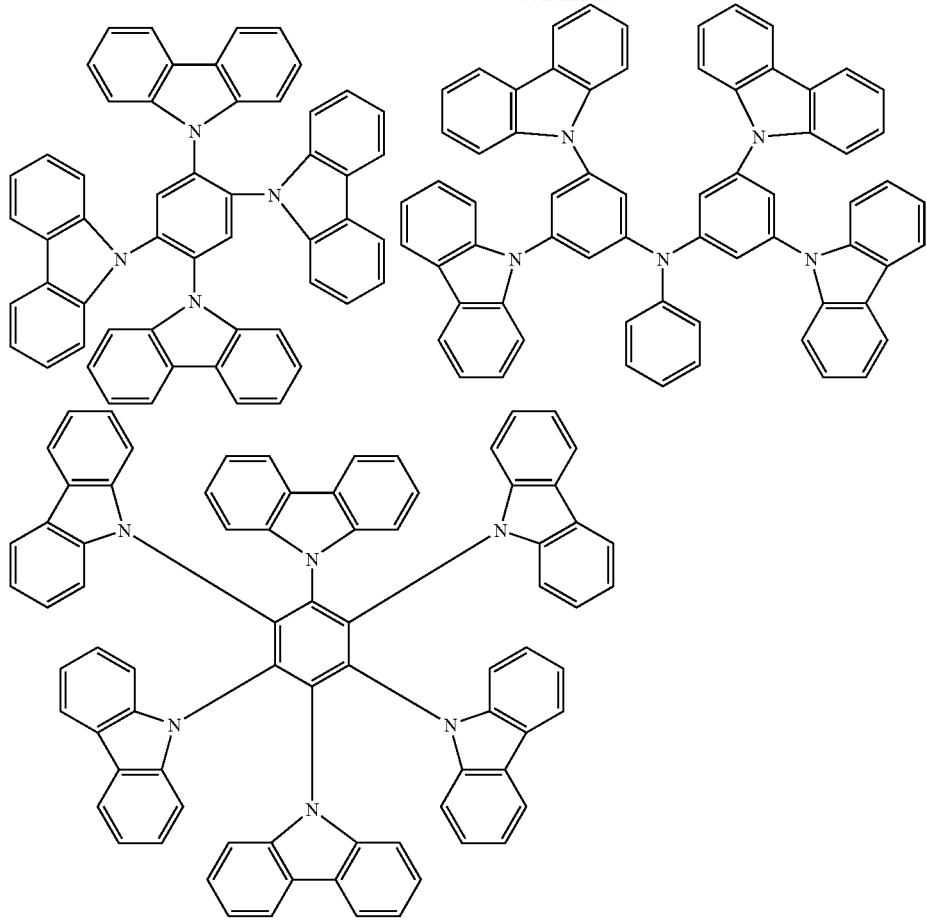
[Chemical Formula 25]
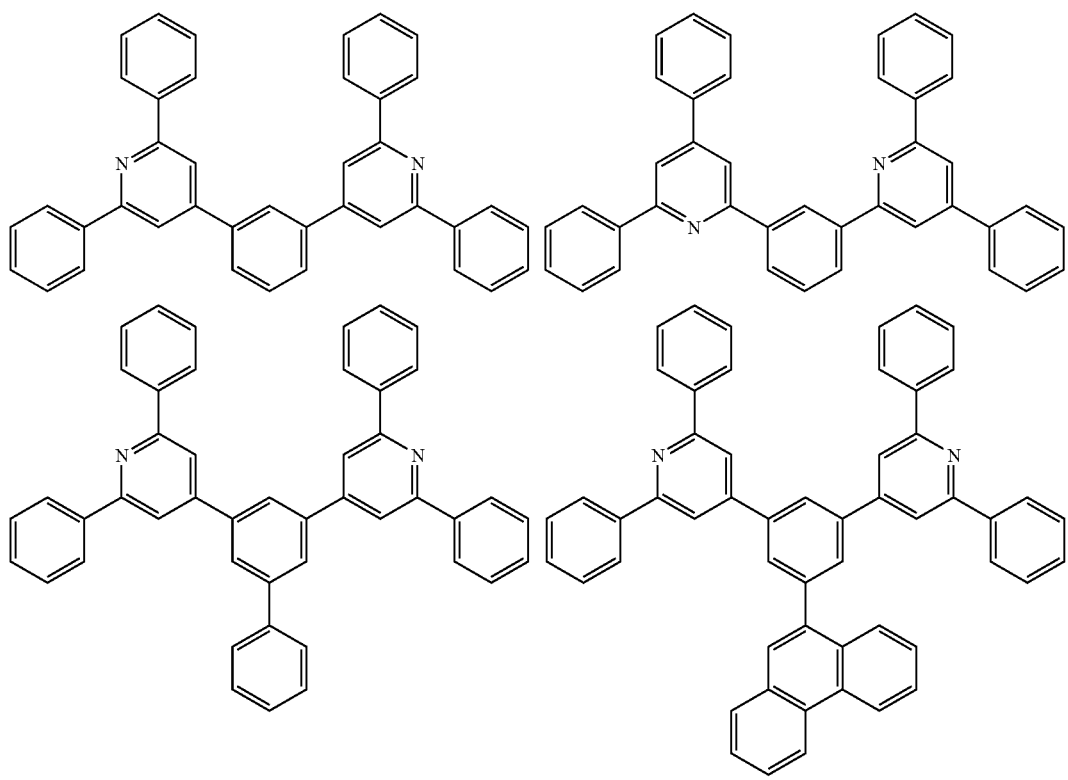

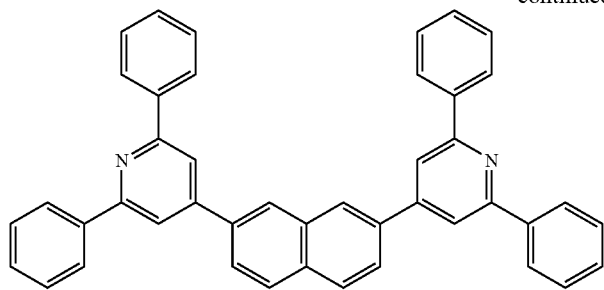
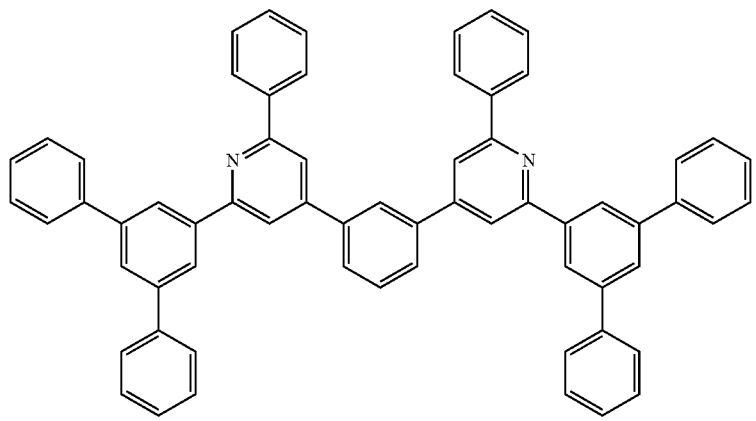
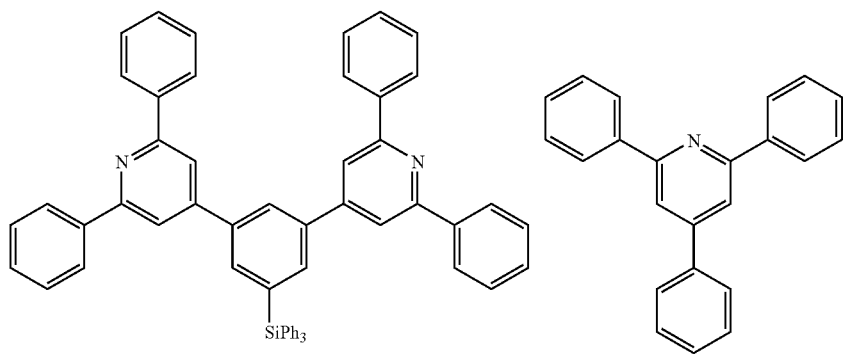
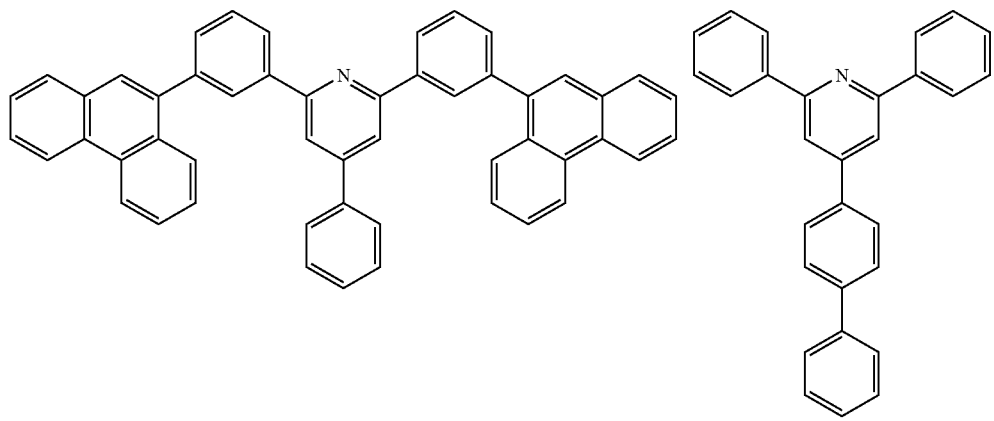

-continued
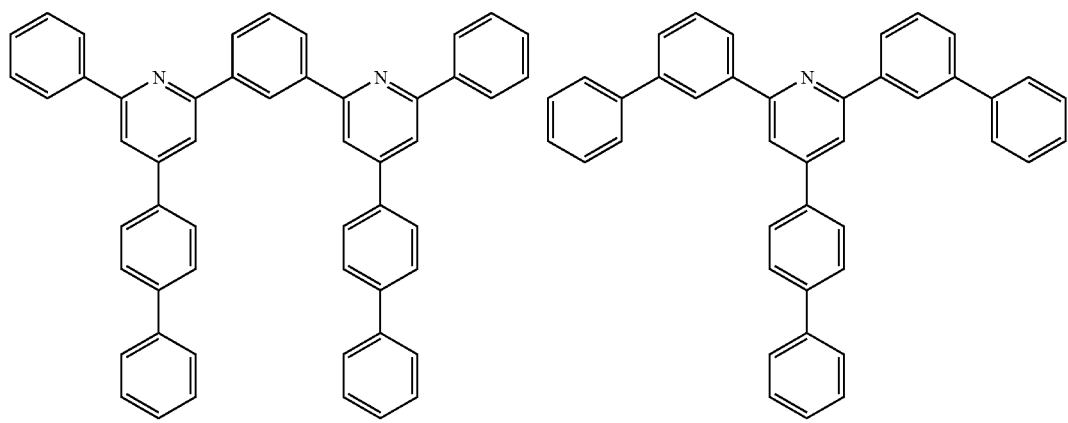
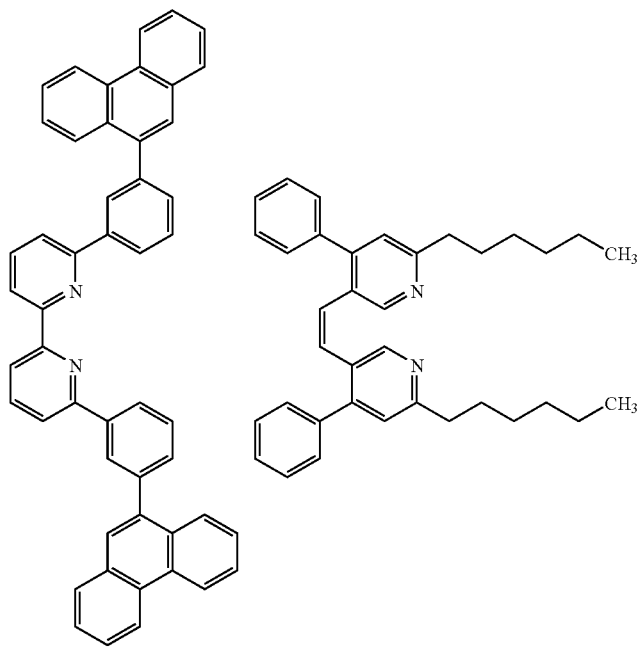
[Chemical Formula 26]
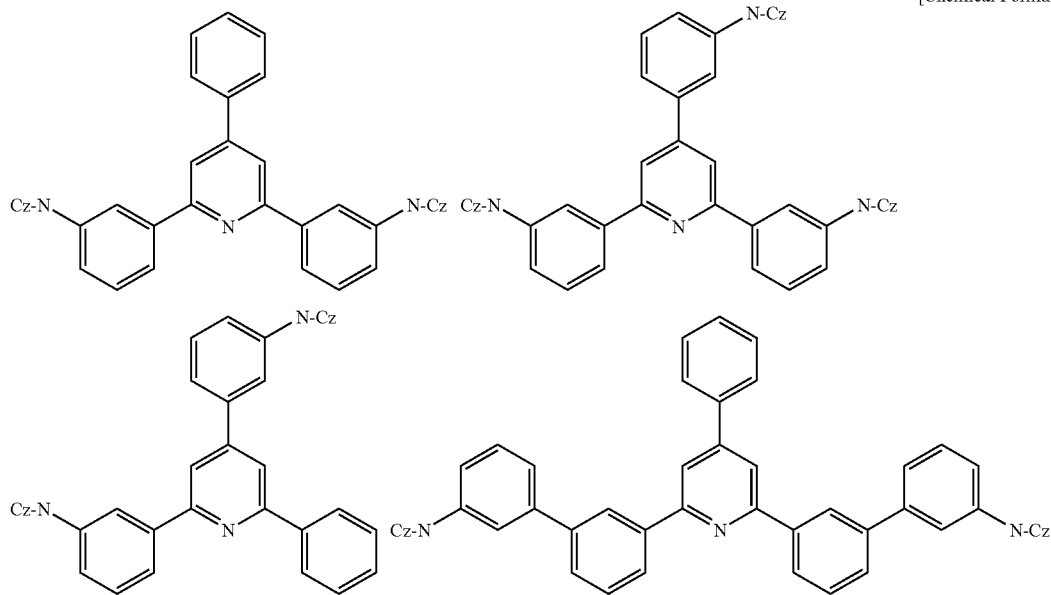

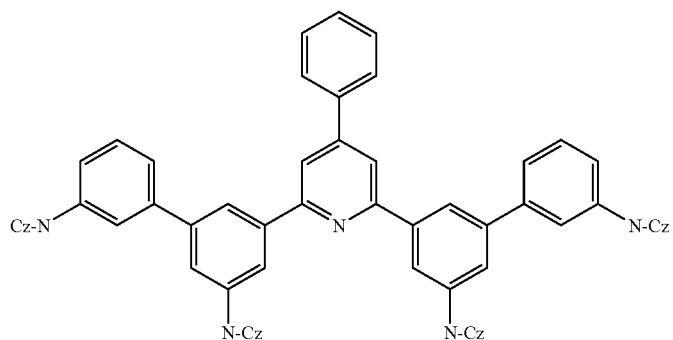
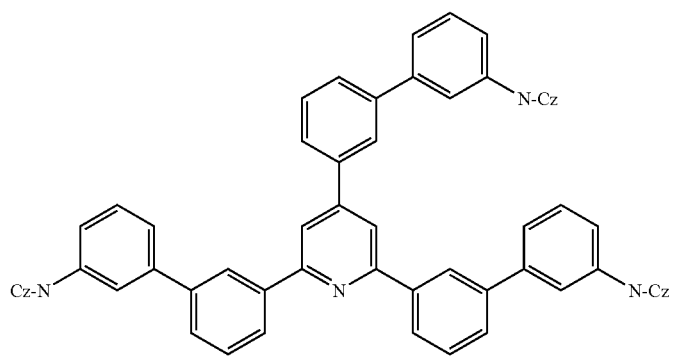
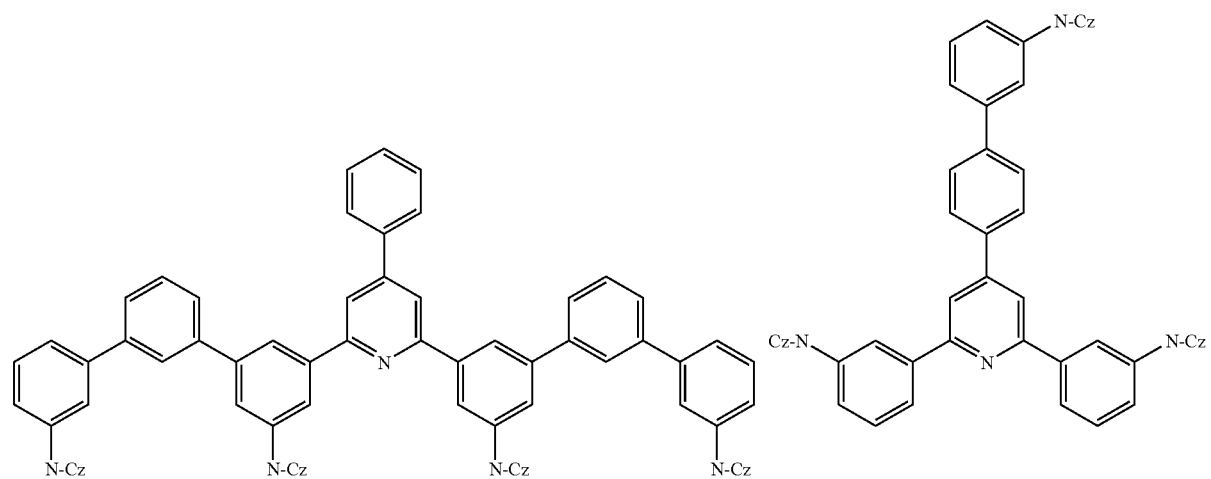
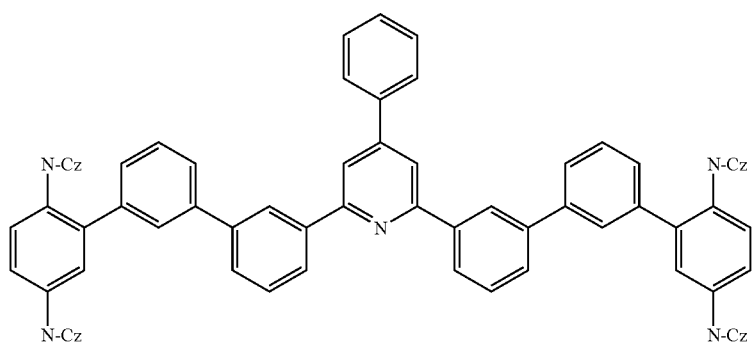

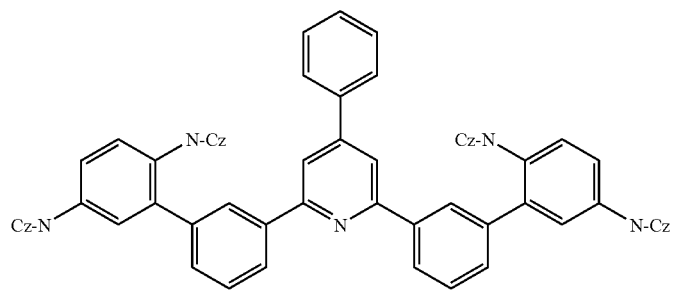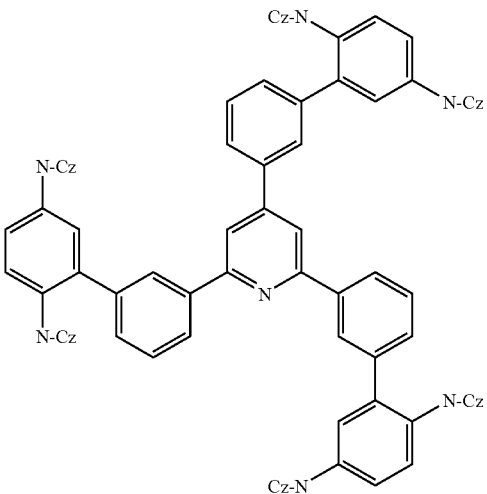
[Chemical Formula 27]
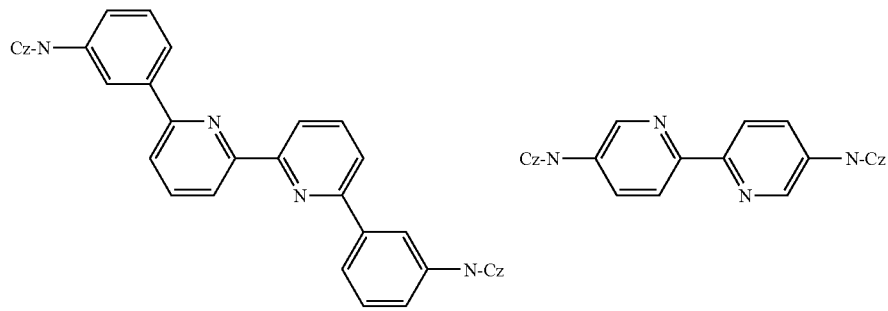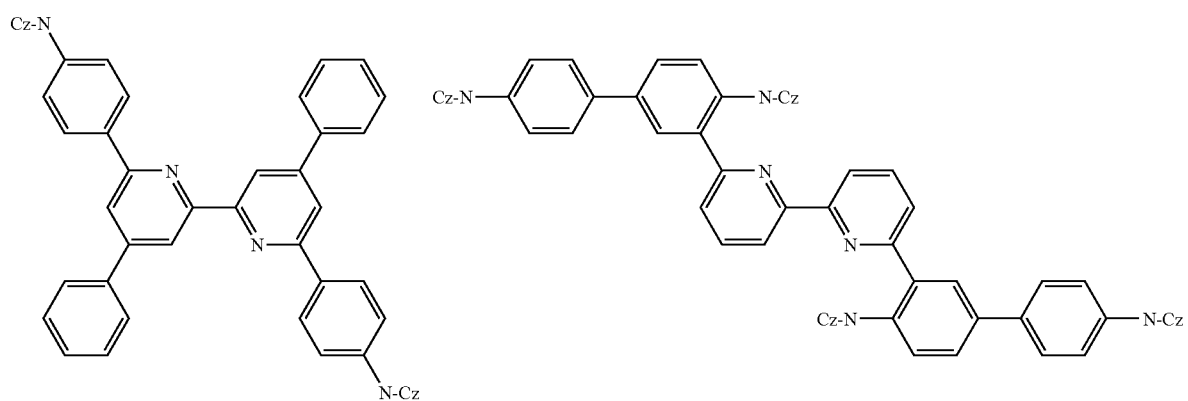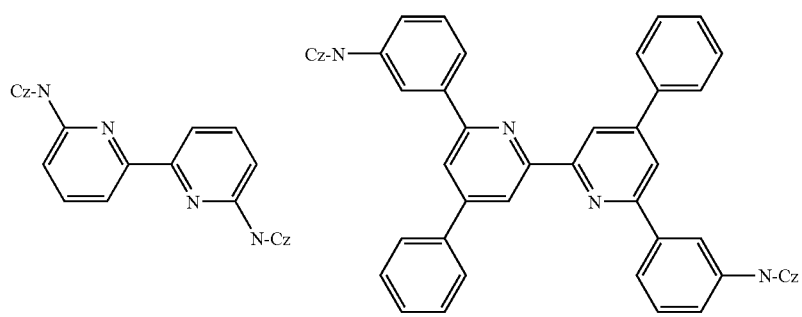

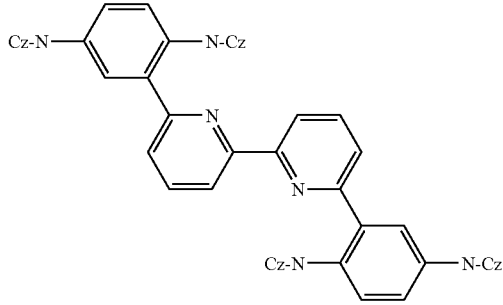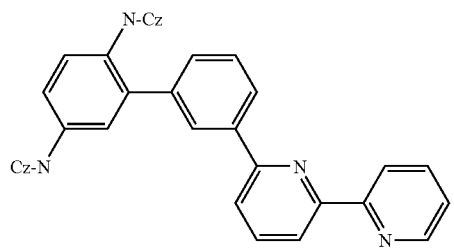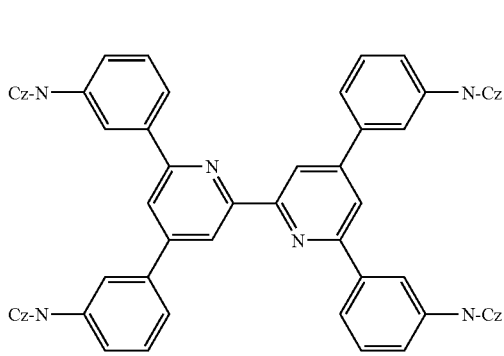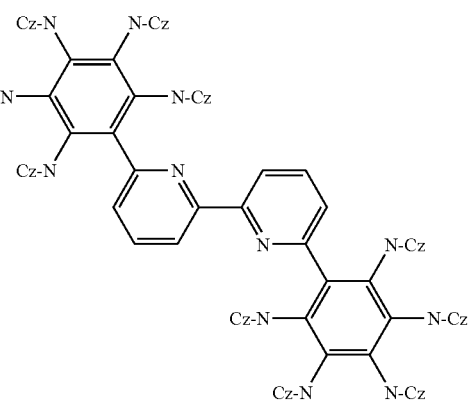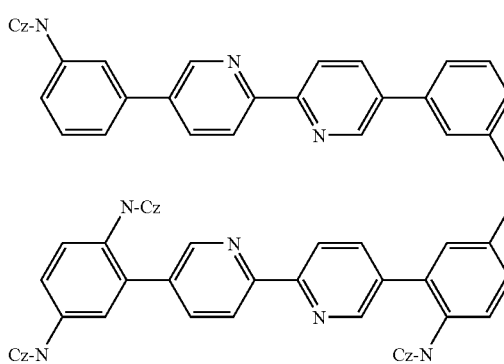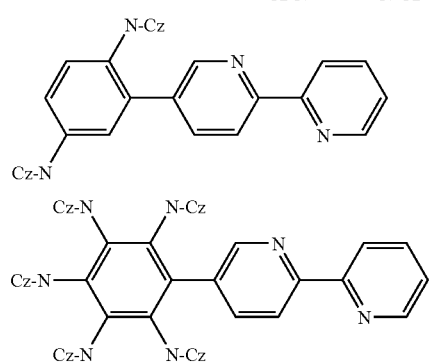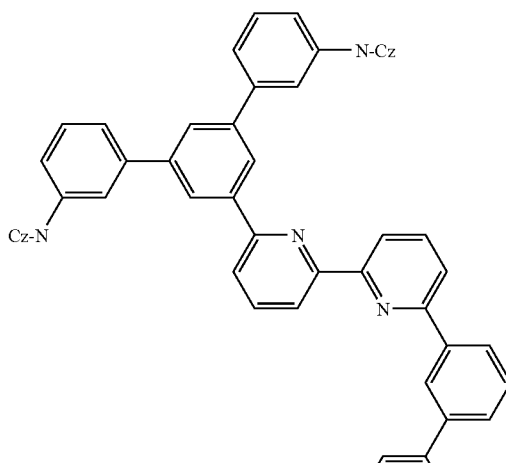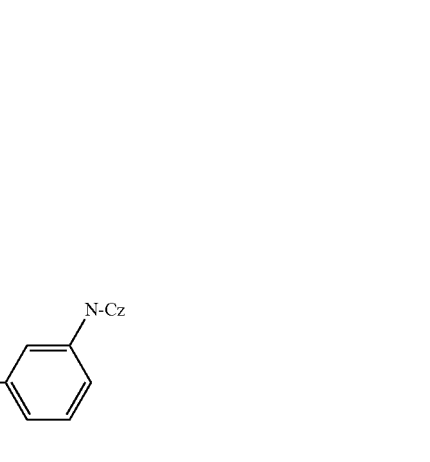

-continued

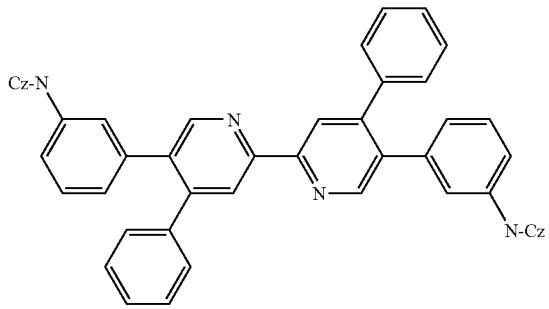
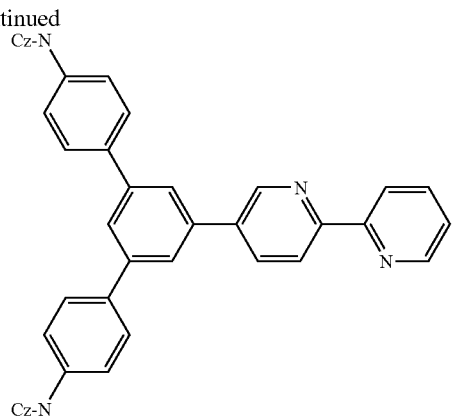

The glass transition point of a compound for use as the charge transporting material is generally 70° C. or higher, preferably 100° C. or higher, more preferably 120° C. or higher, further preferably 130° C. or higher, and most preferably 150° C. or higher. If a compound having an excessively low glass transition point is used in an organic electroluminescent device, the device may have reduced heat resistance and may possibly have a short operating life.

The molecular weight of a compound for use as the charge transporting material in the present invention is generally 10000 or less, preferably 5000 or less, more preferably 3000 or less, and is generally 100 or more, preferably 300 or more, and more preferably 500 or more. If the molecular weight is less than 100, there may result in significant decrease of heat resistance, may cause gas generation, may invite decreased quality of a film formed from the composition, or may cause morphological change of the resulting organic electroluminescent device due typically to migration. If the molecular weight exceeds 10000, it may be difficult to purify the organic compound or it may possibly take a long time to dissolve the organic compound in a solvent.

The band gap of a compound for use as the charge transport material in the present invention is generally 3.0 V or more, preferably 3.2 V or more, and more preferably 3.5 V or more. Blue-emitting fluorescent materials and phosphorescent materials typified by green to blue-emitting materials have large band gaps. When an organic electroluminescent device is manufactured by using a phosphorescent material of this type, a charge transporting material to be arranged surrounding the phosphorescent material preferably has a band gap equal to or larger than the band gap of the phosphorescent material, from the points of the luminous efficiency and life as an organic electroluminescent device.

The first oxidation potential of a charge transporting material $E_T^+$ for use in the present invention is generally 0.0 V or more, preferably 0.1 V or more, more preferably 0.2 V or more, further preferably 0.3 V or more, and most preferably 0.9 V or more, and is generally 2.1 V or less, preferably 1.7 V or less, more preferably 1.6 V or less, further preferably 1.5 V or less, and most preferably 1.4 V or less.

If the first oxidation potential of the charge transporting material $E_T^+$ is less than 0.0 V, the first reduction potential $E_T^-$ of the charge transport material must be set at a very low value. When this material is used in an organic electroluminescent device, there may result in significant imbalance between positive and negative charges, or there may cause decreased durability of the charge transport material against reduction, and the device may highly possibly fail to have a sufficient luminance and/or a satisfactory life. In contrast, if the first oxidation potential of the charge transport material $E_T^+$ exceeds 2.1 V, there may invite decreased durability of the luminescent material against oxidation, and the device may highly possibly fail to have a sufficient luminance and/or a satisfactory life.

The first reduction potential of the charge transport material $E_T^-$ as described in the present invention is generally −3.1 V or more, preferably −2.9 V or more, more preferably −2.8 V or more, further preferably −2.7 V or more, and most preferably −2.1 V or more and is generally −0.9 V or less, preferably −1.1 V or less, more preferably −1.3 V or less, further preferably −1.5 V or less, and most preferably −1.7 V or less.

If a charge transport material having a first reduction potential $E_T^-$ less than −3.1 V is used in an organic electroluminescent device, there may result in significant imbalance between positive and negative charges, or there may cause decreased durability of the charge transport material against reduction, and the device may highly possibly fail to have a sufficient luminance and/or a satisfactory life. In contrast, if a charge transport material having a first reduction potential $E_T^-$ exceeding −0.9 V is used in an organic electroluminescent device, the first oxidation potential of the charge transport material $E_T^+$ must be set at a very high value, and there may invite decreased durability of the charge transport material against oxidation, and the device may highly possibly fail to have a sufficient luminance and/or a satisfactory life.

<First Oxidation Potential $E_D^+$ and First Reduction Potential $E_D^-$ of Luminescent Material, and First Oxidation Potential $E_T^+$ and First Reduction Potential $E_T^-$ of Charge Transport Material>

A layer referred to as a light emitting layer in an organic electroluminescent device mainly contains a mixture of a luminescent material called "dopant" and a charge transport material called "host". In this case, the following pathway is regarded as a likely major light emission mechanism.

Specifically, holes travel through the highest occupied molecular orbital (HOMO) of the charge transport material and come into the highest occupied molecular orbital (HOMO) of the luminescent material. Electrons travel through the lowest unoccupied molecular orbital (LUMO) of the charge transporting material and come into the lowest unoccupied molecular orbital (LUMO) of the luminescent material. The holes and electrons are then recombined as charges, to make the luminescent material excited. At the time when the luminescent material undergoes transition from its excited state to its ground state, the luminescent material emits electromagnetic waves (light) corresponding to the energy difference between the two states.

The "HOMO level" herein corresponds to the first oxidation potential of each material, and the "LUMO level" corresponds to the first reduction potential of each material.

Accordingly, it has been believed in related art that a luminescent material in an electrically neutral state is preferably more susceptible to electron donation (oxidation) and electron acceptation (reduction) than a charge transport material. Specifically, the first oxidation potential of the luminescent material $E_D^+$, the first reduction potential of the luminescent material $E_D^-$, the first oxidation potential of the charge transport material $E_T^+$, and the first reduction potential of the charge transporting material $E_T^-$ in related art generally satisfy the following condition:

$$E_T^- \leq E_D^- \leq E_D^+ \leq E_T^+$$

However, according to the present invention, a luminescent material and a charge transport material are selected so as to allow the first oxidation potential of the luminescent material $E_D^+$, the first reduction potential of the luminescent material $E_D^-$, the first oxidation potential of the charge transport material $E_T^+$, and the first reduction potential of the charge transport material $E_T^-$ to satisfy the following condition:

$$E_T^- + 0.1 \leq E_D^- \leq E_T^+ \leq E_D^+ - 0.1$$

or $$E_D^- + 0.1 \leq E_T^- \leq E_D^+ \leq E_T^+ - 0.1$$

(1) In the case when the parameters satisfy the condition: $E_T^- + 0.1 \leq E_D^- < E_T^+ \leq E_D^+ - 0.1$ A possible mechanism in this case is as follows. Electrons travel through the charge transport material to the luminescent material in an electrically neutral state earlier than holes do, and the electrons are trapped in the lowest unoccupied molecular orbital (LUMO) of the luminescent material; and thereafter holes are injected into a bonding orbital having the highest energy level in the resulting luminescent material in an anionic state. The bonding orbital corresponds to the highest occupied molecular orbital (HOMO) of the luminescent material in a neutral state.

Specifically, it is primarily important that the first reduction potential of the luminescent material $E_D^-$ is necessarily and sufficiently larger than the first reduction potential of the charge transport material $E_T^-$. In other words, it is important that the luminescent material is necessarily and sufficiently more susceptible to electron acceptation but more resistant to electron donation than the charge transport material. In addition, it is also important that the first oxidation potential of the luminescent material $E_D^+$ is moderately larger than the first oxidation potential of the charge transport material $E_T^+$. Namely, it is important that the charge transport material is more likely to accept and transport holes.

Based on the above description, the absolute value of the difference between $E_D^-$ and $E_T^-$ $|E_D^- - E_T^-|$ is preferably 0.1 V or more, more preferably 0.15 V or more, and most preferably 0.2 V or more. The absolute value $|E_D^- - E_T^-|$ is preferably 1.5 V or less, more preferably 1.0 V or less, and most preferably 0.5 V or less. If the absolute value $|E_D^- - E_T^-|$ is lower than the lower limit, the electron may not be firmly trapped by the luminescent material in an electrically neutral state, there may occur a decreased probability of charge recombination on the luminescent material, and this may cause decreased luminous efficiency of the organic electroluminescent device. If the absolute value $|E_D^- - E_T^-|$ exceeds the upper limit, the drive voltage of the device may significantly increase due to increased voltage loss.

The absolute value of the deference between $E_T^+$ and $E_D^-$ $|E_T^+ - E_D^-|$ is preferably 1.0 V or more, more preferably 1.5 V or more, and most preferably 2.0 V or more. The absolute value $|E_T^+ - E_D^-|$ is preferably 4.5 V or less, more preferably 3.5 V or less, and most preferably 3.0 V or less. If the absolute value $|E_T^+ - E_D^-|$ is less than the lower limit, the device may show a decreased luminous efficiency, or may operate at a significantly increased drive voltage due to increased voltage loss. If the absolute value $|E_T^+ - E_D^-|$ exceeds the upper limit, the device may operate a significantly increased drive voltage.

The absolute value of the difference between $E_D^+$ and $E_T^+$ $|E_D^+ - E_T^+|$ is preferably 0.1 V or more, more preferably 0.15 V or more, and most preferably 0.2 V or more. The absolute value $|E_D^+ - E_T^+|$ is preferably 1.5 V or less, more preferably 1.0 V or less, and most preferably 0.5 V or less. If the absolute value $|E_D^+ - E_T^+|$ is less than the lower limit, holes can be easily injected not only into the highest occupied molecular orbital (HOMO) of the charge transporting material in an electrically neutral state but also into the highest occupied molecular orbital (HOMO) of the luminescent material in an electrically neutral state, and this may cause a decreased probability of charge recombination to thereby cause a decreased luminous efficiency of the organic electroluminescent device. If the absolute value $|E_D^+ - E_T^+|$ exceeds the upper limit, this may seriously hinder the charge recombination on the luminescent material to thereby cause a decreased luminous efficiency of the device.

The absolute value of the difference between $E_T^-$ and $E_D^+$ $|E_T^- - E_D^+|$ is preferably 1.5 V or more, more preferably 2.5 V or more, and most preferably 3.0 V or more. The absolute value $|E_T^- - E_D^+|$ is preferably 5.5 V or less, more preferably 4.5 V or less, and most preferably 4.0 V or less. If the absolute value $|E_T^- - E_D^+|$ is less than the lower limit, there may fail to provide a device that efficiently emit light in the visible ray region. If the absolute value $|E_T^- - E_D^+|$ exceeds the upper limit, the drive voltage of the device may significantly increase.

(2) In the case when the parameters satisfy the condition: $E_D^- + 0.1 \leq E_T^- \leq E_D^+ \leq E_T^+ - 0.1$ A possible mechanism in this case is as follows. Holes travel through the charge transport material to the luminescent material in an electrically neutral state earlier than electrons do, and the holes are trapped in the highest occupied molecular orbital (HOMO) of the luminescent material; and thereafter holes are injected into an anti-bonding orbital having the lowest energy level in the resulting luminescent material in a cationic state. The anti-bonding orbital corresponds to the lowest unoccupied molecular orbital (LUMO) of the luminescent material in a neutral state.

Specifically, it is primarily important that the first oxidation potential of the luminescent material $E_D^+$ is necessarily and sufficiently smaller than the first oxidation potential of the charge transport material $E_T^+$. In other words, it is important that the luminescent material is more susceptible to hole acceptation but more resistant to hole donation (hole release) than the charge transport material. In addition, it is also important that the first reduction potential of the luminescent material $E_D^-$ is moderately smaller than the first reduction potential of the charge transport material $E_T^-$. Namely, it is important that the charge transport material is more likely to accept and transport electrons.

Based on the above description, the absolute value of the difference between $E_D^+$ and $E_T^+$ $|E_D^+ - E_T^+|$ is preferably 0.1 V or more, more preferably 0.15 V or more, and most preferably 0.2 V or more. The absolute value $|E_D^+ - E_T^+|$ is also preferably 1.5 V or less, more preferably 1.2 V or less, and most preferably 0.9 V or less. If the absolute value $|E_D^+ - E_T^+|$ is less than the lower limit, the hole may not firmly trapped by the luminescent material in an electrically neutral state, there may occur a decreased probability of charge recombination on the luminescent material, and this may cause decreased luminous efficiency of the organic electroluminescent device. If the absolute value $|E_D^+ - E_T^+|$ exceeds the upper limit, the drive voltage of the device may significantly increase due to increased voltage loss.

The absolute value of the difference between $E_D^+$ and $E_T^-$ $|E_D^+ - E_T^-|$ is preferably 1.0 V or more, more preferably 1.5 or more, and most preferably 2.0 V or more. The absolute value $|E_D^+ - E_T^-|$ is also preferably 4.5 V or less, more preferably 3.5 V or less, and most preferably 3.0 or less. If the absolute value $|E_D^+ - E_T^-|$ is less than the lower limit, the luminous efficiency of the device may decrease, or the drive voltage of the device may significantly increase due to increased voltage loss. If the absolute value $|E_D^+ - E_T^-|$ exceeds the upper limit, the drive voltage of the device may significantly increase.

The absolute value of the difference between $E_D^-$ and $E_T^-$ $|E_D^- - E_T^-|$ is preferably 0.10 V or more, more preferably 0.15 V or more, and most preferably 0.20 V or more. The absolute value $|E_D^- - E_T^-|$ is also preferably 1.5 V or less, more preferably 1.0 V or less, and most preferably 0.5 V or less. If the absolute value $|E_D^- - E_T^-|$ is less than the lower limit, electrons can be easily injected not only into the charge transporting material in an electrically neutral state but also into the luminescent material in an electrically neutral state, and this may cause a decreased probability of charge recombination to thereby cause a decreased luminous efficiency of the organic electroluminescent device. If the absolute value $|E_D^- - E_T^-|$ exceeds the upper limit, this may seriously hinder the charge recombination on the luminescent material to thereby cause a decreased luminous efficiency of the device.

The absolute value of the difference between $E_T^+$ and $E_D^-$ $|E_T^+ - E_D^-|$ is preferably 1.5 V or more, more preferably 2.5 V or more, and most preferably 3.0 V or more. The absolute value $|E_T^+ - E_D^-|$ is also preferably 5.5 V or less, more preferably 4.5 V or less, and most preferably 4.0 V or less. If the absolute value $|E_T^+ - E_D^-|$ is less than the lower limit, there may fail to provide a device that efficiently emit light in the visible ray region. If the absolute value $|E_T^+ - E_D^-|$ exceeds the upper limit, the drive voltage of the device may significantly increase.

[Comparison in Voltage When Composition for Organic Electroluminescent Device Contains Two or More Diffident Luminescent Materials and Charge Transport Materials]

<In the Case When Composition for Organic Electroluminescent Device According to the Present Invention Contains Two or More Different Charge Transport Materials>

When the parameters satisfy the condition: $E_D^- + 0.1 \leq E_T^- \leq E_D^+ \leq E_T^+ - 0.1$, the "first oxidation potential of the charge transport material $E_T^+$" refers to the first oxidation potential of a charge transport material which has the smallest first oxidation potential (namely, a material which is most susceptible to oxidation). The "first reduction potential of the charge transport material $E_T^-$" refers to the first reduction potential of a charge transport material which has the largest first reduction potential (namely, a material which is most susceptible to reduction). When the parameters satisfy the condition: $E_T^- + 0.1 \leq E_D^- \leq E_T^+ \leq E_D^+ - 0.1$, the "first oxidation potential of the charge transport material $E_T^+$" refers to the first oxidation potential of a charge transport material which has the smallest first oxidation potential (namely, a material which is most susceptible to oxidation). The "first reduction potential of the charge transport material $E_T^-$" refers to the first reduction potential of a charge transport material which has the largest first reduction potential (namely, a material which is most susceptible to reduction).

<In the Case When Composition for Organic Electroluminescent Device According to the Present Invention Contains Two or More Different Luminescent Materials>

When the parameters satisfy the condition: $E_T^- + 0.1 \leq E_D^- \leq E_T^+ \leq E_D^+ - 0.1$, the "first oxidation potential of the luminescent material $E_D^+$" refers to the first oxidation potential of a luminescent material which has the smallest first oxidation potential (namely, a material which is most susceptible to oxidation), and the "first reduction potential of the luminescent material $E_D^-$" refers to the first reduction potential of a luminescent material which has the largest first reduction potential (namely, a material which is most susceptible to reduction).

When the parameters satisfy the condition: $E_D^- + 0.1 \leq E_T^- \leq E_D^+ \leq E_T^+ - 0.1$, the "first oxidation potential of the luminescent material $E_D^+$" refers to the first oxidation potential of a luminescent material which has the smallest first oxidation potential (namely, a material which is most susceptible to oxidation), and the "first reduction potential of the luminescent material" refers to the first reduction potential of a luminescent material $E_D^-$ which has the largest first reduction potential (namely, a material which is most susceptible to reduction).

<Solvent>

Solvents to be contained in a composition for an organic electroluminescent device according to the present invention are not specifically limited, as long as the solutes can be satisfactorily dissolved therein. However, since most of materials for organic electroluminescent devices generally have aromatic rings, typical examples of solvents for use herein include aromatic hydrocarbons such as toluene, xylenes, mesitylene, cyclohexylbenzene, and tetralin; halogenated aromatic hydrocarbons such as chlorobenzene, dichlorobenzene, and trichlorobenzene; aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole, 2,4-dimethylanisole, and diphenyl ether; aromatic esters such as phenyl acetate, phenyl propionate, methyl benzoate, ethyl benzoate, ethyl benzoate, propyl benzoate, and n-butyl benzoate; alicyclic ketones such as cyclohexanone and cyclooctanone; and alicyclic alcohols such as cyclohexanol and cyclooctanol.

When the solute molecule has a suitable substituent such as an ester group or an ether group, examples of solvents for use herein also include, in addition to the above-listed solvents, aliphatic ketones such as methyl ethyl ketone and dibutyl ketone; aliphatic alcohols such as butanol and hexanol; aliphatic ethers such as ethylene glycol dimethyl ether, ethylene glycol diethyl ether, and propylene glycol-1-monomethyl ether acetate (PGMEA); and aliphatic esters such as ethyl acetate, n-butyl acetate, ethyl lactate, and n-butyl lactate.

When a solvent excessively evaporates from a composition for an organic electroluminescent device during wet coating process, the stability in film-formation may deteriorate. To avoid this, solvents each having a boiling point of 100° C. or higher, preferably a boiling point of 150° C. or higher, and more preferably a boiling point of 200° C. or higher are effective. In addition, a solvent must evaporate at a suitable rate from a liquid film immediately after film-formation in order to yield a more homogenous film. For this purpose, the solvent generally has a boiling point of 80° C. or higher, preferably a boiling point of 100° C. or higher, more preferably a boiling point of 120° C. or higher and generally has a boiling point of lower than 270° C., preferably a boiling point of lower than 250° C., and more preferably a boiling point of lower than 230° C.

If the composition contains water, the water may remain in a film after drying to thereby adversely affect the properties of an organic electroluminescent device, because most of materials typically in a cathode of such an organic electroluminescent device significantly deteriorate due to water. Examples of a procedure for reducing the water content in the solution (composition) include sealing with nitrogen gas, the use of a drying agent, predehydration of a solvent, and the use of a solvent having a low water solubility. Among them, the use of a solvent having a low water solubility is preferred, because this prevents whitening of a film of the solution due to absorption of water from the atmosphere during a wet film-formation step. From these viewpoints, a composition for an organic electroluminescent device according to this embodiment preferably contains 10 percent by weight or more of a solvent having a solubility in water at 25° C. of 1 percent by weight or less, preferably 0.1 percent by weight or less.

When a solvent satisfies all these requirements, i.e., the solubility of the solute, the evaporation rate, and water solubility, it may be used alone. When, however, it is difficult to select such a solvent satisfying all the requirements, two or more different solvents may be used in combination.

<Other Components>

A composition for an organic electroluminescent device according to the present invention may further contain other solvents in addition to the solvents as listed above. Examples of such other solvents include amides such as N,N-dimethylformamide and N,N-dimethylacetamide; and dimethyl sulfoxide.

The composition may further contain various additives such as leveling agents and antifoaming agents.

When two or more layers are laminated through wet coating process, these layers may be dissolved in each other. To avoid this, the composition may contain a photo-curable resin and/or a thermosetting resin, so as to cure the composition after coating to be insoluble. The resin for use herein such as a photo-curable resin and/or a thermosetting resin is generally a resin having a first oxidation potential $E_x^+$ and a first reduction potential $E_x^-$ and satisfying the following conditions:

$$E_x^- < E_T^- \text{ and } E_D^+ < E_x^+ \text{ when } E_T^- + 0.1 \leq E_D^- \leq E_T^+ \leq E_D^+ - 0.1;$$

or a resin having a first oxidation potential $E_x^+$ and a first reduction potential $E_x^-$ and satisfying the following conditions:

$$E_x^- < E_D^- \text{ and } E_T^+ < E_x^+ \text{ when } E_D^- + 0.1 \leq E_T^- \leq E_D^+ \leq E_T^+ - 0.1.$$

<Contents and Proportions of Materials in Composition for Organic Electroluminescent Device>

The solid content including a luminescent material, a charge transport material, and an additional component to be added according to necessity, such as a leveling agent, in a composition for an organic electroluminescent device is generally 0.01 percent by weight or more, preferably 0.05 percent by weight or more, more preferably 0.1 percent by weight or more, further preferably 0.5 percent by weight or more, and most preferably 1 percent by weight or more, and is generally 80 percent by weight or less, preferably 50 percent by weight or less, more preferably 40 percent by weight or less, further preferably 30 percent by weight or less, and most preferably 20 percent by weight or less. If the content is less than 0.01 percent by weight, it may be difficult to form a thick film from the composition. If the content exceeds 80 percent by weight, it may be difficult to form a thin film from the composition.

The weight ratio of a luminescent material to a charge transporting material in a composition for an organic electroluminescent device according to the present invention is generally 0.1/99.9 or more, more preferably 0.5/99.5 or more, further preferably 1/99 or more, and most preferably 2/98 or more, and is generally 50/50 or less, more preferably 40/60 or less, further preferably 30/70 or less, and most preferably 20/80 or less. If the ratio is less than 0.1/99.9 or exceeds 50/50, the luminous efficiency may seriously decrease.

<Preparation Method of Composition for Organic Electroluminescent Device>

A composition for an organic electroluminescent device according to the present invention may be prepared by dissolving solutes such as a luminescent material and a charge transporting material, and additives such as a leveling agent and an anti-foaming agent added according to necessity, in a suitable solvent. The solutes are generally dissolved with stirring the mixture so as to shorten the time necessary for the dissolving step and to uniformize the concentrations of solutes in the composition. The dissolving step may be carried out at ordinary temperature, or carried out with heating so as to accelerate dissolution when the dissolution rate is low. After the completion of the dissolving step, the composition may be subjected to a filtrating step such as filtering according to necessity.

<Properties and Physical Properties of Composition for Organic Electroluminescent Device>

Water Content

The water content of the composition as a solution is preferably minimized, because, if the composition contains water upon wet film-formation for forming a film in an organic electroluminescent device, water migrates into the formed film to thereby impair the uniformity of the film. In addition, generally most of materials typically in a cathode of an organic electroluminescent device may deteriorate due to water. Accordingly, if the composition contains water, water may remain in a film after drying and may possibly impair the properties of the device.

Specifically, the water content of a composition for an organic electroluminescent device according to the present invention is generally 1 percent by weight or less, preferably 0.1% or less, and more preferably 0.01% or less.

The water content of the composition is preferably analyzed according to the method specified in Japanese Industrial Standards (JIS) "Test methods for water content of chemical products" (JIS K0068:2001). It can be analyzed typically by Karl-Fischer reagent method (JIS K0211-1348).

Concentration of Primary Amine- and Secondary Amine-Containing Compounds

A composition for an organic electroluminescent device according to the present invention preferably has a low concentration of a primary amine- and secondary amine-containing compounds, because such primary amine- and secondary amine-containing compounds have lower charge transporting ability, are more likely to act as a charge trap, and are more susceptible to decomposition reaction such as proton detachment than tertiary amine compounds.

More specifically, the concentration of nitrogen atoms derived from primary amino group (—$NH_2$) and secondary amino group (>NH) is preferably 100 ppm (µg/g) or less, and more preferably 10 ppm (µg/g) or less, based on the total weight of materials other than solvents.

The "primary amine-containing compound" in a composition for an organic electroluminescent device refers to a compound which contains one or more nitrogen atoms, in which at least one of the nitrogen atom(s) is combined with two hydrogen atoms and one atom other than hydrogen. Namely, the primary amine-containing compound is a compound represented by RNH$_2$, wherein R represents any group other than hydrogen atom.

The "secondary amine-containing compound" refers to a compound which contains one or more nitrogen atoms, in which at least one of the nitrogen atom(s) is combined with one hydrogen atom and two atoms other than hydrogen. Namely, the secondary amine-containing compound is a compound represented by RR'NH, wherein R and R' each independently represent any group other than hydrogen atom, or R and R' may be combined to form a ring.

Examples of procedures for identifying primary amine- and secondary amine-containing compounds include processes using magnetic resonance systems (NMR ($^1$H-NMR and $^{13}$C-NMR)) and Fourier transform infrared spectrophotometers (FT-IR), as well as mass spectrometry (MS, LC/MS, GC/MS, and MS/MS). Where necessary, other apparatuses can be used in combination. Examples of such apparatuses include gas chromatographs (GC), high-performance liquid chromatographs (HPLC), high-performance amino acid analyzers (AAA), capillary electrophoresis measurement systems (CE), size exclusion chromatographs (SEC), gel permeation chromatographs (GPC), cross fractionation chromatographs (CFC), ultraviolet-visible ray-near infrared spectrophotometers (UV.VIS, NIR), and electron spin resonance spectrometers (ESR).

Known techniques can be applied to the separation of primary amine- and secondary amine-containing compounds. Examples of such techniques include the techniques described in "Handbook of Separation/Purification Technology" (1993, edited by the Chemical Society of Japan), "High-purity Separation of Trace Components and Difficult-to-Separate Substances by Chemical Conversion" (1988, published by IPC Co., Ltd.), and "Experimental Chemistry (Fourth Ed.) Vol. 1; Section: Separation and Purification" (1990, edited by the Chemical Society of Japan).

Specific examples of purification procedures include various chromatography techniques, extraction, adsorption, occlusion, melting or fusion, crystallization, distillation, evaporation, sublimation, ion exchange, dialysis, filtration, ultrafiltration, reverse osmosis, pressurized osmosis, zone melting, electrophoresis, centrifugation, floatation separation, sedimentation, and magnetic separation. Such chromatography techniques are classified by shape into column, paper, thin-layer, and capillary chromatography; by mobile phase into gas, liquid, micelle, and supercritical fluid chromatography; and by separation mechanism into adsorption, partition, ion-exchange, molecular sieve, chelate, gel filtration, exclusion, and affinity chromatography.

Examples of processes for detecting/determining primary amine- and secondary amine-containing compounds include:

i) a process of subjecting a sample with concentrated sulfuric acid to ignition decomposition to thereby convert them into ammonium sulfate, adjusting the decomposition mixture to be strongly basic, distilling ammonia through steam distillation, and trapping ammonia in a sulfuric acid or boric acid solution having a known concentration;

ii) a process of oxidatively decomposing a sample with basic potassium peroxodisulfate into nitric acid ion, adjusting the pH of the resulting solution to 2 to 3, and determining absorbance of nitric acid ion at a wavelength of 220 nm to thereby determine the nitrogen concentration (ultraviolet absorptiometry);

iii) a process for the detection by using an electrogenerated chemiluminescence reaction with Ru(II) bipyridine complex as a detection reagent, described in Japanese Unexamined Patent Application Publication No. 4-315048; and iv) a process for the detection using a surface ionization detector (SID), described in Japanese Unexamined Patent Application Publication No. 10-115606.

Uniformity

A composition for an organic electroluminescent device according to the present invention is preferably a homogenous liquid at ordinary temperature. Thus, the stability increases in wet film-formation. For example, when the composition is discharged from a nozzle according to an ink-jet process, the discharge stability increases. The phrase "homogenous liquid at ordinary temperature" means that the composition is a liquid of a homogenous phase and does not contain particle components having a size of 0.1 μm or more.

Physical Properties

If a composition for an organic electroluminescent device according to the present invention has an extremely low viscosity, a film of the composition formed in a film-formation step, for example, may have excessively high flowability to thereby cause an uneven film surface, or the composition may not be satisfactorily discharged from a nozzle in ink-jet film-formation. In contrast, if the composition has an extremely high viscosity, it may often cause plugging of a nozzle in ink-jet film-formation. Consequently, the viscosity of a composition according to the present invention at 25° C. is generally 2 mPa·s or more, preferably 3 mPa·s or more, and more preferably 5 mPa·s or more, and is generally 1000 mPa·s or less, preferably 100 mPa·s or less, and more preferably 50 mPa·s or less.

The surface tension at 20° C. of a composition for an organic electroluminescent device according to the present invention is generally less than 50 mN/m, and preferably less than 40 mN/m. This is because, if the composition has a high surface tension and is used as a composition for film-formation on a substrate, the composition may have poor wettability, and a film formed from the composition may have poor leveling property to thereby often cause an uneven surface of the film after drying.

The vapor pressure at 25° C. of a composition for an organic electroluminescent device according to the present invention is generally 50 mmHg or less, preferably 10 mmHg or less, and more preferably 1 mmHg or less. This is because, if the composition has a high vapor pressure, for example, the composition may often undergo change in concentrations of the solutes due to evaporation of the solvent.

<Storage of Composition for Organic Electroluminescent Device>

A composition for an organic electroluminescent device according to the present invention is preferably stored by placing in a vessel that blocks ultraviolet transmission, such as a brown glass bottle, and hermetically sealing the vessel. The storage temperature is generally −30° C. or higher, and preferably 0° C. or higher, and is generally 35° C. or lower, and preferably 25° C. or lower.

[Thin Film for Organic Electroluminescent Device]

A thin film for an organic electroluminescent device according to the present invention is generally used as an organic light emitting layer of an organic electroluminescent device.

The refractive index of a thin film for an organic electroluminescent device according to the present invention is preferably 1.78 or less with respect to light with a wavelength of 500 nm to 600 nm.

The refractive index of the film is determined, for example, by spectroscopic ellipsometry or prism coupling. The spectroscopic ellipsometry for use in determination of the refractive index in the present invention will be illustrated in detail below.

In the spectroscopic ellipsometry, a change in polarization of light reflected from the surface of a sample. Optical constants are determined by optimizing parameters of a suitable model function indicating the optical constants so as to reproduce actually measured values of T and A.

Such optical constants are generally in the form of smooth functions with respect to wavelengths, and their real part and imaginary part have a causal relation called Kramers-Kronig relation. Accordingly, the optical constants of most materials can be modeled as functions.

Representative model functions for use in analyses by spectroscopic ellipsometry are as follows:

Cauchy model typically for a transparent body or a transparent film;

Lorentz model typically for a metal film or a transparent conductive film; and

Parameterized Semiconductor model typically for a semiconductor material or a transparent film.

According to the spectroscopic ellipsometry, optical constants (refractive index n and extinction coefficient k) as bulk or as a thin film can be determined at wavelengths in the near ultraviolet, visible, and near infrared regions (300 to 1700 nm), and the thickness (d) of a single layer or a multilayer film can be determined in the range of, for example, several nanometers to several micrometers.

The values $\Psi$ and $\Delta$ can be determined with high precision and high reproducibility according to spectroscopic ellipsometry, because ratios are measured in the spectroscopic ellipsometric determination.

Wet film-formation is desirable as a film-formation process for yielding a thin film for an organic electroluminescent device having a refractive index within the preferred range.

The film-formation of a thin film for an organic electroluminescent device (hereinafter also referred to as "organic layer") using a composition for an organic electroluminescent device according to the present invention is preferably carried out through wet film-formation. Such a wet film-formation process can be selected according to the properties of materials to be contained in the composition and of a substrate as a base material from among, for example, spin coating, spray coating, an ink-jet process, flexographic printing, and screen printing. A film formed by such a film-formation process is preferably dried through heating so as to reduce water and residual solvent contained in the film. The drying through heating is carried out by using a heating device or procedure such as a hot plate or an oven, or by induction heating. The heating treatment is preferably carried out at 60° C. or higher for sufficient effects, and is more preferably carried out at 100° C. or higher for reducing the content of residual water. The heating time is generally about one minute to about eight hours.

When an organic layer is formed through wet film-formation on an anode typically of indium tin oxide (ITO), the anode may be treated with a specific halogen compound, such as 4-trifluoromethylbenzoyl chloride shown below, immediately before the film-formation as disclosed in Japanese Unexamined Patent Application Publication No. 2002-270369. This treatment enables easy injection of holes from the anode. Specifically, when ITO is treated with an acid chloride having an electron withdrawing group, such as the following compound, the anode surface is modified with the compound having an electron withdrawing group to thereby form an electric double layer on the anode surface. An electric field generated by the action of the electric double layer increases the work function of the anode and hence enables easy injection of holes from the anode.

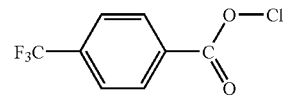

[Chemical Formula 28]

The film may be subjected to a surface treatment typically for improving the leveling property of the film and for improving the coatability typically through reduction of crawling. Examples of such surface treatments include UV/ozone treatment, oxygen plasma treatment, hydrogen plasma treatment, and hexamethyldisilazane (HMDS) treatment. Each of these surface treatments can be used in combination.

Residual water, if contained in an organic layer thus formed, is not desirable, because the residual water may adversely affect the properties of the device, as described above. More specifically, the water content in the resulting organic layer is 1000 ppm by weight or less, preferably 100 ppm by weight or less, and more preferably 10 ppm by weight or less. A residual solvent derived from the composition, if remains in the organic layer, is also not desirable. This is because the residual solvent may often cause migration of materials constituting the organic layer, due to heat generated upon energizing of the organic electroluminescent device or due to elevated temperatures in the environment where the device is used. Specifically, the content of residual solvent in the organic layer is 1000 ppm by weight or less, preferably 100 ppm by weight or less, and more preferably 10 ppm by weight or less.

The contents of water and residual solvent in the organic layer can be analyzed typically by programmed thermal desorption-mass spectrometry (TPD-MS).

[Transfer Member for Thin Film for Organic Electroluminescent Device]

Such a transfer member is a member used as an image-imparting element for transferring an image pattern to an image-receiving element according to laser induced thermal imaging process (LITI process). This technique is widely used in the fields typically of printing, composition (typesetting), and photography.

FIG. 1 illustrates a typical configuration of a transfer member for a thin film for an organic electroluminescent device according to the present invention. With reference to FIG. 1, a transfer member 11 includes a base material 12, and a photothermal conversion layer 13, an intermediate layer 14, and a transfer layer 15 arranged sequentially on the base material 12. The transfer layer 15 is melted as a result of heating by the action of the photothermal conversion layer 13 and is transferred as a pattern onto an image-receiving element (not shown). A transfer member for a thin film for an organic electroluminescent device according to the present invention may further arbitrarily include one or more additional layers according to necessity.

The base material 12 in a transfer member for a thin film for an organic electroluminescent device according to the present invention can be formed from any natural or synthetic material, as long as it satisfies requirements for a transfer member for a thin film for an organic electroluminescent device. Requirements for the base material include, for example, transparency to laser light and heat resistance, because heating for transfer of an image component is carried out by the application of laser light. The requirements also include moderate flexibility, lightness, handleability, and mechanical strength, because the transfer member is applied to an image-receiving element upon use and removed therefrom after use.

A transparent polymer is preferably used as the base material. Examples thereof include polyesters such as poly(ethylene terephthalate)s; acrylic resins; polyepoxys (epoxy resins); polyethylenes; and polystyrenes, of which poly(ethylene terephthalate)s are more preferably used. The thickness of the base material can be arbitrarily adjusted according typically to the specifications of a desired transfer member for a thin film for an organic electroluminescent device, and is generally within a range of 0.01 to 1 mm.

The photothermal conversion layer 13 supported by the base material 12 acts to receive applied laser light, convert the optical energy into thermal energy, melt the image component in the transfer layer 15 facing the photothermal conversion layer 13 with the interposition of the intermediate layer 14, and transfer and solidify the molten image component to the surface of the image receiving element. Consequently, the photothermal conversion layer 13 preferably includes a light-absorptive material such as a metal layer (film) composed of aluminum, oxide and/or sulfide thereof; carbon black; graphite; or an infrared dye, or includes a layer containing a dispersed light-absorptive material. The photothermal conversion layer 13 preferably contains a photo-induced polymerizable component for curing the layer. When a photothermal conversion layer 13 is formed as the metal layer (film) as the light-absorptive layer, it is suitably formed to a thickness of 100 to 5000 angstroms by vacuum deposition, electron beam deposition, or sputtering.

Preferred examples of the photothermal conversion layer 13 also include a layer containing a carbon black, a photo-induced polymerizable monomer or oligomer, and/or photopolymerization initiator dispersed in a binder resin. Such a photothermal conversion layer 13 of components dispersed in a binder resin can be generally formed, for example, by applying a resin composition having a predetermined composition to a surface of the base material 12 according to a known coating process such as spin coating, gravure printing, or die coating, and drying the applied film. The thickness of the photothermal conversion layer 13 of components dispersed in a binder resin can be set within a wide range depending typically on the specifications and advantages of a desired transfer member for a thin film for an organic electroluminescent device. The thickness is generally within a range of 0.001 to 10 µm.

The intermediate layer 14 arranged between the photothermal conversion layer 13 and the transfer layer 15 especially acts to uniformize the photothermal conversion action of the photothermal conversion layer 13. The layer can be generally formed from a resin material satisfying the above-mentioned requirements. The intermediate layer 14 can be generally formed, for example, by applying a resin composition having a predetermined composition to a surface of the photothermal conversion layer 13 according to a known coating process such as spin coating, gravure printing, or die coating, and drying the applied film, in the same manner as the photothermal conversion layer 13. The thickness of the intermediate layer 14 can be set within a wide range depending typically on desired effects and is generally within a range of 0.05 to 10 µm.

The structure of a transfer member for a thin film for an organic electroluminescent device can be modified according to its use. For example, the transfer member for a thin film for an organic electroluminescent device may have an antireflection coating so as to prevent the properties of the transfer layer 15 from decreasing due to reflection, and/or it may have a gas generation layer instead of the intermediate layer 14, so as to improve the sensitivity of the transfer member.

When the gas generation layer absorbs light or heat, it decomposes to discharge nitrogen gas or hydrogen gas to thereby provide transferring energy. Examples of the gas generation layer include at least one material selected from pentaerythritol tetranitrate (PETN) and trinitrotoluene (TNT).

The transfer layer 15 is arranged as a topmost layer of the transfer member 11 for a thin film for an organic electroluminescent device according to the present invention. This layer is an electroluminescent thin film which is melted by the action of the photothermal conversion layer 13 or is delaminated by the action of a vaporized gas generation layer and is transferred as a pattern to an image-receiving element, as is described above. It corresponds to a thin film for an organic electroluminescent device according to the present invention and can be formed as a film by the above-mentioned process.

[Organic Electroluminescent Device]

An organic electroluminescent device according to the present invention is an organic electroluminescent device including a substrate bearing an anode, a cathode, and an organic light emitting layer arranged between the two electrodes, in which the organic light emitting layer is a layer formed through wet film-formation using the composition for an organic electroluminescent device according to the present invention, or is a layer formed by using the transfer member for a thin film for an organic electroluminescent device according to the present invention.

Figure 2:
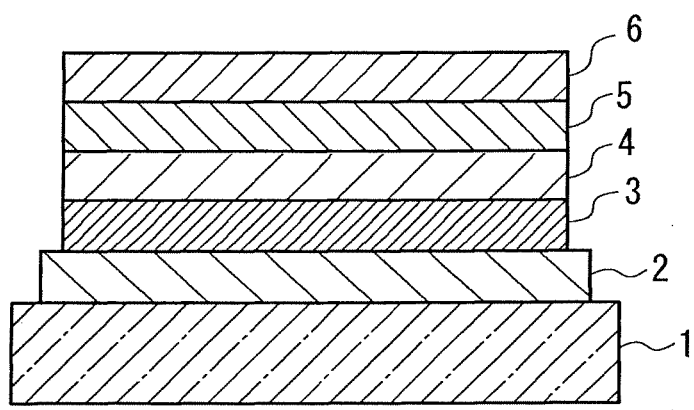
FIG. 2 is a schematic cross-sectional view illustrating an embodiment of an organic electroluminescent device.

FIG. 2 is a cross-sectional view schematically illustrating a structure of a general organic electroluminescent device for use in the present invention. FIG. 2 shows a substrate 1, an anode 2, a hole injection layer 3, an organic light emitting layer 4, an electron injection layer 5, and a cathode 6.

<Substrate>

The substrate 1 functions as a support in the organic electroluminescent device and includes a plate of quartz or glass, a metal plate or metal foil, or a plastic film or sheet. In particular, a glass plate and a plate or film of transparent synthetic resin such as a polyester, a polymethacrylate, a polycarbonate or a polysulfone are preferred. When a synthetic resin substrate is used, its gas barrier properties are important. If the gas barrier properties are too poor, the organic electroluminescent device may deteriorate due to the air outside having passed through the substrate, thus poor gas barrier properties not being preferred. To avoid this, for example, a dense silicon oxide film may be preferably arranged on at least one side of the synthetic resin substrate to thereby ensure sufficient gas barrier properties.

<Anode>

An anode 2 is arranged on the substrate 1. The anode 2 serves to inject holes into a hole transport layer 4. The anode 2 generally includes a metal such as aluminum, gold, silver, nickel, palladium or platinum; a metal oxide such as indium oxide and/or tin oxide; a metal halide such as copper iodide; carbon black; or a conductive polymer such as poly(3-methylthiophene), polypyrrole or polyaniline. The anode 2 is generally formed by sputtering or vacuum deposition. When the anode 2 is formed from fine particles of a metal such as silver, fine particles of copper iodide, carbon black, fine particles of a conductive metal oxide, or fine particles of a conductive polymer, it can also be formed by dispersing such particles in a suitable binder resin solution to yield a dispersion, and coating the dispersion on the substrate 1. Further, when the anode 2 is formed from an electroconductive polymer, the anode 2 can also be directly formed as a polymerized thin film on the substrate 1 through electrolytic polymerization or formed by applying an electroconductive polymer to the substrate 1 (App. Phys. Lett., vol. 60, p. 2711, 1992). The anode 2 may be of a multilayer structure made from two or more different materials.

The thickness of the anode 2 varies depending upon required transparency. When some transparency is required, the transmittance for visible light is adjusted to be usually 60% or more, and preferably 80% or more. In this case, the thickness of the anode is usually 5 nm or more, and preferably 10 nm or more, and is usually 1,000 nm or less, and preferably 500 nm or less. When the anode may be opaque, the anode 2 may also function as the substrate 1. In addition, a layer of another electroconductive material may be arranged on the anode 2.

The surface of the anode is preferably subjected to an ultraviolet ray (UV)/ozone treatment or a treatment with oxygen plasma or argon plasma to remove impurities deposited on the anode and to adjust ionization potential to thereby carry out hole injection more satisfactorily.

<Hole Injection Layer>

An organic electroluminescent device according to the present invention preferably further includes a hole injection layer between the organic light emitting layer and the anode.

Since the hole injection layer 3 is a layer which functions to transport holes from the anode 2 to the organic light emitting layer 4, the hole injection layer 3 preferably contains a hole-transporting compound.

A hole is transported in such a manner that one electron is removed from an electrically neutral compound to yield a cation radical, and the cation radical receives one electron from a neighboring electrically neutral compound. If the hole injection layer does not contain a cation radical compound when the device is not energized, a hole-transporting compound gives an electron to the anode to thereby form a cation radical of the hole-transporting compound, and the cation radical receives an electron from another electrically neutral hole-transporting compound to thereby transport a hole.

The hole injection layer preferably contains a cation radical compound. This is because, when the hole injection layer 3 contains a cation radical compound, a cation radical necessary for hole transportation is present in a concentration equal to or higher than the concentration thereof formed as a result of the oxidation of the anode 2, and this improves the hole-transporting ability. The hole injection layer more preferably contains both a cation radical compound and a hole-transporting compound, because an electron can be smoothly received/given when an electrically neutral hole-transporting compound is present in the vicinity of a cation radical compound.

The "cation radical compound" herein is an ionic compound containing a cation radical and a counter anion, which cation radical is a chemical species corresponding to a hole-transporting compound, except for removing one electron therefrom. The cation radical compound already has an easy-to-move hole (free carrier).

The hole injection layer 3 also preferably contains a hole-transporting compound and an electron-accepting compound. This is because the cation radical compound is formed by mixing a hole-transporting compound with an electron-accepting compound to thereby cause one electron to transfer from the hole-transporting compound to the electron-accepting compound.

Summarizing preferred materials as mentioned above, the hole injection layer 3 preferably contains a hole-transporting compound and more preferably contains both a hole-transporting compound and an electron-accepting compound. The hole injection layer 3 also preferably contains a cation radical compound and more preferably contains both a cation radical compound and a hole-transporting compound.

Where necessary, the hole injection layer 3 further contains a coatability improver and/or a binder resin that hardly acts as a charge trap.

It is also possible, however, that an electron-accepting compound alone is applied as the hole injection layer 3 to the anode 2 by wet film-formation, and a composition for an organic electroluminescent device according to the present invention is directly applied to the hole injection layer 3. In this case, part of the composition for an organic electroluminescent device according to the present invention interacts with the electron-accepting compound to thereby constitute a layer having excellent hole injection ability.

Hole-Transporting Compound

The hole-transporting compound is preferably a compound having an ionization potential between those of the anode 2 and the organic light emitting layer 4. More specifically, the hole-transporting compound is preferably a compound having an ionization potential of 4.5 eV to 6.0 eV.

Examples thereof include aromatic amine compounds, phthalocyanine derivatives or porphyrin derivatives, oligothiophene derivatives, and polythiophene derivatives, of which aromatic amine compounds are preferred for their non-crystallinity and transmittance to visible rays.

Of aromatic amine compounds, aromatic tertiary amine compounds are more preferred. The "aromatic tertiary amine compounds" herein refer to compounds having aromatic tertiary amine structures and also include compounds each having a group derived from an aromatic tertiary amine.

While types of such aromatic tertiary amine compounds are not specifically limited, more preferred are polymeric compounds (polymerized organic compounds having sequential repeating units) each having a weight-average molecular weight of 1000 or more and 1000000 or less, from the point of effectively smoothing the surface of the layer.

Preferred examples of such polymeric aromatic tertiary amine compounds include polymeric compounds each having a repeating unit represented by following General Formula (6):

[Chemical Formula 29]

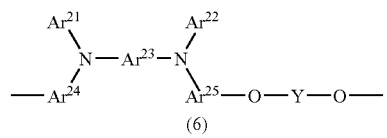

(6)

In General Formula (6), $Ar^{21}$ and $Ar^{22}$ each independently represent an aromatic hydrocarbon group which may have a substituent, or an aromatic heterocyclic group which may have a substituent; $Ar^{23}$ to $Ar^{25}$ each independently represent a bivalent aromatic hydrocarbon group which may have a substituent, or a bivalent aromatic heterocyclic group which may have a substituent; and Y represents a linkage group selected from the following Group Y1 of linkage groups, where two groups of $Ar^{21}$ to $Ar^{25}$ bound to the same nitrogen atom may be combined to form a ring.

[Chemical Formula 30]

Group Y1 of linkage groups:

連結基群 Y1

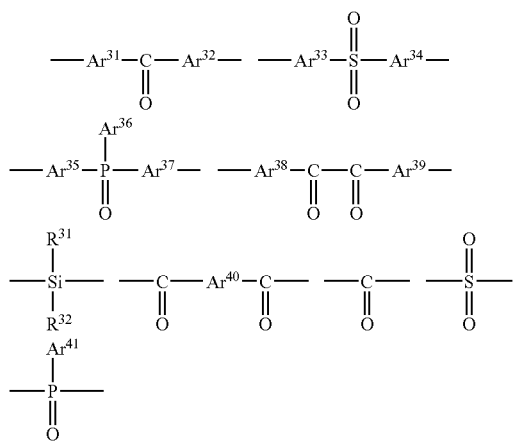

In the above formulae, $Ar^{31}$ to $Ar^{41}$ each independently represent a monovalent or bivalent group which may have a substituent and is derived from an aromatic hydrocarbon ring or an aromatic heterocyclic ring; and $R^{31}$ and $R^{32}$ each independently represent hydrogen atom or any substituent.

The groups $Ar^{21}$ to $Ar^{25}$ and $Ar^{31}$ to $Ar^{41}$ can each be a monovalent or bivalent group derived from any aromatic hydrocarbon ring or any aromatic heterocyclic ring. These may be different from or the same with one another. They may each have any substituent.

Examples of such aromatic hydrocarbon rings include five- or six-membered monocyclic rings, or bicyclic, tricyclic, tetracyclic, or pentacyclic condensed rings containing such five- or six-membered rings. Specific examples thereof include benzene ring, naphthalene ring, anthracene ring, phenanthrene ring, perylene ring, tetracene ring, pyrene ring, benzopyrene ring, chrysene ring, triphenylene ring, acenaphthene ring, fluoranthene ring, and fluorene ring.

Examples of aromatic heterocyclic rings include five- or six-membered monocyclic rings, or bicyclic, tricyclic, or tetracyclic condensed rings containing such five- or six-membered rings. Specific examples thereof include furan ring, benzofuran ring, thiophene ring, benzothiophene ring, pyrrole ring, pyrazole ring, imidazole ring, oxadiazole ring, indole ring, carbazole ring, pyrroloimidazole ring, pyrrolopyrazole ring, pyrrolopyrrole ring, thienopyrrole ring, thienothiophene ring, furopyrrole ring, furofuran ring, thienofuran ring, benzisoxazole ring, benzisothiazole ring, benzimidazole ring, pyridine ring, pyrazine ring, pyridazine ring, pyrimidine ring, triazine ring, quinoline ring, isoquinoline ring, cinnoline ring, quinoxaline ring, phenanthridine ring, benzimidazole ring, perimidine ring, quinazoline ring, quinazolinone ring, and azulene ring.

The groups $Ar^{23}$ to $Ar^{25}$, $Ar^{31}$ to $Ar^{35}$ and $Ar^{37}$ to $Ar^{40}$ can also be groups each containing two or more groups combined with each other, the groups being selected from one or more of bivalent groups derived from the above-illustrated aromatic hydrocarbon rings and/or aromatic heterocyclic rings.

The groups as $Ar^{21}$ to $Ar^{41}$ derived from aromatic hydrocarbon rings and/or aromatic heterocyclic rings may each further have a substituent. The molecular weight of the substituent is generally about 400 or less, and is preferably about 250 or less. The substituent is not specifically limited in its type and can be, for example, one or more substituents selected from following Group W of Substituents.

[Group W of Substituents]

Group W of Substituents includes methyl group, ethyl group, and other alkyl groups generally having one or more carbon atoms, and generally ten or less, and preferably eight or less carbon atoms; vinyl group and other alkenyl groups generally having two or more carbon atoms, and generally having eleven or less, and preferably five or less carbon atoms; ethynyl group and other alkynyl groups generally having two or more carbon atoms, and generally having eleven or less, and preferably five or less carbon atoms; methoxy group, ethoxy group, and other alkoxy groups generally having one or more carbon atoms, and generally having ten or less, and preferably six or less carbon atoms; phenoxy group, naphthoxy group, pyridyloxy group, and other aryloxy groups generally having four or more, and preferably five or more carbon atoms, and generally having twenty-five or less, and preferably fourteen or less carbon atoms; methoxycarbonyl group, ethoxycarbonyl group, and other alkoxycarbonyl groups generally having two or more carbon atoms, and generally having eleven or less, and preferably seven or less carbon atoms; dimethylamino group, diethylamino group, and other dialkylamino groups generally having two or more carbon atoms, and generally having twenty or less, and preferably twelve or less carbon atoms; diphenylamino group, ditolylamino group, N-carbazolyl group, and other diarylamino groups generally having ten or more, preferably twelve or more carbon atoms, and generally having thirty or less, and preferably twenty-two or less carbon atoms; phenylmethylamino group and other arylalkylamino groups generally having six or more, preferably seven or more carbon atoms, and generally having twenty-five or less, and preferably seventeen or less carbon atoms; acetyl group, benzoyl group, and other acyl groups generally having two or more carbon atoms, and generally having ten or less, and preferably seven or less carbon atoms; fluorine atom, chlorine atom, and other halogen atoms; trifluoromethyl group and other haloalkyl groups generally having one or more carbon atoms, and generally having eight or less, and preferably four or less carbon atoms; methylthio group, ethylthio group, and other alkylthio groups generally having one or more carbon atoms, and generally having ten or less, and preferably six or less carbon atoms; phenylthio group, naphthylthio group, pyridylthio group, and other arylthio groups generally having four or more, preferably five or more carbon atoms, and generally having twenty-five or less, and preferably fourteen or less carbon atoms; trimethylsilyl group, triphenylsilyl group, and other silyl groups generally having two or more, preferably three or more carbon atoms, and generally having thirty-three or less, and preferably twenty-six or less carbon atoms; trimethylsiloxy group, triphenylsiloxy group, and other siloxy groups generally having two or more, preferably three or more carbon atoms, and generally having thirty-three or less, and preferably twenty-six or less carbon atoms; cyano group; phenyl group, naphthyl group, and other aromatic hydrocarbon cyclic groups generally having six or more carbon atoms, and generally having thirty or less, and preferably eighteen or less carbon atoms; and thienyl group, pyridyl group, and other aromatic heterocyclic groups generally having three or more, preferably four or more carbon atoms, and generally having twenty-eight or less, and preferably seventeen or less carbon atoms.

Preferred as the groups $Ar^{21}$ and $Ar^{22}$ are monovalent groups derived from benzene ring, naphthalene ring, phenanthrene ring, thiophene ring, and pyridine ring, of which monovalent groups derived from phenyl group and naphthyl group are more preferred, from the points of the solubility, heat resistance, and hole injection/transporting ability of the polymeric compounds.

Preferred as the groups $Ar^{23}$ to $Ar^{25}$ are bivalent groups derived from benzene ring, naphthalene ring, anthracene ring, and phenanthrene ring, of which bivalent groups derived from phenylene group, biphenylene group, and naphthylene group are more preferred, from the points of the heat resistance and the hole injection/transporting ability including oxidation/reduction potentials.

The groups $R^3$ and $R^{32}$ may be the same as or different from each other and can each be hydrogen atom or any substituent. The substituents herein are not specifically limited in their types, and applicable substituents include alkyl groups, alkenyl groups, alkynyl groups, alkoxy groups, silyl groups, siloxy groups, aromatic hydrocarbon groups, aromatic heterocyclic groups, and halogen atoms. Specific examples thereof include the groups as listed in Group W of Substituents.

Specific examples and preferred examples of polymeric aromatic tertiary amine compounds each having a repeating unit represented by General Formula (6) include, but are not limited to, those described in PCT International Publication Number WO 2005/089024.

Preferred examples of polymeric aromatic tertiary amine compounds further include polymeric compounds containing repeating units represented by following General Formula (7) and/or (8):

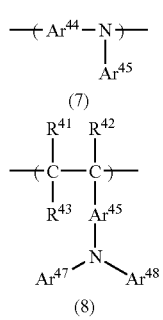

[Chemical Formula 31]

(7)

(8)

In General Formulae (7) and (8), $Ar^{45}$, $Ar^{47}$ and $Ar^{48}$ each independently represent an aromatic hydrocarbon group which may have a substituent, or an aromatic heterocyclic group which may have a substituent; $Ar^{44}$ and $Ar^{46}$ each independently represent a bivalent aromatic hydrocarbon group which may have a substituent, or a bivalent aromatic heterocyclic group which may have a substituent, wherein two groups of $Ar^{45}$ to $Ar^{48}$ bound to the same nitrogen atom may be combined to form a ring; and $R^{41}$ to $R^{43}$ each independently represent hydrogen atom or any substituent.

Specific examples, preferred examples, examples of substituents which they may have, and examples of preferred substituents of $Ar^{45}$, $Ar^{47}$, and $Ar^{48}$, and $Ar^{44}$ and $Ar^{46}$ are as with those of $Ar^{21}$ and $Ar^{22}$, and $Ar^{23}$ to $Ar^{25}$, respectively. The groups $R^{41}$ to $R^{43}$ are preferably hydrogen atoms or substituents listed in [Group W of Substituents], of which hydrogen atoms, alkyl groups, alkoxy groups, amino groups, aromatic hydrocarbon groups, and aromatic hydrocarbon groups are more preferred.

Specific examples and preferred examples of polymeric aromatic tertiary amine compounds each containing repeating units represented by General Formula (7) and/or (8) include, but are not limited to, those described in PCT International Publication Number WO 2005/089024.

When the hole injection layer is formed through wet film-formation, a hole-transporting compound that is highly soluble in various solvents is preferably used. From this viewpoint, preferred examples of aromatic tertiary amine compounds include binaphthyl compounds represented by following General Formula (9) (Japanese Unexamined Patent Application Publication No. 2004-014187) and unsymmetrical 1,4-phenylenediamine compounds represented by following General Formula (10) (Japanese Unexamined Patent Application Publication No. 2004-026732). The material for use herein can also be selected as a compound that is highly soluble in various solvents, from among compounds used as materials for forming thin films having hole injection/transporting ability in known organic electroluminescent devices.

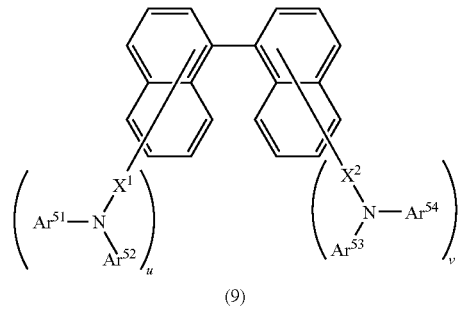

[Chemical Formula 32]

(9)

In General Formula (9), $Ar^{51}$ to $Ar^{54}$ each independently represent an aromatic hydrocarbon group which may have a substituent, or an aromatic heterocyclic group which may have a substituent; two groups of $Ar^{51}$ to $Ar^{54}$ bound to the same nitrogen atom may be combined to form a ring; $X^1$ and $X^2$ each independently represent a direct bond or a bivalent linkage group; "u" and "v" each independently represent an integer of 0 or more and 4 or less, wherein "u" and "v" satisfy the condition: u+v≥1, and wherein the naphthalene rings in General Formula (9) may each have a substituent, in addition to $-X^1NAr^{51}Ar^{52}$ and $-X^2NAr^{53}Ar^{54}$.

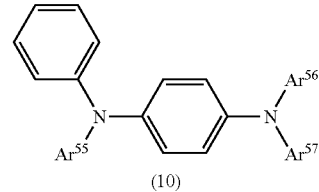

[Chemical Formula 33]

(10)

In General Formula (10), $Ar^{55}$, $Ar^{56}$, and $Ar^{57}$ each independently represent an aromatic hydrocarbon group which may have a substituent, or an aromatic heterocyclic group which may have a substituent, and each of these has a total of ten or more carbon atoms, in which $Ar^{25}$ and $Ar^{57}$ bound to the same nitrogen atom may be combined to form a ring.

Specific examples, preferred examples, examples of substituents which they may have, and examples of preferred substituents of $Ar^{51}$ to $Ar^{57}$ are as with those of $Ar^{21}$ and $Ar^{22}$, respectively. The groups $Ar^{51}$ and $Ar^{53}$ are typically preferably aromatic hydrocarbon groups having a diarylamino group substituted at the para-position, such as 4-(diphenylamino)phenyl group.

The numbers "u" and "v" are preferably both 1.

$X^1$ and $X^2$ are each preferably a direct bond or a bivalent linkage group derived from an aromatic hydrocarbon ring and are most preferably both direct bonds.

The naphthalene rings in General Formula (9) may each have any substituent, in addition to —$X^1NAr^{51}Ar^{52}$ and —$X^2NAr^{53}Ar^{54}$. The substituents —$X^1NAr^{51}Ar^{52}$ and —$X^2NAr^{53}Ar^{54}$ may be substituted at any positions of the naphthalene rings but are preferably substituted at the 4- and 4'-positions of the naphthalene rings in binaphthyl compounds represented by General Formula (9).

The binaphthylene structures in compounds represented by General Formula (9) preferably have substituents at the 2- and/or 2'-position. Examples of such substituents at the 2- and/or 2'-position include alkyl groups, alkoxy groups, alkenyl groups, and alkoxycarbonyl groups, each of which may have a substituent.

The binaphthylene structures in compounds represented by General Formula (9) may have any substituents in addition to those at the 2- and 2'-positions. Examples of the substituents include the groups listed as the substituents at the 2- and 2'-positions. Compounds represented by General Formula (9) are supposed to have high solubility, because the two naphthalene rings are distorted with respect to each other. The compounds, if having substituents at the 2- and 2'-positions, are supposed to have further higher solubility, because the two naphthalene rings are further distorted with respected to each other.

The compounds represented by General Formula (10) are supposed to have high solubility in solvents, because they do not have symmetry of C2 or higher. Unsymmetrical diamine compounds represented by following General Formula (11) are also preferred, because they are supposed to be highly soluble in various solvents for the same reason as above.

[Chemical Formula 34]

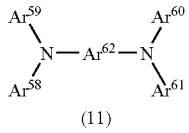

(11)

In General Formula (11), $Ar^{58}$ to $Ar^{61}$ each independently represent an aromatic hydrocarbon group which may have a substituent, or an aromatic heterocyclic group which may have a substituent; $Ar^{62}$ represents a bivalent aromatic hydrocarbon group which may have a substituent, or a bivalent aromatic heterocyclic group which may have a substituent, wherein two of $Ar^{58}$ to $Ar^{61}$ bound to the same nitrogen atom may be combined to form a ring, and wherein $Ar^{58}$ is a group different from any of $Ar^{59}$ to $Ar^{61}$.

Specific examples, preferred examples, examples of substituents which they may have, and examples of preferred substituents of $Ar^{58}$ to $Ar^{61}$ are as with those of $Ar^{21}$ and $Ar^{22}$. Specific examples, preferred examples, examples of substituents which they may have, and examples of preferred substituents of $Ar^{62}$ are as with those of $Ar^{23}$ to $Ar^{25}$.

The molecular weights of the compounds represented by General Formulae (9), (10), and (11) are each generally less than 5000, preferably less than 2500 and are generally 200 or more, preferably 400 or more.

Specific examples and preferred examples of the compounds represented by General Formulae (9), (10) and (11) include, but are not limited to, those described in Japanese Patent Application No. 2005-21983.

Such aromatic amine compounds usable as the hole-transporting compound in the hole injection layer further include known compounds used as materials for forming layers having hole injection/transporting ability in organic electroluminescent devices. Examples thereof include aromatic diamine compounds each including a series of aromatic tertiary amine units, such as 1,1-bis(4-di-p-tolylaminophenyl)cyclohexane (Japanese Unexamined Patent Application Publication No. 59-194393); aromatic amine compounds containing two or more tertiary amines and having two or more condensed aromatic rings substituted on nitrogen atom, typified by 4,4'-bis[N-(1-naphthyl)-N-phenylamino]biphenyl (Japanese Unexamined Patent Application Publication No. 5-234681); aromatic triamine compounds as triphenylbenzene derivatives having a starburst structure (U.S. Pat. No. 4,923,774); aromatic diamine compounds such as N,N'-diphenyl-N,N'-bis(3-methylphenyl)biphenyl-4,4'-diamine (U.S. Pat. No. 4,764,625); α,α,α',α'-tetramethyl-α,α'-bis(4-di(p-tolyl)aminophenyl)-p-xylene (Japanese Unexamined Patent Application Publication No. 3-269084); triphenylamine derivatives which are three-dimensionally unsymmetrical as the whole molecules (Japanese Unexamined Patent Application Publication No. 4-129271); compounds each containing a pyrenyl group substituted with two or more aromatic diamino groups (Japanese Unexamined Patent Application Publication No. 4-175395); aromatic diamine compounds each containing tertiary aromatic amine units combined with each other through ethylene group (Japanese Unexamined Patent Application Publication No. 4-264189); aromatic diamines having styryl structures (Japanese Unexamined Patent Application Publication No. 4-290851); compounds each containing aromatic tertiary amine units combined with each other through thiophene group (Japanese Unexamined Patent Application Publication No. 4-304466); star-burst aromatic triamine compounds (Japanese Unexamined Patent Application Publication No. 4-308688); benzylphenyl compounds (Japanese Unexamined Patent Application Publication No. 4-364153); compounds each containing tertiary amines combined with each other through fluorene group (Japanese Unexamined Patent Application Publication No. 5-25473); triamine compounds (Japanese Unexamined Patent Application Publication No. 5-239455); bisdipyridylaminobiphenyl (Japanese Unexamined Patent Application Publication No. 5-320634); N,N,N-triphenylamine derivatives (Japanese Unexamined Patent Application Publication No. 6-1972); aromatic diamines having phenoxazine structures (Japanese Unexamined Patent Application Publication No. 7-138562); diaminophenylphenanthridine derivatives (Japanese Unexamined Patent Application Publication No. 7-252474); hydrazone compounds (Japanese Unexamined Patent Application Publication No. 2-311591); silazane compounds (U.S. Pat. No. 4,950,950); silanamine derivatives (Japanese Unexamined Patent Application Publication No. 6-49079); phosphamine derivatives (Japanese Unexamined Patent Application Publication No. 6-25659); and quinacridone compounds. Where necessary, each of these aromatic amine compounds may be used in combination.

Preferred examples of phthalocyanine derivatives or porphyrin derivatives usable as the hole-transporting compound in the hole injection layer include porphyrin, 5,10,15,20-tetraphenyl-21H,23H-porphyrin, 5,10,15,20-tetraphenyl-21H,23H-porphyrin cobalt(II), 5,10,15,20-tetraphenyl-21H,23H-porphyrin copper(II), 5,10,15,20-tetraphenyl-21H,23H-porphyrin zinc(II), 5,10,15,20-tetraphenyl-21H,23H-porphyrin vanadium(IV) oxide, 5,10,15,20-tetra(4-pyridyl)-21H,23H-porphyrin, copper(II) 29H,31H-phthalocyanine, zinc(II) phthalocyanine, titanium phthalocyanine, magnesium phthalocyanine oxide, lead phthalocyanine, copper(II) phthalocyanine, and 4,4',4'',4'''-tetraaza-29H,31H-phthalocyanine.

Preferred examples of oligothiophene derivatives usable as the hole-transporting compound in the hole injection layer include α-terthiophene and derivatives thereof, α-sexithiophene and derivatives thereof, and oligothiophene derivatives each containing naphthalene ring (Japanese Unexamined Patent Application Publication No. 6-256341).

Preferred examples of polythiophene derivatives usable as the hole-transporting compound in the present invention include poly(3,4-ethylenedioxythiophene)s (PEDOT) and poly(3-hexylthiophene)s.

The molecular weights of these hole-transporting compounds, except for polymeric compounds (polymerized compounds having a series of repeating units), are each generally 9000 or less, preferably 5000 or less, and are generally 200 or more, and preferably 400 or more. A hole-transporting compound having an excessively high molecular weight may be difficult to synthesize and purify. In contrast, a hole-transporting compound having an excessively low molecular weight may have poor heat resistance.

The material for the hole injection layer may contain each of such hole-transporting compounds alone or in combination. When the material contains two or more different hole-transporting compounds, one or more polymeric aromatic tertiary amine compounds and one or more other hole-transporting compounds are preferably used in combination.

Electron-Accepting Compound

Preferred as the electron-accepting compound are compounds having oxidizing power and capability of accepting one electron from the hole-transporting compound. More specifically, compounds having an electron affinity of 4 eV or more are preferred, of which compounds having an electron affinity of 5 eV or more are more preferred.

Examples of such compounds include onium salts substituted with organic group(s), such as 4-isopropyl-4'-methyldiphenyliodonium tetrakis(pentafluorophenyl)borate; high-valence inorganic compounds such as iron(III) chloride (Japanese Unexamined Patent Application Publication No. 11-251067) and ammonium peroxodisulfate; cyano compounds such as tetracyanoethylene; aromatic boron compounds such as tris(pentafluorophenyl)borane (Japanese Unexamined Patent Application Publication No. 2003-31365); fullerene derivatives; and iodine.

Of these compounds, onium salts substituted with organic group(s), and high-valence inorganic compounds are preferred for their high oxidizing power, and onium salts substituted with organic group(s), cyano compounds, and aromatic boron compounds are preferred for their solubility in various solvents and applicability to wet coating.

Specific examples and preferred examples of such onium salts substituted with organic group(s), cyano compounds, and aromatic boron compounds as preferred electron-accepting compounds include, but are not limited to, those described in PCT International Publication Number WO 2005/089024.

Cation Radical Compound

The "cation radical compound" refers to an ion compound containing a cation radical and a counter anion, in which the cation radical is a chemical species corresponding to a hole-transporting compound except for removing one electron therefrom. However, when the cation radical is derived from a hole-transporting polymeric compound, the cation radical has a structure corresponding to the polymeric compound, except for removing one electron from its repeating unit.

The cation radical is preferably a chemical species corresponding to one of the above-listed hole-transporting compounds, except for removing one electron therefrom, and is more preferably one of the above-listed preferred hole-transporting compounds, except for removing one electron therefrom. This is because these cation radicals provide further satisfactory non-crystallinity, transmittance to visible light, heat resistance, and solubility.

Such a cation radical compound can be formed by mixing the hole-transporting compound and the electron-accepting compound. Specifically, by mixing the hole-transporting compound and the electron-accepting compound, an electron travels from the hole-transporting compound to the electron-accepting compound to thereby yield a cation radical compound containing a cation radical of the hole-transporting compound, and a counter anion.

Cation radical compounds derived from polymeric compounds, such as poly(ethylene dioxythiophene) doped with polystyrene sulfonic acid (PEDOT/PSS) (Adv. Mater., 2000, vol. 12, p. 481) and emeraldine hydrochloride (J. Phys. Chem., 1990, vol. 94, p. 7716) can also be formed through oxidative polymerization (dehydrogenative polymerization). Namely, they can be formed by chemically or electrochemically oxidizing one or more monomers typically with a peroxodisulfate in an acidic solution. In the oxidative polymerization (dehydrogenative polymerization), the monomer is polymerized and a cation radical corresponding to the polymer, except for removing one electron from its repeating unit, is formed as a result of oxidation. An anion derived from the acidic solution serves as a counter anion with respect to the cation radical.

The hole injection layer 3 is formed on or above the anode 2 through wet film-formation or vacuum deposition.

Indium thin oxide (ITO) generally used as the anode 2 has a surface roughness (Ra) of about 10 nm, often has local projections, and is thereby liable to cause bridging faults. The hole injection layer 3 is advantageously formed on or above the anode 2 through wet film-formation rather than vacuum deposition, so as to reduce defects of the device caused by the unevenness of the anode surface.

When the hole injection layer 3 is formed through wet film-formation, the layer may be formed by dissolving predetermined amounts of one or more of the respective materials including the hole-transporting compounds, the electron-accepting compounds, and the cation radical compounds, and where necessary a coatability improver and a binder resin that does not act as a charge trap, in a solvent to yield a coating solution, applying the coating solution to the anode through wet film-formation, and drying the applied film. Examples of processes for the wet film-formation include spin coating, spray coating, dip coating, die coating, flexographic printing, screen printing, and an ink-jet process.

Solvents for use in the formation of the layer through wet film-formation are not specifically limited in their types, as long as they are solvents that can dissolve the respective materials including the hole-transporting compounds, the electron-accepting compounds, and the cation radical compounds therein. They preferably contain neither deactivating substances nor substances forming such deactivating substances. The deactivating substances herein are substances that may deactivate the respective materials for the hole injection layer, including the hole-transporting compounds, the electron-accepting compounds, and the cation radical compounds.

Examples of preferred solvents satisfying these conditions include ether solvents and ester solvents. Specific examples of ether solvents include aliphatic ethers such as ethylene glycol dimethyl ether, ethylene glycol diethyl ether, and propylene glycol-1-monomethyl ether acetate (PGMEA); and aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole, and 2,4-dimethylanisole. Specific examples of ester solvents include aliphatic esters such as ethyl acetate, n-butyl acetate, ethyl lactate, and n-butyl lactate; and aromatic esters such as phenyl acetate, phenyl propionate, methyl benzoate, ethyl benzoate, propyl benzoate, and n-butyl benzoate. Each of these can be used alone or used in any combinations and proportions.

In addition to the ether solvents and ester solvents, solvents usable herein also include aromatic hydrocarbon solvents such as benzene, toluene, and xylenes; amide solvents such as N,N-dimethylformamide and N,N-dimethylacetamide; and dimethyl sulfoxide. Each of these can be used alone or used in any combinations and proportions. It is acceptable to use one or more of these solvents in combination with one or more of the ether solvents and ester solvents. In particular, aromatic hydrocarbon solvents, such as benzene, toluene, and xylenes, are preferably used in combination with one or more of the ether solvents and ester solvents, because they have low capability of dissolving electron-accepting compounds and cation radical compounds.

Solvents containing deactivating substances that may deactivate the respective materials for the hole injection layer including the hole-transporting compounds, the electron-accepting compounds, and the cation radical compounds, or solvents containing substances forming such deactivating substances include aldehyde solvents such as benzaldehyde; and ketone solvents having hydrogen atom at the alpha position, such as methylethyl ketone, cyclohexanone, and acetophenone. These aldehyde solvents and ketone solvents are undesirable, because they may cause condensation reaction between solvent molecules or may react with the respective materials including the hole-transporting compounds, electron-accepting compounds, and cation radical compounds to yield impurities.

The concentration of the solvent in the coating solution is generally 10 percent by weight or more, preferably 30 percent by weight or more, more preferably 50 percent by weight or more, and is generally 99.999 percent by weight or less, preferably 99.99 percent by weight or less, and further preferably 99.9 percent by weight or less. When two or more different solvents are used as the solvent, the total concentration of these solvents may be set within this range.

When the hole injection layer is formed through vacuum deposition, the layer may be formed in the following manner. One of the respective materials including the hole-transporting compounds, the electron-accepting compounds, or the cation radical compounds, when used alone, is placed in a crucible disposed in a vacuum chamber, the vacuum chamber is evacuated using a proper vacuum pump to a pressure of about $10^{-4}$ Pa, the crucible is heated to vaporize the material to thereby form a hole injection layer on the anode on a substrate placed facing the crucible, while controlling the amount of evaporation. When two or more of the materials are used, the above procedure is repeated, except that the materials are placed in different crucibles disposed in a vacuum chamber, respectively, the crucibles are heated respectively, and the amounts of the evaporated materials are controlled independently. When two or more of the materials are used, the hole injection layer can also be formed by placing a mixture of these materials in a crucible, and heating the crucible to evaporate the mixture.

The thickness of the hole injection layer 3 which may be formed in the above manner is generally 5 nm or more, preferably 10 nm or more, and is generally 1000 nm or less, and preferably 500 nm or less.

<Organic Light Emitting Layer>

An organic light emitting layer 4 is arranged on the hole injection layer 3. The organic light emitting layer 4 is a layer formed by using the composition for an organic electroluminescent device according to the present invention containing a luminescent material, a charge transporting material, and a solvent. The organic light emitting layer can mainly emit light when strongly excited in a space between energized electrodes. The excitation is caused by recombination of holes injected from the anode 2 via the hole injection layer 3 with electrons injected from the cathode 6 via the electron injection layer 5. The organic light emitting layer 4 may further contain any other materials and components, within ranges not adversely affecting the performance obtained according to the present invention. A device according to the present invention is preferably prepared using a method including the step of forming the organic light emitting layer through wet film-formation using the composition. The wet film-formation herein is as described in the thin film for an organic electroluminescent device according to the present invention.

Provided that the same material is used, an organic electroluminescent device generally operates at a decreasing drive voltage with a decreasing thickness of a layer between the electrodes, because the effective electric field increases and thereby the injected current increases with a decreasing thickness. Accordingly, the organic electroluminescent device operates at a decreasing drive voltage with a decreasing thickness of layers between the electrodes. The total thickness of the layers, however, should be a certain level or more, because an excessively small total thickness may cause short circuit due to projections typically caused by the electrodes made typically of ITO.

When a device according to the present invention further includes a hole injection layer and an electron injection layer in addition to the organic light emitting layer, the total thickness of the organic light emitting layer 4 and other organic layers such as the hole injection layer 3 and the electron injection layer 5 is generally 30 nm or more, preferably 50 nm or more, and further preferably 100 nm or more, and is generally 1000 nm or less, preferably 500 nm or less, and further preferably 300 nm or less. When the hole injection layer 3 and/or the electron injection layer 5 other than the organic light emitting layer 4 has a high electroconductivity, the amount of charges to be injected to the organic light emitting layer 4 increases. In this case, the drive voltage can be reduced while maintaining the total thickness to a certain level by increasing the thickness of, for example, the hole injection layer 3 and decreasing the thickness of the organic light emitting layer 4.

Accordingly, the thickness of the organic light emitting layer 4 in this case is generally 10 nm or more, preferably 20 nm or more, and is generally 300 nm or less, and preferably 200 nm or less. When a device according to the present invention includes the organic light emitting layer alone between the anode and the cathode, the thickness of the organic light emitting layer 4 is generally 30 nm or more, preferably 50 nm or more, and is generally 500 nm or less, preferably 300 nm or less.

A thin film as the organic light emitting layer 4 is formed according to the wet film-formation process described in the thin film for an organic electroluminescent device according to the present invention.

<Electron Injection Layer>

The electron injection layer 5 functions to inject electrons injected from the cathode 6 into the organic light emitting layer 4 efficiently. To conduct electron injection efficiently, materials for constituting the electron injection layer 5 are preferably metals having low work functions, including alkali metals such as sodium and cesium; and alkaline earth metals such as barium and calcium. The thickness of this layer is preferably 0.1 to 5 nm.

Further, in order to improve efficiency of the device, it is also an effective technique to arrange an extremely thin insulating film typically of LiF, $MgF_2$, or $Li_2O$ at the interface between the cathode 6 and the light-emitting layer 4 or the after-mentioned electron transport layer 8 (Appl. Phys. Lett., vol. 70, p. 152, 1997; Japanese Unexamined Patent Application Publication No. 10-74586; IEEE Trans. Electron. Devices, vol. 44, p. 1245, 1997; and SID 04 Digest, p. 154).

It is preferred to dope an organic electron transporting material with an alkali metal such as sodium, potassium, cesium, lithium, or rubidium (described typically in Japanese Unexamined Patent Application Publications No. 10-270171, No. 2002-100478, and No. 2002-100482), because this serves to improve the electron injection/transporting ability and to provide excellent film quality. The organic electron transporting material is typified by nitrogen-containing heterocyclic compounds such as bathophenanthroline; and metal complexes such as aluminum 8-hydroxyquinoline complex. The thickness of this layer is generally 5 nm or more, preferably 10 nm or more, and is generally 200 nm or less, and preferably 100 nm or less.

The electron injection layer 5 may be formed by forming a film on the organic light emitting layer 4 by a coating process as in the organic light emitting layer 4 or by vacuum deposition. When vacuum deposition is employed, the electron injection layer may be formed by placing an evaporation source in a crucible or metal boat disposed in a vacuum chamber, evacuating the vacuum chamber to a pressure of about $10^{-4}$ Pa using a proper vacuum pump, heating the crucible or metal boat to evaporate the evaporation source, and thereby forming a film as the electron injection layer on a substrate placed facing the crucible or metal boat.

The evaporation of the alkaline metal is usually carried out using an alkaline metal dispenser containing an alkaline metal salt of chromic acid and a reducing agent packed in a Ni—Cr alloy (nichrome). By heating this dispenser in a vacuum chamber, the alkaline metal salt of chromic acid is reduced so that the alkaline metal is evaporated. When an organic electron transporting material and an alkali metal are co-evaporated, the organic electron transporting material is put in a crucible placed in the vacuum chamber. The vacuum chamber is then evacuated to a pressure of about $10^{-4}$ Torr by a proper vacuum pump. The crucible and the dispenser are then simultaneously heated to evaporate the materials so that an electron injection/transport layer is formed on a substrate disposed facing the crucible and the dispenser.

In this case, the materials are co-deposited homogenously in a thickness direction of the electron injection layer. However, there may be distribution in concentrations of the materials in a thickness direction.

<Cathode>

The cathode 6 serves to inject electrons into the organic light emitting layer 4, or a layer arranged between the cathode and the organic light emitting layer, such as the electron injection layer 5. As materials for the cathode 6, those materials which are used for the anode 2 may be employed but, in order to inject electrons highly efficiently, metals having low work functions are preferred. Thus, suitable metals such as tin, magnesium, indium, calcium, aluminum and silver or alloys thereof are used. Specific examples of the cathode include electrodes of alloys having a low work function, such as a magnesium-silver alloy, a magnesium-indium alloy and a aluminum-lithium alloy. The thickness of the cathode 6 is generally as with that of the anode 2. A metal layer having a high work function and stable in the atmosphere may be arranged on the cathode in order to protect the cathode formed from such a metal having a low work function. This improves the stability of the device. For this purpose, metals such as aluminum, silver, copper, nickel, chromium, gold, and platinum are used.

<Other Constitutive Layers>

While there has been mainly described a device having the layer configuration shown in FIG. 2, an organic electroluminescent device according to the present invention may further include any other layers between the anode 2 and the organic light emitting layer 4 and between the cathode 6 and the organic light emitting layer 4 in addition to the above-illustrated layers, as long as not adversely affecting the performance of the device. Any layer between the cathode 6 and the anode 2, except for the organic light emitting layer 4, may be omitted.

Figure 3:
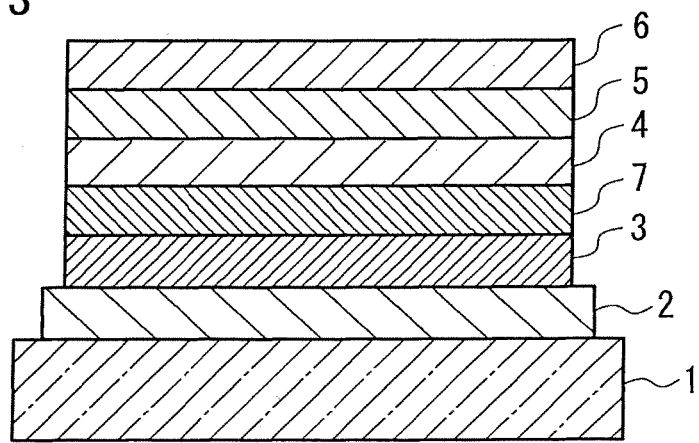
FIG. 3 is a schematic cross-sectional view illustrating another embodiment of the organic electroluminescent device.
Figure 4:
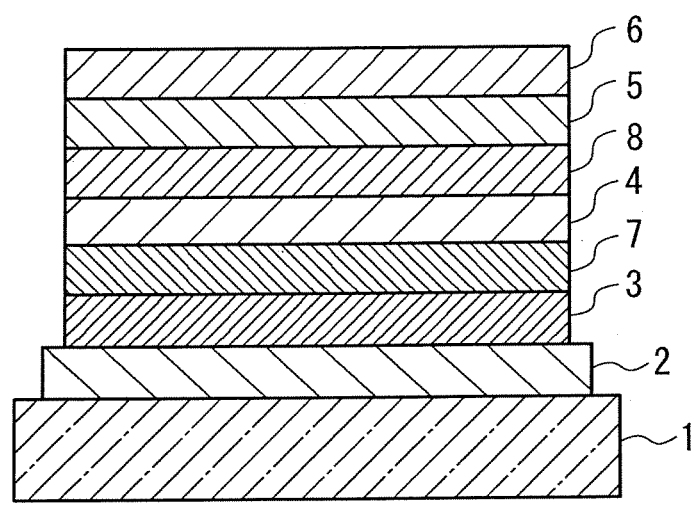
FIG. 4 is a schematic cross-sectional view illustrating yet another embodiment of the organic electroluminescent device.
Figure 5:
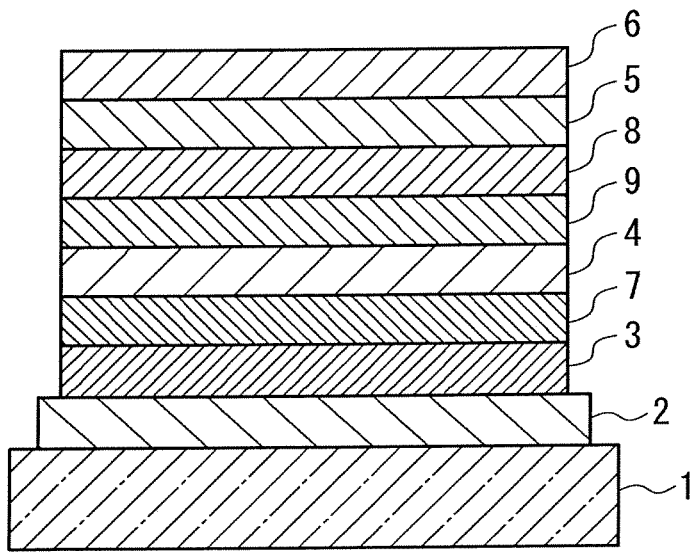
FIG. 5 is a schematic cross-sectional view illustrating another embodiment of the organic electroluminescent device.

An example of the layers which the device may further include is an electron blocking layer 7 arranged between the hole injection layer 3 and the organic light emitting layer 4 (refer to FIGS. 3, 4, and 5). The electron blocking layer 7 serves to block electrons having migrated from the organic light emitting layer 4 from reaching the hole injection layer 3, to thereby increase the recombination probability between electrons and holes in the organic light emitting layer 4, and to confine resulting exitons within the light emitting layer 4. It also serves to transport holes injected from the hole injection layer 3 toward the organic light emitting layer 4 efficiently. This layer is particularly effective when a phosphorescent material or a blue-emitting material is used as a luminescent material. Properties required for the electron blocking layer 7 are high hole transporting ability, a large energy gap (difference between the highest occupied molecular orbital (HOMO) and the lowest unoccupied molecular orbital (LUMO)), and a high excited triplet level (T1). In addition, the electron blocking layer 7 should be applicable to wet film-formation, because the organic light emitting layer 4 in a device according to the present invention is formed through wet film-formation, and the device is thereby easily manufactured. Examples of materials for the electron blocking layer 7 include copolymers of dioctylfluorene and triphenylamine, typified by F8-TFB (described in PCT International Publication Number WO 2004/084260).

The layers which the device may further have also include an electron transport layer 8. The electron transport layer 8 is arranged between the organic light emitting layer 4 and the electron injection layer 5 in order to further improve the luminous efficiency of the device (FIGS. 4,5,6, and 7).

The electron transport layer 8 is formed from a compound which can efficiently transport electrons injected from the cathode 6 toward the organic light emitting layer 4 between the energized electrodes. Electron transporting compounds for use in the electron transport layer 8 must be compounds that efficiently inject electrons from the cathode 6 or the electron injection layer 5 and have high electron mobility to thereby efficiently transport the injected electrons.

Examples of materials satisfying such conditions include metal complexes such as aluminum complex of 8-hydroxyquinoline (Japanese Unexamined Patent Application Publication No. 59-194393); metal complexes of 10-hydroxybenzo[h]quinoline; oxadiazole derivatives; distyrylbiphenyl derivatives; silole derivatives; metal complexes of 3- or 5-hydroxyflavone; metal complexes of benzoxazole; metal complexes of benzothiazole; trisbenzimidazolylbenzene (U.S. Pat. No. 5,645,948); quinoxaline compounds (Japanese Unexamined Patent Application Publication No. 6-207169); phenanthroline derivatives (Japanese Unexamined Patent Application Publication No. 5-331459); 2-t-butyl-9,10-N,N'-dicyanoanthraquinonediimine; n-type hydrogenated amorphous silicon carbide; n-type zinc sulfide; and n-type zinc selenide.

The lower limit of the thickness of the electron transport layer 8 is generally about 1 nm, and preferably about 5 nm, and its upper limit is generally about 300 nm, and preferably about 100 nm.

The electron transport layer 8 may be formed on the organic light emitting layer 4 by coating or vacuum deposition in the same manner as with the hole injection layer 3, but this layer is generally formed by vacuum deposition.

It is also effective to provide a hole blocking layer 9 (refer to FIGS. 5 and 7), for the same purpose as with the electron blocking layer 7. The hole blocking layer 9 is arranged on the organic light emitting layer 4 at an interface of the organic light emitting layer 4 facing the cathode 6. This layer is formed by a compound which serves to prevent holes migrating form the anode 2 from reaching the cathode 6 and can efficiently transport electrons injected from the cathode 6 toward the organic light emitting layer 4. Required properties for the material constituting the hole blocking layer 9 include a high electron mobility and a low hole mobility, a large energy gap (difference between the highest occupied molecular orbital (HOMO) and the lowest unoccupied molecular orbital (LUMO)), and a high excited triplet level (T1). The hole blocking layer 9 has the function of confining holes and electrons within the organic light emitting layer 4 to thereby improve the luminous efficiency.

Examples of materials for the hole blocking layer satisfying these conditions include mixed ligand complexes such as bis(2-methyl-8-quinolinolato)(phenolato)aluminum and bis(2-methyl-8-quinolinolato)(triphenylsilanolato)aluminum; metal complexes such as bis(2-methyl-8-quinolato)aluminum-μ-oxo-bis-(2-methyl-8-quinolylato)aluminum binuclear metal complex; styryl compounds such as distyrylbiphenyl derivatives (Japanese Unexamined Patent Application Publication No. 11-242996); triazole derivatives such as 3-(4-biphenylyl)-4-phenyl-5(4-tert-butylphenyl)-1,2,4-triazole (Japanese Unexamined Patent Application Publication No. 7-41759); and phenanthroline derivatives such as bathocuproine (Japanese Unexamined Patent Application Publication No. 10-79297).

Preferred hole blocking materials further include compounds having at least one pyridine ring substituted on the 2-, 4-, and/or 6-position, represented by following General Formula (12):

[Chemical Formula 35]

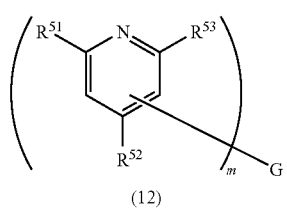

(12)

In General Formula (12), $R^{51}$, $R^{52}$, and $R^{53}$ each independently represent hydrogen atom or any substituent; linkage group G represents a linkage group having a valency of "m", where the linkage group G is directly bound to the pyridine ring at any one of the 2-, 3-, 4-, 5-, and 6-positions; and "m" represents an integer of 1 to 8.

Specific examples of the compounds having at least one pyridine ring substituted at 2-, 4-, and/or 6-position, represented by the structural formula are illustrated below, which, however, are not limitative at all.

[Chemical Formula 36]

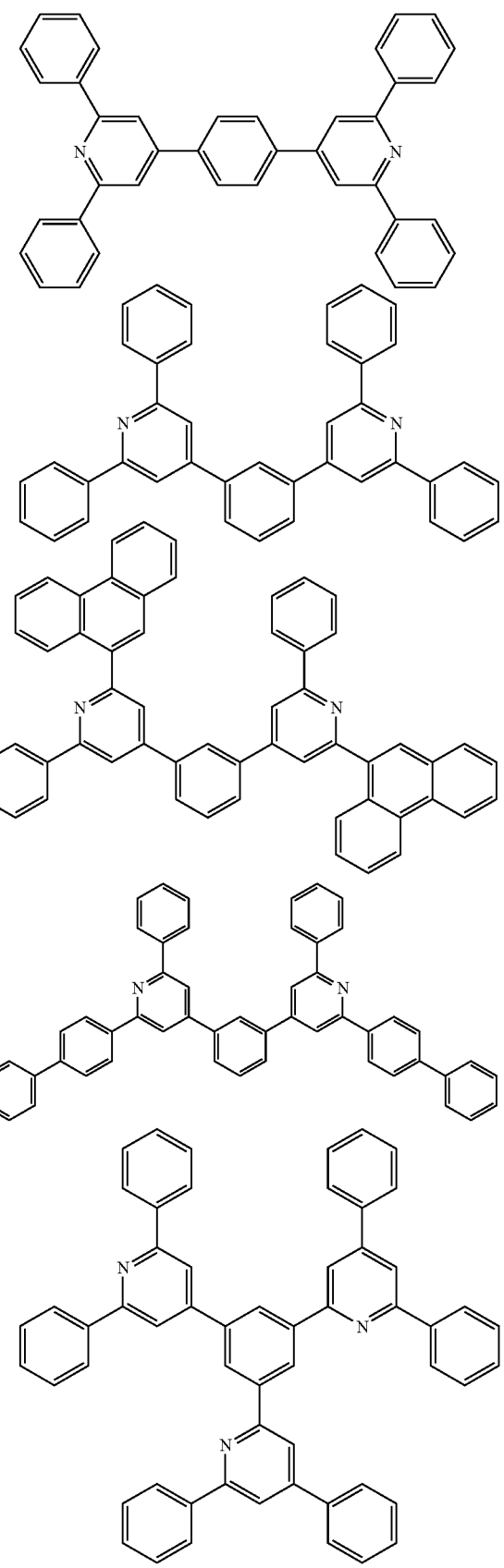

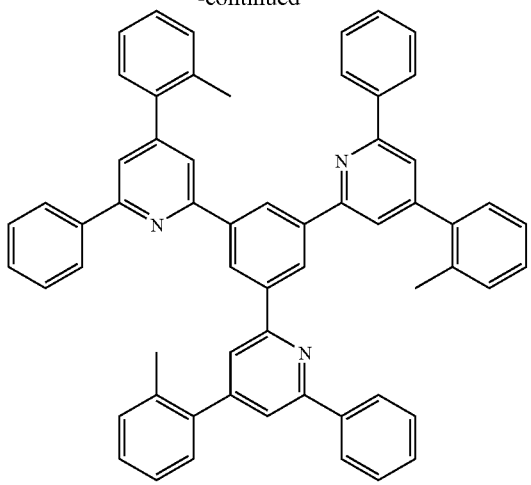

The thickness of the hole blocking layer 9 is generally 0.3 nm or more, preferably 0.5 nm or more, and is generally 100 nm or less, and preferably 50 nm or less. The hole blocking layer 9 can be formed in the same manner as with the hole injection layer 3, but it is generally formed by vacuum deposition.

The electron transport layer 8 and the hole blocking layer 9 may be arranged as appropriate according to necessity. A device may have, for example, 1) the electron transport layer alone, 2) the hole blocking layer alone, 3) a multilayer of the hole blocking layer and the electron transport layer, or 4) none of the two layers.

A reverse layer structure to that in FIG. 2 is also possible. In the reversed structure, on a substrate 1, there are sequentially arranged a cathode 6, an electron injection layer 5, an organic light emitting layer 4, a hole injection layer 3, and an anode 2 in this order. As is described above, an organic electroluminescent device according to the present invention may be arranged between two substrates, at least one of which is highly transparent. Likewise, reverse layer structures to those shown in FIGS. 3 to 7, respectively, are also possible.

It is also possible to employ a layer structure in which a plurality of the layer structures shown in FIGS. 2 to 7 are stacked (a structure including a plurality of the light-emitting units as stacked). In this case, $V_2O_5$, for example, is preferably used as a charge generating layer (CGL) instead of the interface layers (when ITO and aluminum (Al) are used as the anode and the cathode, respectively, the two layers of the anode and the cathode) between the units (light-emitting units). This serves to reduce barrier between the units, thus being more preferred in view of luminous efficiency and drive voltage.

The present invention can be applied to any of structures of organic luminescent devices, such as a structure in which the organic electroluminescent device includes a single device, a structure which includes devices arranged in an array form, and a structure wherein the anode and the cathode are arranged in an X-Y matrix pattern.

An organic electroluminescent device according to the present invention uses a composition for an organic electroluminescent device according to the present invention which contains a luminescent material and a charge transporting material having a specific relationship in oxidation/reduction potentials, and a solvent. The device can thereby be easily manufactured, has a high luminous efficiency, and shows significantly improved drive stability. The device can thereby exhibit excellent performance when applied to large-area display devices or lightning.

EXAMPLES

Next, the present invention will be illustrated in further detail with reference to a measurement example, several examples and comparative examples below, which, however, are not limitative at all, as long as not exceeding the scope and the spirit of the present invention.

Measurement Example 1

Determination of Oxidation/Reduction Potentials of Compounds

The oxidation/reduction potentials of following Compounds T1 to T4 and D4 were determined by cyclic voltammetry.

[Chemical Formula 37]

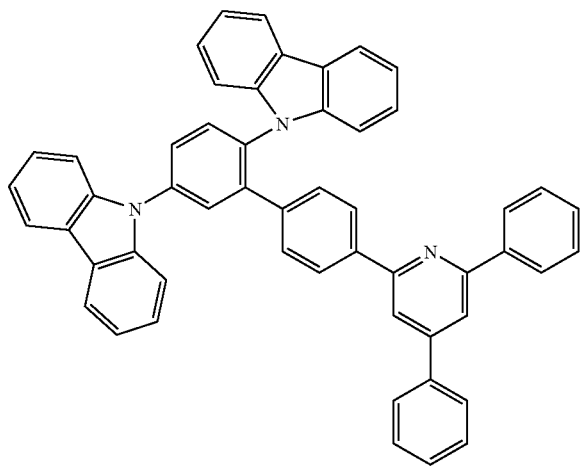

(T1)

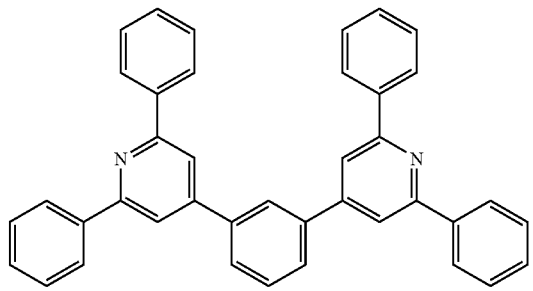

(T2)

-continued

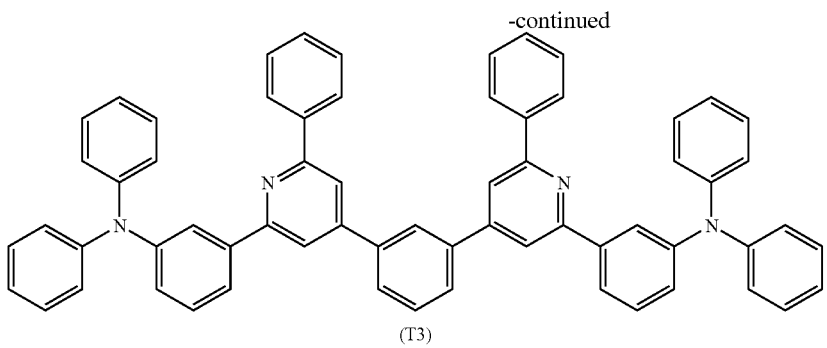
(T3)

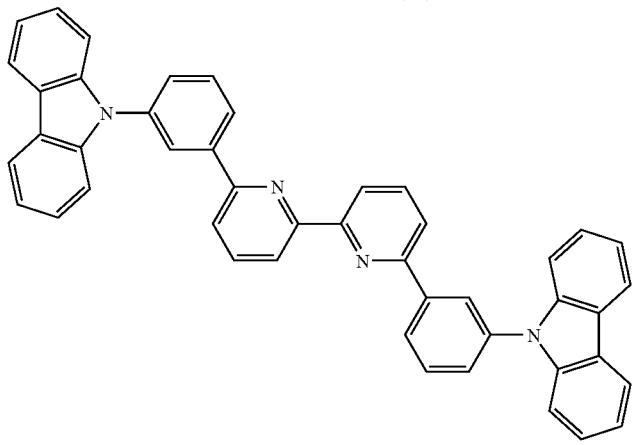
(T4)

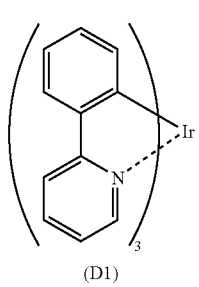
(D1)

A series of sample solutions to be measured was prepared by dissolving tetrabutylammonium perchlorate in each analysis solvent in Table 1 to yield 0.1 mol/L solutions and further dissolving one of the compounds in the solutions to a concentration of 1 mmol/L. The measurement was conducted at a sweep rate of 100 mV/s using glassy carbon (supplied from BAS Inc.) as a working electrode, a platinum wire as a counter electrode, and a silver wire as a reference electrode. The oxidation/reduction potentials were determined by using ferrocene/ferrocenium (Fc/Fc$^+$) as an internal standard and converting the measured potentials of samples into potentials versus a saturated calomel electrode (SCE), provided that the internal standard has a potential of +0.41 V vs. SCE. The determined first oxidation potentials and first reduction potentials of the compounds are shown in Table 1.

TABLE 1

| Compound | Oxidation Potential [V vs. SCE] | Reduction Potential [V vs. SCE] | Analysis Solvent |
| --- | --- | --- | --- |
| T1 | +1.34 | −2.10 | 1:1 by volume (25° C.) mixture of acetonitrile and tetrahydrofuran |
| T2 | +1.76 | −2.03 | Oxidation potential: methylene chloride Reduction potential: acetonitrile |
| T3 | +0.99 | −2.10 | 1:1 by volume (25° C.) mixture of acetonitrile and tetrahydrofuran |
| T4 | +1.29 | −2.05 | N,N-dimethylformamide |
| D1 | +0.72 | −2.30 | 1:1 by volume (25° C.) mixture of acetonitrile and tetrahydrofuran |

Example 1

Device Preparation 1

An indium-tin oxide (ITO) transparent electroconductive film deposited to a thickness of 150 nm on a glass substrate (supplied from Sanyo Vacuum Industries Co., Ltd., sputtered film) was patterned in a 2-mm width stripe pattern using a common photolithography technique and etching with hydrochloric acid-iron chloride solution thereby forming an anode. The patterned ITO substrate was rinsed by sequentially carrying out ultrasonic cleaning in an aqueous surfactant solution and rinsing with pure water, followed by drying in dried nitrogen gas, and UV/ozone cleaning. In addition, a composition for an organic electroluminescent device was prepared by mixing 90 mg of the compound (T1), 90 mg of the compound (T2), and 9 mg of the compound (D1), each represented by the structural formula, and 2.8 g of chlorobenzene as a solvent, and removing insoluble matter by filtration through a PTFE membrane filter having a pore size of 0.2 µm. The composition was applied to the ITO substrate by spin coating under the following conditions to thereby form a uniform thin film having a thickness of 160 nm.

Revolution number of spinner: 1500 rpm

Revolution time of spinner: 30 seconds

Spinning atmosphere: in the atmosphere at a temperature of 23° C. and relative humidity of 30%

Drying condition: drying by heating in an oven at 140° C. for 15 minutes

When Compound D1 has a first reduction potential of $E_{D1}^-$ [V vs. SCE] and a first oxidation potential of $E_{D1}^+$ [V vs. SCE], and Compound T1 has a first reduction potential of $E_{T1}^-$ [V vs. SCE] and a first oxidation potential of $E_{T1}^+$ [V vs. SCE], the first oxidation potentials and first reduction potentials in this composition satisfy the following condition:

$$E_{D1}^-(-2.30)+0.1 < E_{T1}^-(-2.03) < E_{D1}^+(+0.72) < E_{T1}^+(+1.34)-0.1$$

Next, a 2-mm width striped shadow mask as a mask for the vacuum deposition of a cathode was brought into intimate contact with the substrate bearing the coated film perpendicular to the ITO stripe of the anode, and the device was then placed in a vacuum deposition apparatus. After roughly evacuating the apparatus using an oil rotary pump, the apparatus was evacuated to a vacuum degree of $3 \times 10^{-4}$ Pa or less. As a cathode, an alloy electrode of magnesium and silver was deposited in vacuo to a thickness of 110 nm through co-evaporation, in which magnesium and silver were placed in different molybdenum boats and heated simultaneously. The vacuum deposition of magnesium was conducted at a deposition rate of 0.4 to 0.5 nm per second and a degree of vacuum of $5 \times 10^{-4}$ Pa, and the atomic ratio of magnesium to silver was set at 10:1.4. The temperature of the substrate upon vacuum deposition of the cathode was kept to room temperature.

Thus, an organic electroluminescent device having a light-emitting area of 2 mm wide and 2 mm long was prepared.

The light emitting properties of the device are shown in Table 2.

This device emitted green light with a luminance of 30 cd/m² upon application of a voltage of 55 V at a flowing current density of 120 mA/cm² and a luminous efficiency of 0.1 µm/W. The electro-emission spectrum of the device is shown in FIG. 8. The dimensions of the emission spectrum demonstrate that the light is emitted from Compound D1.

Example 2

Device Preparation 2

A composition for an organic electroluminescent device was prepared by mixing 90 mg of the compound (T3), 90 mg of the compound (T4), and 9 mg of the compound (D1), each represented by the structural formula, and 2.8 g of o-dichlorobenzene as a solvent, and removing insoluble matter by filtration through a PTFE membrane filter having a pore size of 0.2 µm. In addition, an ITO substrate was patterned and rinsed in the same manner as with Example 1. The composition was applied to the resulting ITO substrate by spin coating under the following conditions to thereby form a uniform thin film having a thickness of 160 nm.

Revolution number of spinner: 1500 rpm

Revolution time of spinner: 30 seconds

Spinning atmosphere: spinning was conducted in the atmosphere at a temperature of 23° C. and relative humidity of 30%

Drying condition: drying by heating on a hot plate at 80° C. for 1 minutes and further drying by heating in an oven at 140° C. for 15 minutes When Compound D1 has a first reduction potential of $E_{D1}^-$ [V vs. SCE] and a first oxidation potential of $E_{D1}^+$ [V vs. SCE], and Compound T3 has a first reduction potential of $E_{T3}^-$ [V vs. SCE] and a first oxidation potential of $E_{T3}^+$ [V vs. SCE], the first oxidation potentials and first reduction potentials in this composition satisfy the following condition:

$$E_{D1}^-(-2.30)+0.1 < E_{T3}^-(-2.05) < E_{D1}^+(+0.72) < E_{T3}^+(+0.99)-0.1$$

Next, the substrate bearing the coated film was placed in a vacuum deposition apparatus, and the apparatus was evacuated in the same manner as with Example 1. A film of sodium was applied by vapor deposition to a thickness of 0.5 nm. The vapor deposition of sodium was conducted by heating a sodium dispenser (supplied from SAES Getters) containing sodium chromate. The vapor deposition was conducted at an average deposition rate of 0.01 nm per second and a degree of vacuum of $8 \times 10^{-5}$ Pa. Subsequently, aluminum was deposited using a molybdenum boat at a deposition rate of 0.4 to 0.6 nm per second and a degree of vacuum of $5 \times 10^{-4}$ Pa to yield an aluminum film 80 nm thick. The temperature of the substrate upon vapor deposition of sodium and aluminum was kept to room temperature.

Thus, an organic electroluminescent device having a light-emitting area of 2 mm wide and 2 mm long was prepared.

The light emitting properties of this device, namely, the emission luminance (in unit of cd/m²) at a flowing current density of 250 mA/cm², the luminous efficiency (in unit of 1 m/W) at an emission luminance of 100 cd/m², and the drive voltage (in unit of V) are shown in Table 2.

The results in Table 2 demonstrate that a device that emits light with a high luminance was obtained by using a multilayer electrode of sodium and aluminum as the cathode.

Example 3

Device Preparation 3

Initially, an ITO substrate was patterned and rinsed in the same manner as with Example 2 and was immersed in a solution for five minutes. The solution was a 5 mM solution of the compound (ST1) represented by the following structural formula in dichloromethane. The substrate was then taken out from the solution, rinsed with dichloromethane for one minute, and was dried using a nitrogen blow. Thus, surface treatment of the ITO anode was conducted.

[Chemical Formula 38]

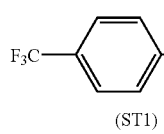

(ST1)

A composition for an organic electroluminescent device was prepared by mixing 60 mg of the compound (T3), 10 mg of the compound (T4), 4 mg of the compound (D1), and 2 g of o-dichlorobenzene as a solvent, and removing insoluble matter by filtration through a PTFE membrane filter having a pore size of 0.2 μm. The composition was applied to the surface treated ITO substrate by spin coating under the condition as with Example 2 to form a uniform thin film having a thickness of 160 nm.

Next, sodium was deposited on the substrate bearing the coated film to form a film 0.5 nm thick, and aluminum was deposited thereon to form a film 80 nm thick in the same manner as with Example 2.

Thus, an organic electroluminescent device having a light-emitting area of 2 mm wide and 2 mm long was prepared.

The light emitting properties of this device, namely, the emission luminance (in unit of cd/m²) at a flowing current density of 250 mA/cm², the luminous efficiency (in unit of 1 m/W) at an emission luminance of 100 cd/m², and the drive voltage (in unit of V), are shown in Table 2.

The results in Table 2 demonstrate that a device that emits light with a further higher luminance was obtained by subjecting the ITO anode to surface treatment.

TABLE 2

| Measuring Condition Measured Data | Flowing Current Density 250 [mA/cm²] Luminance [cd/m²] | Luminance 100 [cd/m²] | |
|---|---|---|---|
| | | Luminous Efficiency [lm/W] | Drive Voltage [V] |
| Example 1 | 30[1] | 0.1[2] | 55[3] |
| Example 2 | 2050 | 0.2 | 12.3 |
| Example 3 | 3040 | 0.4 | 9.2 |

[1] The luminance of the device prepared according to Example 1 was measured at a flowing current density of 120 mA/cm².
[2] The luminous efficiency of the device prepared according to Example 1 was measured at a luminance of 30 cd/m².
[3] The drive voltage of the device prepared according to Example 1 was measured at a luminance of 30 cd/m².

Example 4

Device Preparation 4

Figure 6:
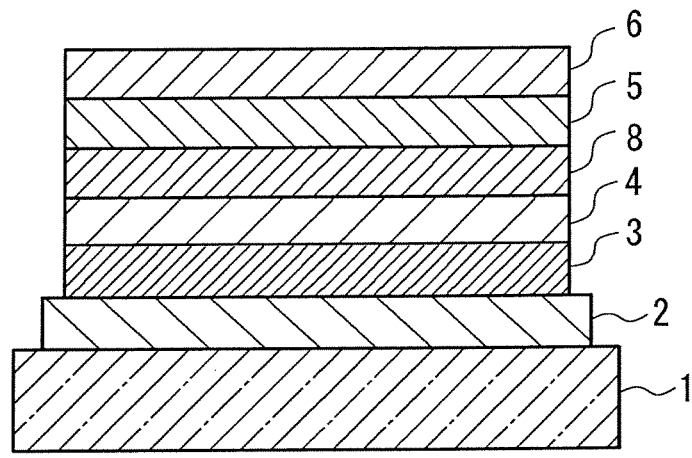
FIG. 6 is a schematic cross-sectional view illustrating another embodiment of the organic electroluminescent device.

An organic electroluminescent device having the structure shown in FIG. 6 was prepared in the following manner.

An indium-tin oxide (ITO) transparent electroconductive film deposited to a thickness of 150 nm on a glass substrate 1 (sputtered film; sheet resistance: 15Ω) was patterned in a 2-mm width striped pattern using a common photolithography technique and etching with hydrochloric acid, thereby forming an anode 2. The patterned ITO substrate was rinsed by sequentially carrying out ultrasonic cleaning in acetone, rinsing with pure water, and rinsed by sequentially carrying out ultrasonic cleaning in isopropyl alcohol, followed by drying in a nitrogen blow and UV/ozone cleaning.

Next, a hole injection layer 3 was formed by wet coating in the following manner. As materials for the hole injection layer 3, a polymeric compound (PB-1) having a weight-average molecular weight of 26500 and a number-average molecular weight of 12000 and containing an aromatic amino group of the following structural formula, and an electron-acceptor (A-2) of the following structural formula were applied by spin coating under the following conditions.

[Chemical Formula 39]

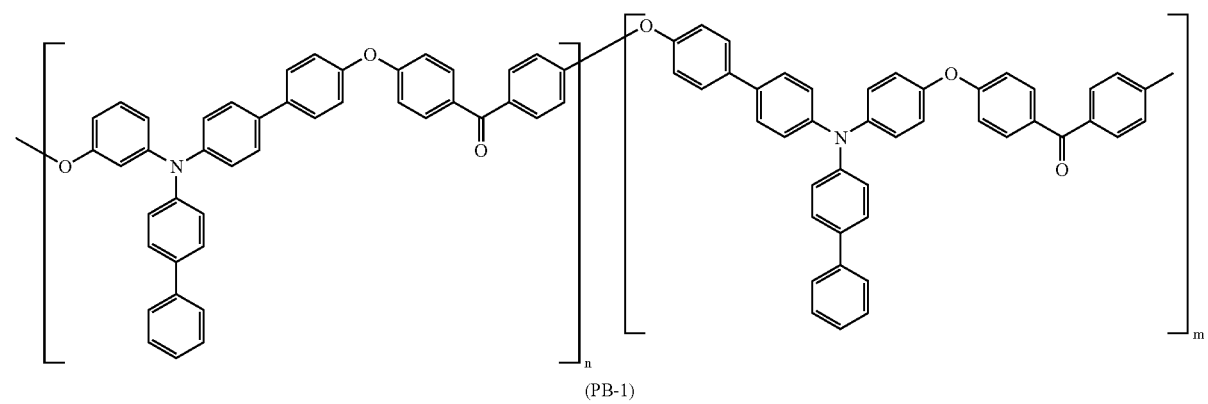

(PB-1)

-continued

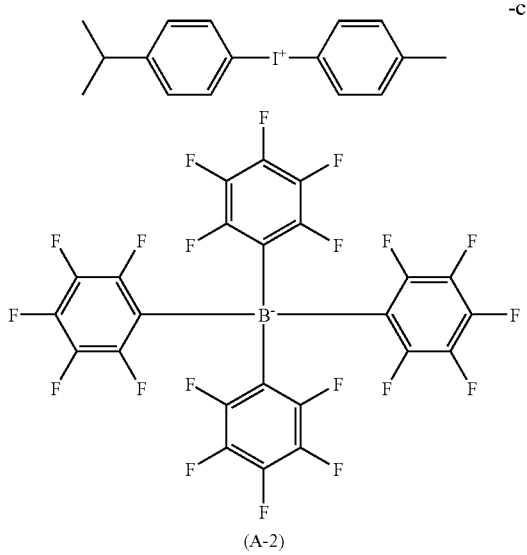

(A-2)

<Conditions of Spin Coating>
Solvent: anisole
Concentrations in coating composition: 2.0 percent by weight of PB-1, and
0.4 percent by weight of A-2
Revolution number of spinner: 2000 rpm
Revolution time of spinner: 30 seconds
Drying condition: drying at 230° C. for 5.5 hours
A uniform thin film 30 nm thick was formed by the spin coating.

Subsequently, an organic light emitting layer 4 was formed by wet coating in the following manner. A composition for an organic electroluminescent device was prepared by dissolving the compounds (T5) and (D2) as materials for the light emitting layer 4 in concentrations in a solvent shown below. The composition was applied by spin coating under the following conditions, to thereby yield the organic light emitting layer 4.

[Chemical Formula 40]

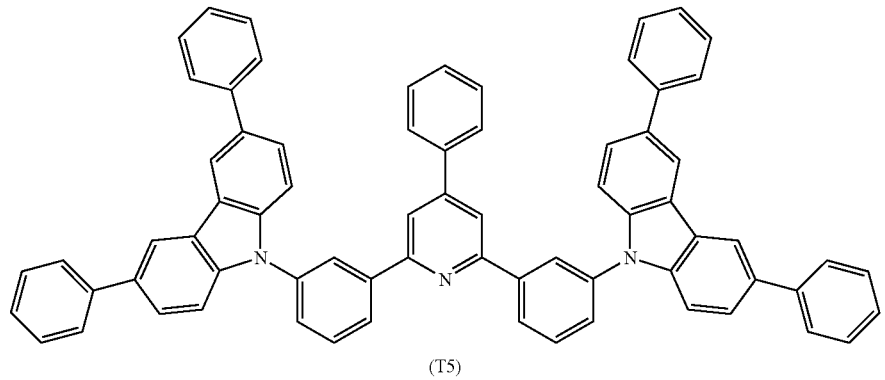

(T5)

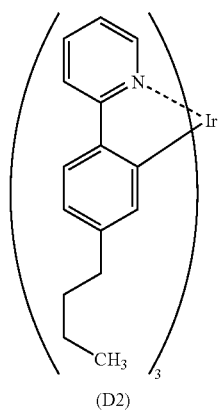

(D2)

<Conditions of Spin Coating>
Solvent: xylene
Concentrations in coating composition: 2.5 percent by weight of T5
0.13 percent by weight of D2
Revolution number of spinner: 1500 rpm
Revolution time of spinner: 30 seconds
Drying condition: drying at 130° C. under reduced pressure for 60 minutes
A uniform thin film 45 nm thick was formed by the spin coating.

Next, following aluminum 8-hydroxyquinoline complex (ET-1) was deposited as an electron transport layer 8. The temperature of the crucible of aluminum 8-hydroxyquinoline complex in this procedure was controlled within the range of from 321° C. to 311° C. The vacuum deposition was conducted at a degree of vacuum of 1.3 to $1.5 \times 10^{-4}$ Pa (about 1.1 to $1.0 \times 10^{-6}$ Torr) and a deposition rate of 0.08 to 0.16 nm per second to yield a film 30 nm thick.

[Chemical Formula 41]

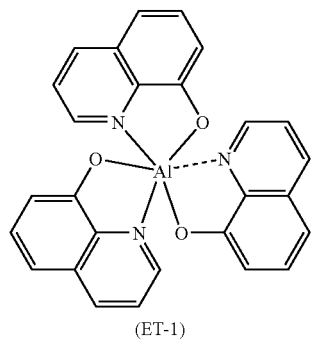

(ET-1)

The temperature of the substrate upon vacuum deposition of the electron transport layer 8 was kept to room temperature.

The device which had been subjected to vacuum deposition up to the electron transport layer 8 was once taken out of the vacuum deposition apparatus into the atmosphere. A 2-mm width striped shadow mask as a mask for vacuum deposition of a cathode was brought into intimate contact with the device perpendicularly to the ITO stripe of the anode 2, and the device was placed in another vacuum deposition apparatus. The apparatus was evacuated to a degree of vacuum of $1.8 \times 10^{-6}$ Torr (about $2.4 \times 10^{-4}$ Pa) or less in the same manner as with the organic layers.

As an electron injection layer 5, lithium fluoride (LiF) was deposited to a thickness of 0.5 nm on the electron transport layer 8. The vacuum deposition was conducted at a deposition rate of 0.01 to 0.06 nm per second and a degree of vacuum of $2.0 \times 10^{-6}$ Torr (about $2.6 \times 10^{-4}$ Pa) using a molybdenum boat.

Next, aluminum was heated in the same manner using a molybdenum boat and was deposited at a deposition rate of 0.1 to 0.3 nm per second and a degree of vacuum of 3.0 to $6.8 \times 10^{-6}$ Torr (about 4.0 to $9.0 \times 10^{-4}$ Pa) to yield an aluminum layer 80 nm thick. A cathode 6 was thus completed.

The temperature of the substrate upon vacuum deposition of the two-layered cathode 6 was kept to room temperature.

Thus, an organic electroluminescent device having a light-emitting area of 2 mm wide and 2 mm long was prepared. The maximal wavelength in emission spectrum of the device was 515 nm, which was identified as being from the iridium complex (D2). The chromaticity in terms of CIE (x, y) was (0.310, 0.626).

Example 5

Device Preparation 5

An organic electroluminescent device having the structure shown in FIG. 7 was prepared in the following manner.

Film-formation up to the organic light emitting layer 4 was conducted in the same manner as with Example 4, except that the hole injection layer 3 was dried at 230° C. for three hours. Thereafter, the following pyridine derivative (HB-1) was deposited as a hole blocking layer 9 to a thickness of 5 nm. The vacuum deposition was conducted at a crucible temperature of 230° C. to 238° C., a deposition rate of 0.07 to 0.11 nm per second, and a degree of vacuum of $1.9 \times 10^{-4}$ Pa (about $1.4 \times 10^{-6}$ Torr).

[Chemical Formula 42]

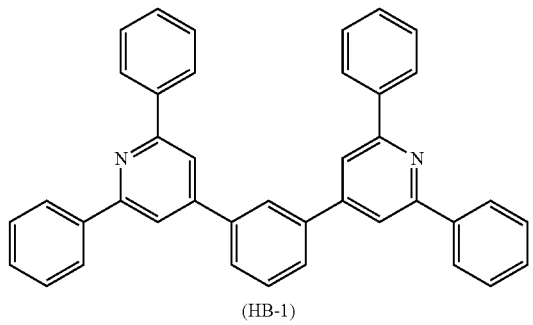

(HB-1)

Next, the aluminum 8-hydroxyquinoline complex (ET-1) was deposited as an electron transport layer 8 on the hole blocking layer 9 in the same manner. The temperature of the crucible for the aluminum 8-hydroxyquinoline complex in this procedure was controlled within the range of from 352° C. to 338° C. The vacuum deposition was conducted at a degree of vacuum of 2.0 to $1.9 \times 10^{-4}$ Pa (about 1.5 to $1.4 \times 10^{-6}$ Torr) and a deposition rate of 0.07 to 0.13 nm per second to yield a film 30 nm thick.

The temperature of the substrate upon vacuum deposition of the hole blocking layer 9 and the electron transport layer 8 was kept to room temperature.

The device which had been subjected to vacuum deposition up to the electron transport layer 8 was once taken out of the vacuum deposition apparatus into the atmosphere. A 2-mm width striped shadow mask as a mask for vacuum deposition of a cathode was brought into intimate contact with the device perpendicularly to the ITO stripe of the anode 2, and the device was placed in another vacuum deposition apparatus. The apparatus was evacuated to a degree of vacuum of $2.0 \times 10^{-6}$ Torr (about $2.6 \times 10^{-4}$ Pa) or less in the same manner as with the organic layers.

As an electron injection layer 5, lithium fluoride (LiF) was deposited to a thickness of 0.5 nm on the electron transport layer 8. The vacuum deposition was conducted at a deposition rate of 0.01 to 0.06 nm per second and a degree of vacuum of $2.1 \times 10^{-6}$ Torr (about $2.8 \times 10^{-4}$ Pa) using a molybdenum boat.

Next, aluminum was heated in the same manner using a molybdenum boat and was deposited at a deposition rate of 0.2 to 0.6 nm per second and a degree of vacuum of 3.8 to $6.8 \times 10^{-6}$ Torr (about 5.0 to $9.0 \times 10^{-4}$ Pa) to yield an aluminum layer 80 nm thick. A cathode 6 was thus completed.

The temperature of the substrate upon vacuum deposition of the two-layered cathode 6 was kept to room temperature.

Thus, an organic electroluminescent device having a light-emitting area of 2 mm wide and 2 mm long was prepared. The maximal wavelength in emission spectrum of the device was 515 nm, which was identified as being from the iridium complex (D2). The chromaticity in terms of CIE (x, y) was (0.315, 0.623).

Example 6

Device Preparation 6

An organic electroluminescent device having the structure shown in FIG. 7 was prepared in the following manner.

After conducting film-formation up to the hole injection layer 3 in the same manner as with Example 5, an organic light emitting layer 4 was formed by wet coating in the following manner. A composition for an organic electroluminescent device was prepared by dissolving the following compounds (T6) and (D2) as materials for the light emitting layer 4 in concentrations in a solvent mentioned below. The composition was applied by spin coating under the following conditions, to thereby yield the organic light emitting layer 4.

Next, the pyridine derivative (HB-1) was deposited as a hole blocking layer 9 to a thickness of 5.1 nm. The vacuum deposition was conducted at a crucible temperature of 284° C. to 289° C., a deposition rate of 0.09 to 0.13 nm per second, and a degree of vacuum of $2.8 \times 10^{-4}$ Pa (about $2.1 \times 10^{-6}$ Torr).

Next, the aluminum 8-hydroxyquinoline complex (ET-1) was deposited as an electron transport layer 8 in the same manner. The temperature of the crucible for the aluminum 8-hydroxyquinoline complex in this procedure was controlled within the range of from 349° C. to 340° C. The vacuum deposition was conducted at a degree of vacuum of 2.9 to $4.3 \times 10^{-4}$ Pa (about 2.2 to $3.2 \times 10^{-6}$ Torr) and a deposition rate of 0.08 to 0.12 nm per second to yield a film 30 nm thick.

The temperature of the substrate upon vacuum deposition of the hole blocking layer 9 and the electron transport layer 8 was kept to room temperature.

The device which had been subjected to vacuum deposition up to the electron transport layer 8 was once taken out of the

[Chemical Formula 43]

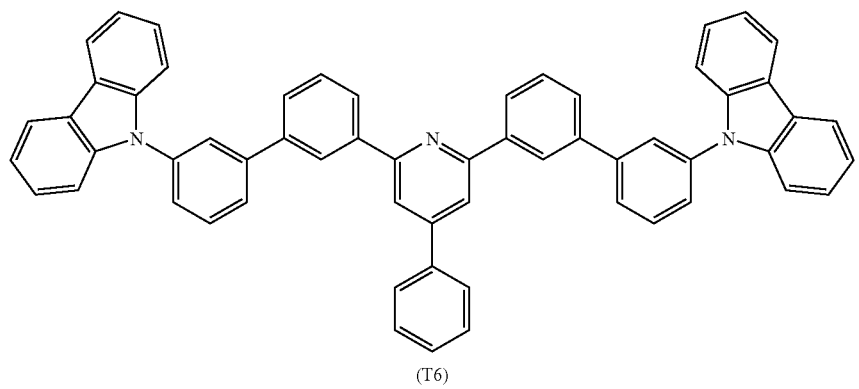

(T6)

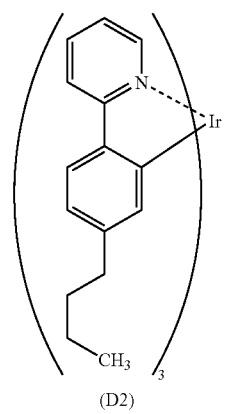

(D2)

<Conditions of Spin Coating>
Solvent: xylene
Concentrations in coating composition: 3.0 percent by weight of T6
0.15 percent by weight of D2
Revolution number of spinner: 1000 rpm
Revolution time of spinner: 30 seconds
Drying condition: drying at 80° C. under reduced pressure for 60 minutes
A uniform thin film 60 nm thick was formed by the spin coating.

vacuum deposition apparatus into the atmosphere. A 2-mm width striped shadow mask as a mask for vacuum deposition of a cathode was brought into intimate contact with the device perpendicularly to the ITO stripe of the anode 2, and the device was placed in another vacuum deposition apparatus. The apparatus was evacuated to a degree of vacuum of $2.3 \times 10^{-6}$ Torr (about $3.1 \times 10^{-4}$ Pa) or less in the same manner as with the organic layers.

As an electron injection layer 5, lithium fluoride (LiF) was deposited to a thickness of 0.5 nm on the electron transport layer 8. The vacuum deposition was conducted at a deposition rate of 0.005 to 0.04 nm per second and a degree of vacuum of 2.6×10⁻⁶ Torr (about 3.42 to 3.47×10⁻⁴ Pa) using a molybdenum boat.

Next, aluminum was heated in the same manner using a molybdenum boat and was deposited at a deposition rate of 0.04 to 0.4 nm per second and a degree of vacuum of 3.5 to 7.8×10⁻⁶ Torr (about 4.6 to 10.4×10⁻⁴ Pa) to yield an aluminum layer 80 nm thick. A cathode 6 was thus completed.

The temperature of the substrate upon vacuum deposition of the two-layered cathode 6 was kept to room temperature.

Thus, an organic electroluminescent device having a light-emitting area of 2 mm wide and 2 mm long was prepared. The maximal wavelength in emission spectrum of the device was 514 nm, which was identified as being from the iridium complex (D2). The chromaticity in terms of CIE (x, y) was (0.324, 0.615).

Example 7

Device Preparation 7

An organic electroluminescent device having the structure shown in FIG. 7 was prepared in the following manner.

After conducting film-formation up to the hole injection layer 3 in the same manner as with Example 5, an organic light emitting layer 4 was formed by wet coating in the following manner. A composition for an organic electroluminescent device was prepared by dissolving the following compounds (T6) and (D3) as materials for a light emitting layer 4 in concentrations in a solvent mentioned below. The composition was applied by spin coating under the following conditions, to thereby yield the organic light emitting layer 4.

<Conditions of Spin Coating>
Solvent: xylene
Concentrations in coating composition: 2.0 percent by weight of T6
0.1 percent by weight of D3
Revolution number of spinner: 1500 rpm
Revolution time of spinner: 30 seconds
Drying condition: drying at 130° C. under reduced pressure for 60 minutes A uniform thin film 60 nm thick was formed by the spin coating.

Next, the pyridine derivative (HB-1) was deposited as a hole blocking layer 9 to a thickness of 5 nm. The vacuum deposition was conducted at a crucible temperature of 277° C. to 280° C., a deposition rate of 0.11 to 0.13 nm per second, and a degree of vacuum of 2.9 to 3.2×10⁻⁴ Pa (about 2.2 to 2.4×10⁻⁶ Torr).

Next, the aluminum 8-hydroxyquinoline complex (ET-1) was deposited as an electron transport layer 8 in the same manner. The temperature of the crucible for the aluminum 8-hydroxyquinoline complex in this procedure was controlled within the range of from 372° C. to 362° C. The vacuum deposition was conducted at a degree of vacuum of 3.7 to 4.3×10⁻⁴ Pa (about 2.8 to 3.2×10⁻⁶ Torr) and a deposition rate of 0.1 nm per second to yield a film 30 nm thick.

The temperature of the substrate upon vacuum deposition of the hole blocking layer 9 and the electron transport layer 8 was kept to room temperature.

The device which had been subjected to vacuum deposition up to the electron transport layer 8 was once taken out of the vacuum deposition apparatus into the atmosphere. A 2-mm

[Chemical Formula 44]

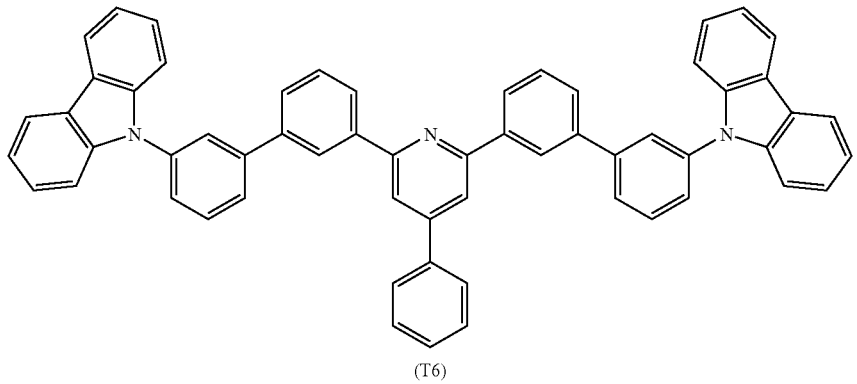

(T6)

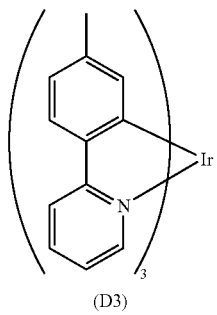

(D3)

width striped shadow mask as a mask for vacuum deposition of a cathode was brought into intimate contact with the device perpendicularly to the ITO stripe of the anode 2, and the device was placed in another vacuum deposition apparatus. The apparatus was evacuated to a degree of vacuum of $1.5 \times 10^{-6}$ Torr (about $3.1 \times 10^{-4}$ Pa) or less in the same manner as with the organic layers.

As an electron injection layer 5, lithium fluoride (LiF) was deposited to a thickness of 0.5 nm on the electron transport layer 8. The vacuum deposition was conducted at a deposition rate of 0.01 to 0.03 nm per second and a degree of vacuum of 2.3 to $2.5 \times 10^{-6}$ Torr (about 3.1 to $3.3 \times 10^{-4}$ Pa) using a molybdenum boat.

Next, aluminum was heated in the same manner using a molybdenum boat and was deposited at a deposition rate of 0.3 to 0.5 nm per second and a degree of vacuum of 2.9 to $6.6 \times 10^{-6}$ Torr (about 3.8 to $8.8 \times 10^{-4}$ Pa) to yield an aluminum layer 80 nm thick. A cathode 6 was thus completed.

The temperature of the substrate upon vacuum deposition of the two-layered cathode 6 was kept to room temperature.

Thus, an organic electroluminescent device having a light-emitting area of 2 mm wide and 2 mm long was prepared. The maximal wavelength in emission spectrum of the device was 513 nm, which was identified as being from the iridium complex (D3). The chromaticity in terms of CIE (x, y) was (0.303, 0.625).

Example 8

Device Preparation 8

An organic electroluminescent device having the structure shown in FIG. 7 was prepared in the following manner.

After conducting film-formation up to the hole injection layer 3 in the same manner as with Example 5, an organic light emitting layer 4 was formed by wet coating in the following manner. A composition for an organic electroluminescent device was prepared by dissolving the following compounds (T7) and (D2) as materials for a light emitting layer 4 in concentrations in a solvent mentioned below. The composition was applied by spin coating under the following conditions, to thereby yield the organic light emitting layer 4.

[Chemical Formula 45]

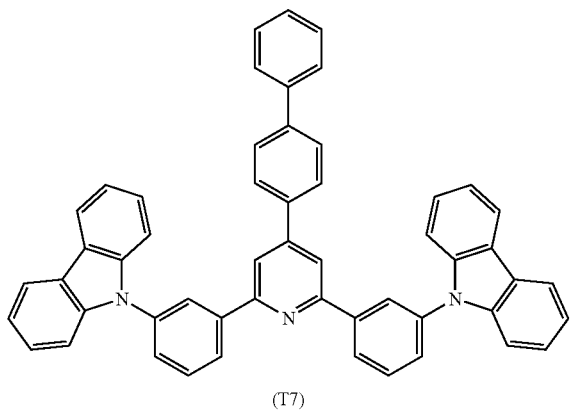

(T7)

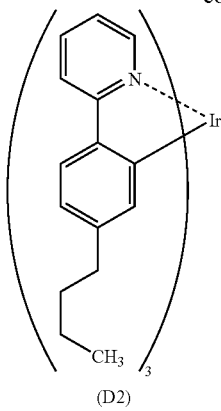

(D2)

<Conditions of Spin Coating>
Solvent: 1,4-dioxane
Concentrations in coating composition: 2.0 percent by weight of T7
0.1 percent by weight of D2
Revolution number of spinner: 1500 rpm
Revolution time of spinner: 30 seconds
Drying condition: drying at 130° C. under reduced pressure for 60 minutes
A uniform thin film 60 nm thick was formed by the spin coating.

Next, the pyridine derivative (HB-1) was deposited as a hole blocking layer 9 to a thickness of 5 nm. The vacuum deposition was conducted at a crucible temperature of 237° C. to 238° C., a deposition rate of 0.1 nm per second, and a degree of vacuum of 9.3 to $9.2 \times 10^{-5}$ Pa (about 7.0 to $6.9 \times 10^{-6}$ Torr).

Next, the aluminum 8-hydroxyquinoline complex (ET-1) was deposited as an electron transport layer 8 in the same manner. The temperature of the crucible for the aluminum 8-hydroxyquinoline complex in this procedure was controlled within the range of from 294° C. to 288° C. The vacuum deposition was conducted at a degree of vacuum of 9.1 to $8.5 \times 10^{-5}$ Pa (about 6.8 to $6.4 \times 10^{-6}$ Torr) and a deposition rate of 0.11 to 0.12 nm per second to yield a film 30 nm thick.

The temperature of the substrate upon vacuum deposition of the hole blocking layer 9 and the electron transport layer 8 was kept to room temperature.

The device which had been subjected to vacuum deposition up to the electron transport layer 8 was once taken out of the vacuum deposition apparatus into the atmosphere. A 2-mm width striped shadow mask as a mask for vacuum deposition of a cathode was brought into intimate contact with the device perpendicularly to the ITO stripe of the anode 2, and the device was placed in another vacuum deposition apparatus. The apparatus was evacuated to a degree of vacuum of $2.00 \times 10^{-6}$ Torr (about $2.6 \times 10^{-4}$ Pa) or less in the same manner as with the organic layers.

As an electron injection layer 5, lithium fluoride (LiF) was deposited to a thickness of 0.5 nm on the electron transport layer 8. The vacuum deposition was conducted at a deposition rate of 0.02 nm per second and a degree of vacuum of $2.0 \times 10^{-6}$ Torr (about $2.6 \times 10^{-4}$ Pa) using a molybdenum boat.

Next, aluminum was heated in the same manner using a molybdenum boat and was deposited at a deposition rate of 0.2 nm per second and a degree of vacuum of $3.2 \times 10^{-6}$ Torr (about $4.2 \times 10^{-4}$ Pa) to yield an aluminum layer 80 nm thick. A cathode 6 was thus completed.

The temperature of the substrate upon vacuum deposition of the two-layered cathode 6 was kept to room temperature.

Thus, an organic electroluminescent device having a light-emitting area of 2 mm wide and 2 mm long was prepared. The maximal wavelength in emission spectrum of the device was 519 nm, which was identified as being from the iridium complex (D2). The chromaticity in terms of CIE (x, y) was (0.365, 0.591).

Example 9

Device Preparation 9

An organic electroluminescent device having the structure shown in FIG. 7 was prepared in the following manner.

After conducting film-formation up to the hole injection layer 3 in the same manner as with Example 5, an organic light emitting layer 4 was formed by wet coating in the following manner. A composition for an organic electroluminescent device was prepared by dissolving the following compounds (T8) and (D2) as materials for a light emitting layer 4 in concentrations in a solvent mentioned below. The composition was applied by spin coating under the following conditions, to thereby yield the organic light emitting layer 4.

[Chemical Formula 46]

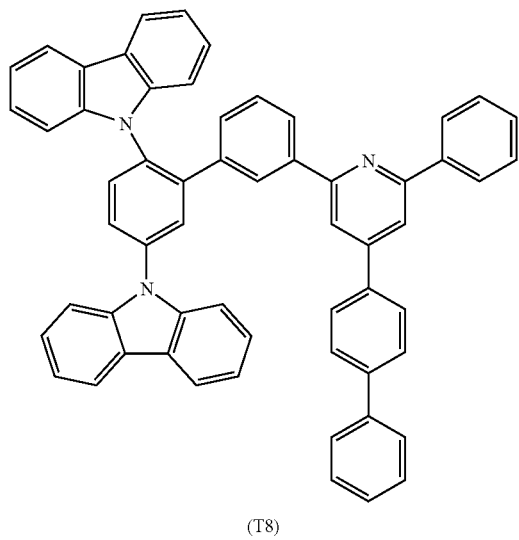

(T8)

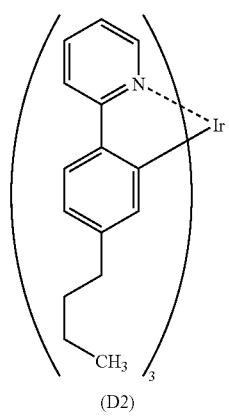

(D2)

<Conditions of Spin Coating>
Solvent: xylene
Concentrations in coating composition: 2.0 percent by weight of T8
0.1 percent by weight of D2
Revolution number of spinner: 1500 rpm
Revolution time of spinner: 30 seconds
Drying condition: drying at 130° C. under reduced pressure for 60 minutes A uniform thin film 60 nm thick was formed by the spin coating.

Next, the pyridine derivative (HB-1) was deposited as a hole blocking layer 9 to a thickness of 5.1 nm. The vacuum deposition was conducted at a crucible temperature of 273° C., a deposition rate of 0.1 nm per second, and a degree of vacuum of $3.3 \times 10^{-4}$ Pa (about $2.5 \times 10^{-6}$ Torr).

Next, the aluminum 8-hydroxyquinoline complex (ET-1) was deposited as an electron transport layer 8 in the same manner. The temperature of the crucible for the aluminum 8-hydroxyquinoline complex in this procedure was controlled within the range of from 376° C. to 371° C. The vacuum deposition was conducted at a degree of vacuum of $3.1 \times 10^{-4}$ Pa (about $2.3 \times 10^{-6}$ Torr) and a deposition rate of 0.11 to 0.12 nm per second to yield a film 30 nm thick.

The temperature of the substrate upon vacuum deposition of the hole blocking layer 9 and the electron transport layer 8 was kept to room temperature.

The device which had been subjected to vacuum deposition up to the electron transport layer 8 was once taken out of the vacuum deposition apparatus into the atmosphere. A 2-mm width striped shadow mask as a mask for vacuum deposition of a cathode was brought into intimate contact with the device perpendicularly to the ITO stripe of the anode 2, and the device was placed in another vacuum deposition apparatus. The apparatus was evacuated to a degree of vacuum of $2.5 \times 10^{-6}$ Torr (about $3.3 \times 10^{-4}$ Pa) or less in the same manner as with the organic layers.

As an electron injection layer 5, lithium fluoride (LiF) was deposited to a thickness of 0.5 nm on the electron transport layer 8. The vacuum deposition was conducted at a deposition rate of 0.006 nm per second and a degree of vacuum of $2.6 \times 10^{-6}$ Torr (about $3.5 \times 10^{-4}$ Pa).

Next, aluminum was heated in the same manner using a molybdenum boat and was deposited at a deposition rate of 0.1 to 0.35 nm per second and a degree of vacuum of 3.4 to $4.5 \times 10^{-6}$ Torr (about 4.5 to $6.0 \times 10^{-4}$ Pa) to yield an aluminum layer 80 nm thick. A cathode 6 was thus completed.

The temperature of the substrate upon vacuum deposition of the two-layered cathode 6 was kept to room temperature.

Thus, an organic electroluminescent device having a light-emitting area of 2 mm wide and 2 mm long was prepared. The maximal wavelength in emission spectrum of the device was 513 nm, which was identified as being from the iridium complex (D2). The chromaticity in terms of CIE (x, y) was (0.311, 0.622).

Example 10

Device Preparation 10

An organic electroluminescent device having the structure shown in FIG. 7 was prepared in the following manner.

An anode 2 was formed on a glass substrate 1, and rinsing was conducted in the same manner as with Example 4. Thereafter, a hole injection layer 3 was formed by wet coating in the following manner. As materials for the hole injection layer 3, a polymeric compound (PB-3) having a weight-average molecular weight of 29400 and a number-average molecular weight of 12600 and containing an aromatic amino group of the following structural formula, and an electron-acceptor (A-2) of the following structural formula were applied by spin coating under the following conditions.

[Chemcial Formula 47]

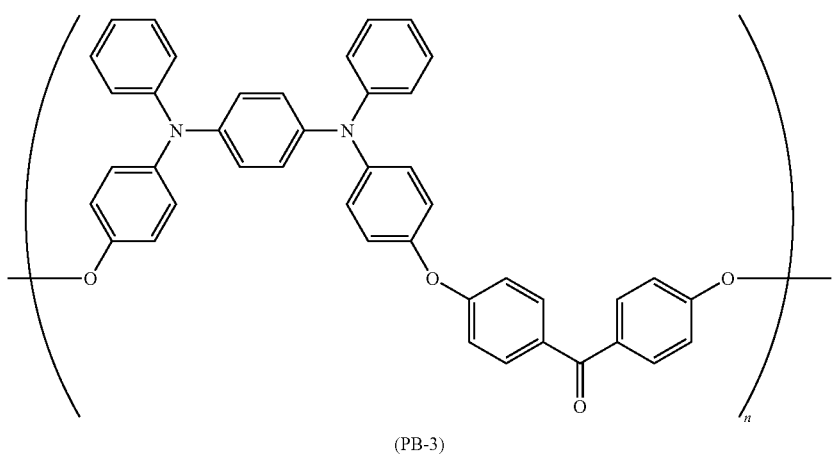

(PB-3)

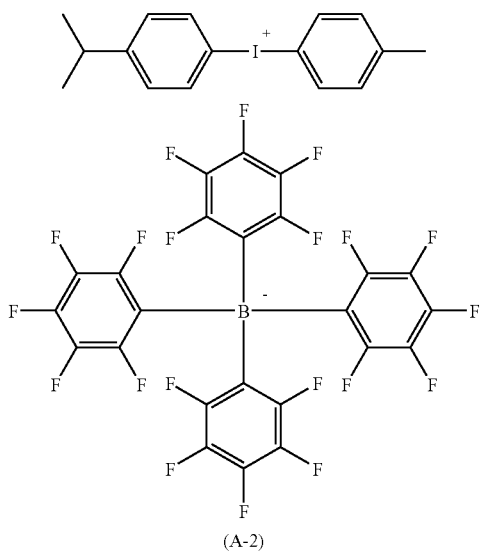

(A-2)

<Conditions of Spin Coating>
Solvent: ethyl benzoate
Concentrations in coating composition: 2.0 percent by weight of PB-3
0.8 percent by weight of A-2
Revolution number of spinner: 1500 rpm
Revolution time of spinner: 30 seconds
Drying condition: drying at 230° C. for 3 hours A uniform thin film 30 nm thick was formed by the spin coating.

Subsequently, an organic light emitting layer 4 was formed by wet coating in the following manner. A composition for an organic electroluminescent device was prepared by dissolving the following compounds (T6), (T9) and (D2) in concentrations in a solvent mentioned below. The composition was applied by spin coating under the following conditions, to thereby yield the organic light emitting layer 4.

The term "Ink Storage" in the following conditions for spin coating refers to the condition and time period of storage of the composition for an organic electroluminescent device between its preparation and use in spin coating.

[Chemical Formula 48]

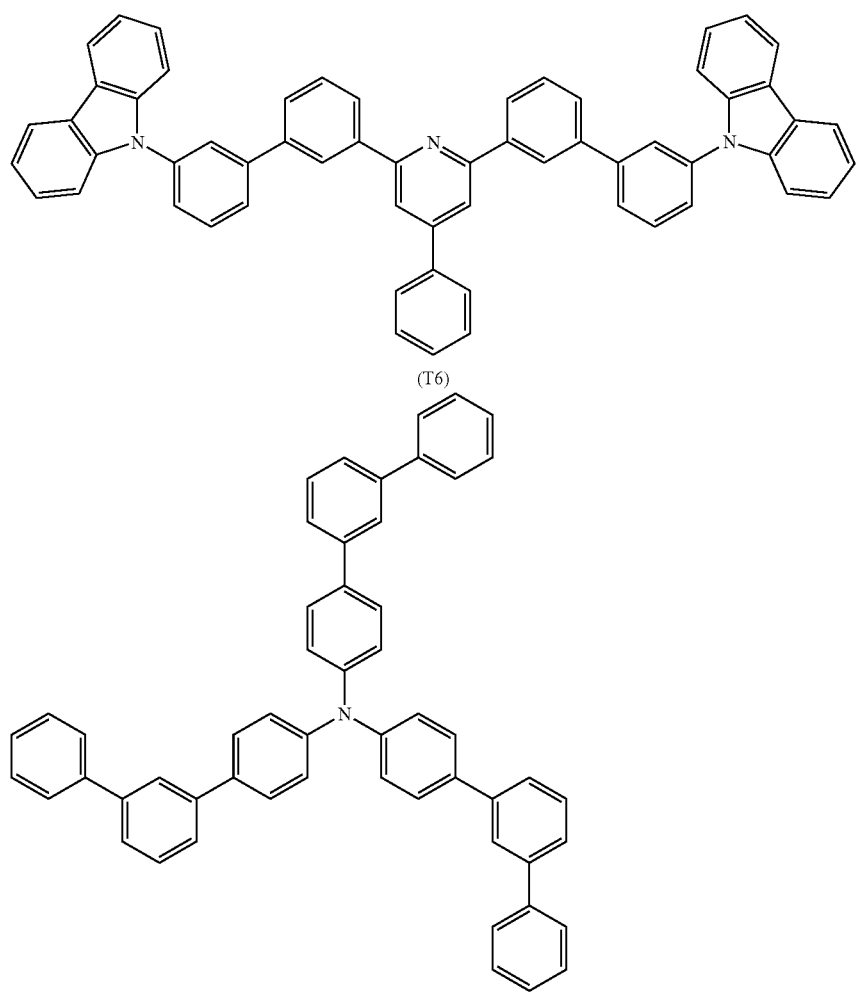

(T6)

(T9)

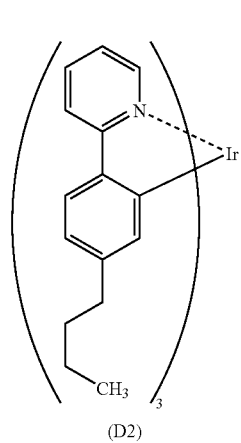

(D2)

<Conditions of Spin Coating>
Ink storage: storage at 4° C. in a dark place for 18 days
Solvent: toluene
Concentrations in coating composition: 1.0 percent by weight of T6
1.0 percent by weight of T9
0.1 percent by weight of D2
Revolution number of spinner: 1500 rpm
Revolution time of spinner: 30 seconds
Drying condition: drying at 80° C. under reduced pressure for 60 minutes A uniform thin film 60 nm thick was formed by the spin coating.

Next, the pyridine derivative (HB-1) was deposited as a hole blocking layer 9 to a thickness of 5.1 nm. The vacuum deposition was conducted at a crucible temperature of 307° C. to 312° C., a deposition rate of 0.07 to 0.13 nm per second, and a degree of vacuum of $2.7 \times 10^{-4}$ Pa (about $2.0 \times 10^{-6}$ Torr).

Next, the aluminum 8-hydroxyquinoline complex (ET-1) was deposited as an electron transport layer 8 on the hole blocking layer 9 in the same manner. The temperature of the crucible for the aluminum 8-hydroxyquinoline complex in this procedure was controlled within the range of from 469° C. to 444° C. The vacuum deposition was conducted at a degree of vacuum of 6.0 to $3.3 \times 10^{-4}$ Pa (about 4.5 to $2.5 \times 10^{-6}$ Torr) and a deposition rate of 0.07 to 0.13 nm per second to yield a film 30 nm thick.

The temperature of the substrate upon vacuum deposition of the hole blocking layer 9 and the electron transport layer 8 was kept to room temperature.

The device which had been subjected to vacuum deposition up to the electron transport layer 8 was once taken out of the vacuum deposition apparatus into the atmosphere. A 2-mm width striped shadow mask as a mask for vacuum deposition of a cathode was brought into intimate contact with the device perpendicularly to the ITO stripe of the anode 2, and the device was placed in another vacuum deposition apparatus. The apparatus was evacuated to a degree of vacuum of $1.5 \times 10^{-6}$ Torr (about $3.0 \times 10^{-4}$ Pa) or less in the same manner as with the organic layers.

As an electron injection layer 5, lithium fluoride (LiF) was deposited to a thickness of 0.5 nm on the electron transport layer 8. The vacuum deposition was conducted at a deposition rate of 0.007 to 0.01 nm per second and a degree of vacuum of 2.2 to $2.3 \times 10^{-6}$ Torr (about 2.9 to $3.0 \times 10^{-4}$ Pa).

Next, aluminum was heated in the same manner using a molybdenum boat and was deposited at a deposition rate of 0.08 to 0.35 nm per second and a degree of vacuum of 3.8 to $6.5 \times 10^{-6}$ Torr (about 5.1 to $8.7 \times 10^{-4}$ Pa) to yield an aluminum layer 80 nm thick. A cathode 6 was thus completed.

The temperature of the substrate upon vacuum deposition of the two-layered cathode 6 was kept to room temperature.

Thus, an organic electroluminescent device having a light-emitting area of 2 mm wide and 2 mm long was prepared. The maximal wavelength in emission spectrum of the device was 512 nm, which was identified as being from the iridium complex (D2). The chromaticity in terms of CIE (x, y) was (0.309, 0.619).

Example 11

Device Preparation 11

Figure 7:
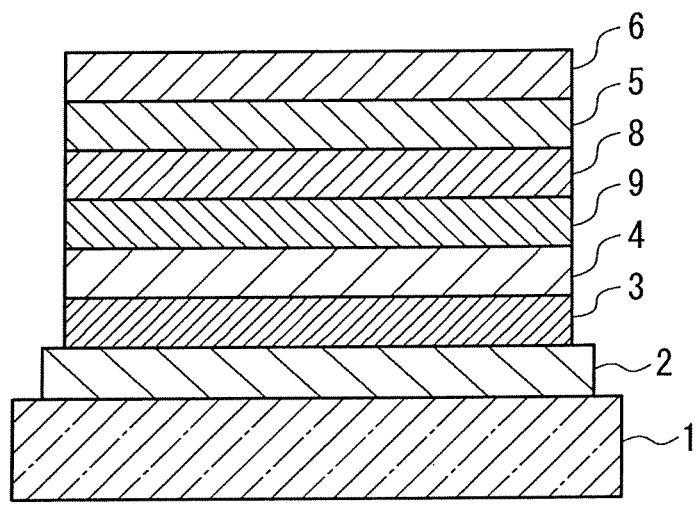
FIG. 7 is a schematic cross-sectional view illustrating another embodiment of the organic electroluminescent device.

An organic electroluminescent device having the structure shown in FIG. 7 was prepared in the same manner as with Example 10, except for carrying out the ink storage in "Conditions of spin coating" at a temperature of 20° C. in the formation of the organic light emitting layer 4.

The maximal wavelength in emission spectrum of the device was 513 nm, which was identified as being from the iridium complex (D2). The chromaticity in terms of CIE (x, y) was (0.314, 0.617).

Example 12

Device Preparation 12

An organic electroluminescent device having the structure shown in FIG. 7 was prepared in the following manner.

Film-formation up to the organic light emitting layer 4 was conducted in the same manner as with Example 10, except for carrying out the ink storage for a time period of 7 days before spin coating in the formation of the light emitting layer 4. Thereafter, the pyridine derivative (HB-1) was deposited as a hole blocking layer 9 to a thickness of 5 nm. The vacuum deposition was conducted at a crucible temperature of 327° C. to 332° C., a deposition rate of 0.08 nm per second, and a degree of vacuum of $1.7 \times 10^{-4}$ Pa (about $1.3 \times 10^{-6}$ Torr).

Next, the aluminum 8-hydroxyquinoline complex (ET-1) was deposited as an electron transport layer 8 on the hole blocking layer 9 in the same manner. The temperature of the crucible for the aluminum 8-hydroxyquinoline complex in this procedure was controlled within the range of from 440° C. to 425° C. The vacuum deposition was conducted at a degree of vacuum of 1.7 to $1.6 \times 10^{-4}$ Pa (about 1.3 to $1.2 \times 10^{-6}$ Torr) and a deposition rate of 0.1 to 0.14 nm per second to yield a film 30 nm thick.

The temperature of the substrate upon vacuum deposition of the hole blocking layer 9 and the electron transport layer 8 was kept to room temperature.

The device which had been subjected to vacuum deposition up to the electron transport layer 8 was once taken out of the vacuum deposition apparatus into the atmosphere. A 2-mm width striped shadow mask as a mask for vacuum deposition of a cathode was brought into intimate contact with the device perpendicularly to the ITO stripe of the anode 2, and the device was placed in another vacuum deposition apparatus. The apparatus was evacuated to a degree of vacuum of $1.5 \times 10^{-6}$ Torr (about $1.96 \times 10^{-4}$ Pa) or less in the same manner as with the organic layers.

As an electron injection layer 5, lithium fluoride (LiF) was deposited to a thickness of 0.5 nm on the electron transport layer 8. The vacuum deposition was conducted at a deposition rate of 0.008 to 0.013 nm per second and a degree of vacuum of 1.5 to $1.6 \times 10^{-6}$ Torr (about 2.0 to $2.1 \times 10^{-4}$ Pa) using a molybdenum boat.

Next, aluminum was heated in the same manner using a molybdenum boat and was deposited at a deposition rate of 0.05 to 0.42 nm per second and a degree of vacuum of 2.5 to $7.0 \times 10^{-6}$ Torr (about 3.3 to $9.3 \times 10^{-4}$ Pa) to yield an aluminum layer 80 nm thick. A cathode 6 was thus completed.

The temperature of the substrate upon vacuum deposition of the two-layered cathode 6 was kept to room temperature.

Thus, an organic electroluminescent device having a light-emitting area of 2 mm wide and 2 mm long was prepared. The maximal wavelength in emission spectrum of the device was 513 nm, which was identified as being from the iridium complex (D2). The chromaticity in terms of CIE (x, y) was (0.315, 0.617).

Example 13

Device Preparation 13

An organic electroluminescent device having the structure shown in FIG. 7 was prepared in the same manner as with Example 12, except for carrying out the ink storage at a temperature of 20° C. before spin coating in the formation of the organic light emitting layer 4.

The maximal wavelength in emission spectrum of the device was 513 nm, which was identified as being from the iridium complex (D2). The chromaticity in terms of CIE (x, y) was (0.314, 0.617).

Example 14

Device Preparation 14

An organic electroluminescent device having the structure shown in FIG. 7 was prepared in the following manner.

Film-formation up to the organic light emitting layer 4 was conducted in the same manner as with Example 10, except for using the ink (composition) in spin coating immediately after its preparation without storage in the formation of the light emitting layer 4. Thereafter, the pyridine derivative (HB-1) was deposited as a hole blocking layer 9 to a thickness of 5.1 nm. The vacuum deposition was conducted at a crucible temperature of 315° C. to 319° C., a deposition rate of 0.07 to 0.094 nm per second, and a degree of vacuum of 3.1 to 2.7×10$^{-4}$ Pa (about 2.3 to 2.0×10$^{-6}$ Torr).

Next, the aluminum 8-hydroxyquinoline complex (ET-1) was deposited as an electron transport layer 8 on the hole blocking layer 9 in the same manner. The temperature of the crucible for the aluminum 8-hydroxyquinoline complex in this procedure was controlled within the range of from 481° C. to 391° C. The vacuum deposition was conducted at a degree of vacuum of 2.7 to 3.6×10$^{-4}$ Pa (about 2.0 to 2.7×10$^{-6}$ Torr) and a deposition rate of 0.11 to 0.18 nm per second to yield a film 30 nm thick.

The temperature of the substrate upon vacuum deposition of the hole blocking layer 9 and the electron transport layer 8 was kept to room temperature.

The device which had been subjected to vacuum deposition up to the electron transport layer 8 was once taken out of the vacuum deposition apparatus into the atmosphere. A 2-mm width striped shadow mask as a mask for vacuum deposition of a cathode was brought into intimate contact with the device perpendicularly to the ITO stripe of the anode 2, and the device was placed in another vacuum deposition apparatus. The apparatus was evacuated to a degree of vacuum of 3.1×10$^{-6}$ Torr (about 4.1×10$^{-4}$ Pa) or less in the same manner as with the organic layers.

As an electron injection layer 5, lithium fluoride (LiF) was deposited to a thickness of 0.5 nm on the electron transport layer 8. The vacuum deposition was conducted at a deposition rate of 0.007 to 0.012 nm per second and a degree of vacuum of 3.2 to 3.3×10$^{-6}$ Torr (about 4.3 to 4.4×10$^{-4}$ Pa) using a molybdenum boat. Next, aluminum was heated in the same manner using a molybdenum boat and was deposited at a deposition rate of 0.05 to 0.47 nm per second and a degree of vacuum of 4.0 to 7.4×10$^{-6}$ Torr (about 5.3 to 9.8×10$^{-4}$ Pa) to yield an aluminum layer 80 nm thick. A cathode 6 was thus completed.

The temperature of the substrate upon vacuum deposition of the two-layered cathode 6 was kept to room temperature.

Thus, an organic electroluminescent device having a light-emitting area of 2 mm wide and 2 mm long was prepared. The maximal wavelength in emission spectrum of the device was 512 nm, which was identified as being from the iridium complex (D2). The chromaticity in terms of CIE (x, y) was (0.303, 0.622).

Example 15

Device Preparation 15

An organic electroluminescent device having the structure shown in FIG. 7 was prepared in the following manner.

Film-formation up to the hole injection layer 3 was conducted in the same manner as with Example 10, except that the concentration of the compound (A-2) was 0.4 percent by weight and drying was carried out at 230° C. for 15 minutes in the spin coating in the formation of the hole injection layer 3. Thereafter, an organic light emitting layer 4 was formed by wet coating in the following manner. A composition for an organic electroluminescent device was prepared by dissolving the following compounds (T6), (T12) and (D4) as materials for the light emitting layer 4 in concentrations in a solvent mentioned below. The composition was applied by spin coating under the following conditions, to thereby yield the organic light emitting layer 4.

[Chemical Formula 49]

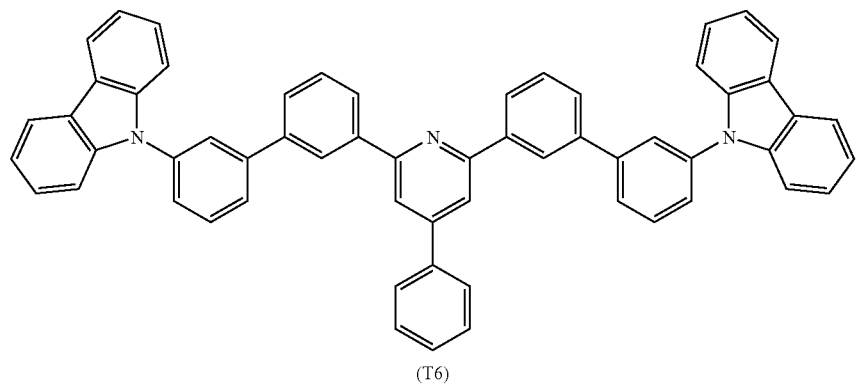

(T6)

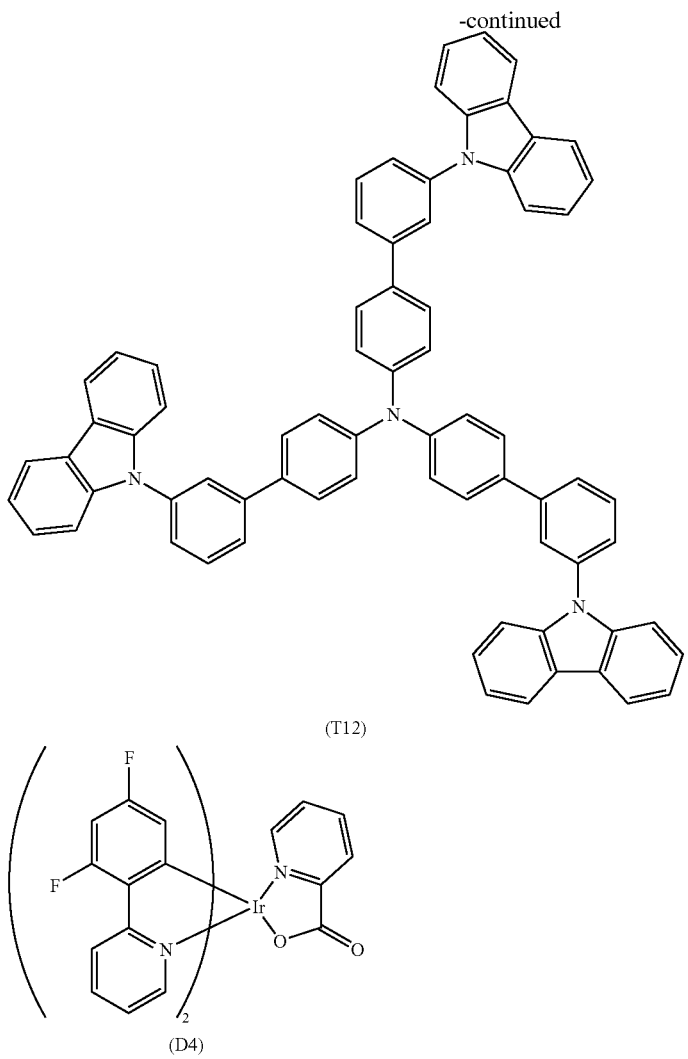

(T12)

(D4)

<Conditions of Spin Coating>
Solvent: toluene
Concentrations in coating composition: 1.0 percent by weight of T6
1.0 percent by weight of T12
0.1 percent by weight of D4
Revolution number of spinner: 1500 rpm
Revolution time of spinner: 30 seconds
Drying condition: drying at 80° C. under reduced pressure for 60 minutes
A uniform thin film 60 nm thick was formed by the spin coating.

Next, the pyridine derivative (HB-1) was deposited as a hole blocking layer 9 to a thickness of 5 nm. The vacuum deposition was conducted at a crucible temperature of 238° C. to 249° C., a deposition rate of 0.014 to 0.024 nm per second, and a degree of vacuum of 3.5 to 3.7×10$^{-4}$ Pa (about 2.6 to 2.8×10$^{-6}$ Torr).

Next, the aluminum 8-hydroxyquinoline complex (ET-1) was deposited as an electron transport layer 8 on the hole blocking layer 9 in the same manner. The temperature of the crucible for the aluminum 8-hydroxyquinoline complex in this procedure was controlled within the range of from 240° C. to 247° C. The vacuum deposition was conducted at a degree of vacuum of 3.7 to 3.3×10$^{-4}$ Pa (about 2.8 to 2.5×10$^{-6}$ Torr) and a deposition rate of 0.1 to 0.11 nm per second to yield a film 30 nm thick.

The temperature of the substrate upon vacuum deposition of the hole blocking layer 9 and the electron transport layer 8 was kept to room temperature.

The device which had been subjected to vacuum deposition up to the electron transport layer 8 was once taken out of the vacuum deposition apparatus into the atmosphere. A 2-mm width striped shadow mask as a mask for vacuum deposition of a cathode was brought into intimate contact with the device perpendicularly to the ITO stripe of the anode 2, and the device was placed in another vacuum deposition apparatus. The apparatus was evacuated to a degree of vacuum of 2.1× 10$^{-6}$ Torr (about 2.2×10$^{-4}$ Pa) or less in the same manner as with the organic layers.

As an electron injection layer 5, lithium fluoride (LiF) was deposited to a thickness of 0.5 nm on the electron transport layer 8. The vacuum deposition was conducted at a deposition rate of 0.006 to 0.008 nm per second and a degree of vacuum of 2.3 to 2.4×10$^{-6}$ Torr (about 3.1 to 3.2×10$^{-4}$ Pa) using a molybdenum boat.

Next, aluminum was heated in the same manner using a molybdenum boat and was deposited at a deposition rate of 0.25 to 0.41 nm per second and a degree of vacuum of 2.5 to 7.4×10⁻⁶ Torr (about 3.3 to 9.8×10⁻⁴ Pa) to yield an aluminum layer 80 nm thick. A cathode 6 was thus completed.

The temperature of the substrate upon vacuum deposition of the two-layered cathode 6 was kept to room temperature.

Thus, an organic electroluminescent device having a light-emitting area of 2 mm wide and 2 mm long was prepared. A peak of 474 nm was observed in emission spectrum of the device, which was identified as being from the iridium complex (D4).

Comparative Example 1

An organic electroluminescent device having the structure shown in FIG. 6 was prepared in the following manner.

Film-formation up to the hole injection layer 3 was conducted in the same manner as with Example 10, except that the concentration of the compound (A-2) was 0.4 percent by weight in spin coating in the formation of the hole injection layer 3. Thereafter, an organic light emitting layer 4 was formed by wet coating in the following manner. As materials for the light emitting layer 4, the following compounds (T10), (T11) and (D3) were dissolved in concentrations in a solvent mentioned below to yield a composition for an organic electroluminescent device. The composition was applied by spin coating under the following conditions, to thereby yield the organic light emitting layer 4.

[Chemical Formula 50]

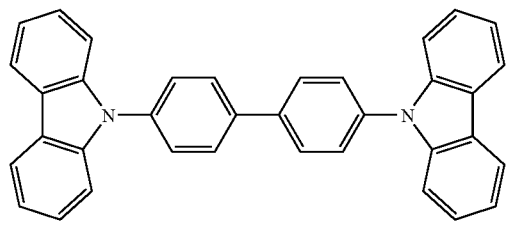

(T10)

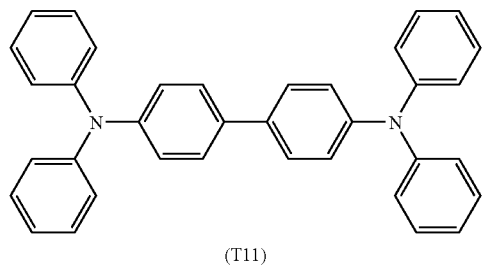

(T11)

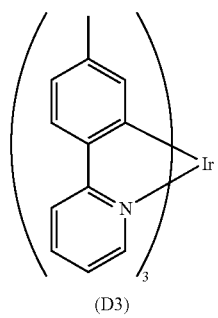

(D3)

<Conditions of Spin Coating>
Solvent: chloroform
Concentrations in coating composition: 1.0 percent by weight of T10
1.0 percent by weight of T11
0.1 percent by weight of D3
Revolution number of spinner: 1500 rpm
Revolution time of spinner: 30 seconds
Drying condition: drying at 80° C. under reduced pressure for 60 minutes A uniform thin film 100 nm thick was formed by the spin coating.

Next, the following compound (ET-2) was deposited as an electron transport layer 8. The vacuum deposition herein was conducted at a degree of vacuum of 1.79 to 1.71×10⁻⁴ Pa (about 1.3×10⁻⁶ Torr) and a deposition rate of 0.09 to 0.1 nm per second, to thereby yield a film 20 nm thick.

[Chemical Formula 51]

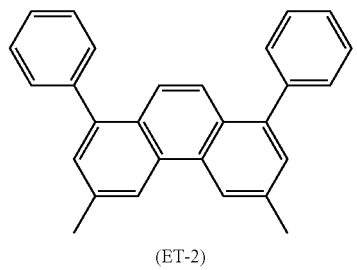

(ET-2)

Next, as an electron injection layer 5, lithium fluoride (LiF) was deposited to a thickness of 0.5 nm on the electron transport layer 8. The vacuum deposition was conducted at a deposition rate of 0.009 to 0.013 nm per second and a degree of vacuum of 1.3×10⁻⁶ Torr (about 1.76×10⁻⁴ Pa) using a molybdenum boat.

Next, aluminum was heated in the same manner using a molybdenum boat and was deposited at a deposition rate of 0.06 to 0.19 nm per second and a degree of vacuum of 2.1×10⁻⁶ Torr (about 3.15 to 10.0×10⁻⁴ Pa) to yield an aluminum layer 80 nm thick. A cathode 6 was thus completed.

The temperature of the substrate upon vapor deposition of these layers was kept to room temperature.

Thus, an organic electroluminescent device having a light-emitting area of 2 mm wide and 2 mm long was prepared. The maximal wavelength in emission spectrum of the device was 514 nm, which was identified as being from the iridium complex (D3). The chromaticity in terms of CIE (x, y) was (0.308, 0.621).

The oxidation/reduction potentials of host materials and dopant materials used in the formation of the organic light emitting layer 4 in Examples 4 to 15 and Comparative Example 1 are shown in Table 3.

The normalized luminance half-lives and initial luminance when driven at a constant current, and the current efficiencies and drive voltages upon light emission at a luminance of 100 cd/m² are shown in Table 4.

TABLE 3

| | Oxidation Potential (V vs. SCE) | Reduction Potential (V vs. SCE) |
|---|---|---|
| T5 | 1.20 | −2.02 |
| T6 | 1.30 | −2.09 |

TABLE 3-continued

| | Oxidation Potential (V vs. SCE) | Reduction Potential (V vs. SCE) |
|---|---|---|
| T7 | 1.24 | −1.95 |
| T8 | 1.34 | −1.99 |
| T9 | 0.89 | −2.56 |
| T10 | 1.27 | −2.40 |
| T11 | 0.78 | −2.41 |
| T12 | 0.94 | −2.48 |
| D2 | 0.64 | −2.44 |
| D3 | 0.65 | −2.48 |
| D4 | 1.29 | −1.88 |

TABLE 4

| Host Material | Dopant Material | Normalized Luminance Half-life | Life Converted at 1000 cd/m2* | Initial Luminance (cd/m2) | Current Efficiency (cd/A) | Drive Voltage (V) |
|---|---|---|---|---|---|---|
| T5 | D2 | 2.70 | 9.7 | 2500 | 22.4 | 6.0 |
| T5 | D2 | 5.41 | 19.5 | 2500 | 26.4 | 6.3 |
| T6 | D2 | 10.81 | 38.9 | 2500 | — | — |
| T6 | D3 | 20.27 | 16.4 | 857 | 16.7 | 7.2 |
| T7 | D2 | 21.62 | 8.4 | 508 | — | — |
| T8 | D2 | 10.81 | 10.8 | 1000 | 11.0 | 9.1 |
| T6/T9 | D2 | 3.78 | 3.8 | 1000 | 19.3 | 8.6 |
| T6/T9 | D2 | 3.78 | 3.8 | 1000 | 19.7 | 9.0 |
| T6/T9 | D2 | 4.05 | 4.1 | 1000 | 15.1 | 8.3 |
| T6/T9 | D2 | 4.05 | 4.1 | 1000 | 15.7 | 8.8 |
| T6/T9 | D2 | 1.62 | 1.6 | 1000 | 21.9 | 7.2 |
| T10/T11 | D3 | 1.00 | 1.0 | 1000 | 9.1 | 7.2 |

*Data with initial luminance other than 1000 cd/m² are converted with an accelerating factor of the 1.4th power of the luminance. This is defined as the "Life converted at 1000 cd/m²"

Of the data in Table 4, Table 5 shows the current efficiencies and drive voltages of devices, and the normalized luminance half-lives and initial luminance of the devices when compositions for organic electroluminescent devices were stored at 4° C. or 20° C. in the atmosphere (air) in a dark place.

TABLE 5

| | Storage Condition | | Current Efficiency (cd/A) | Drive Voltage (V) | Normalized Luminance Half-life | Initial Luminance (cd/m$^2$) |
|---|---|---|---|---|---|---|
| | Temperature (° C.) | Time (day) | | | | |
| Example 10 | 4 | 18 | 19.3 | 8.6 | 2.5 | 1000 |
| Example 11 | 20 | 18 | 19.7 | 9.0 | 2.5 | 1000 |
| Example 12 | 4 | 7 | 15.1 | 8.3 | 2.33 | 1000 |
| Example 13 | 20 | 7 | 15.7 | 8.8 | 2.33 | 1000 |
| Example 14 | — | 0 | 21.9 | 7.2 | 1 | 1000 |

These results demonstrate that compositions for organic electroluminescent devices according to the present invention have long pot lives, and devices prepared using the compositions have high luminous efficiencies and long lives.

Referential Example 1

An organic electroluminescent device was prepared in the following manner, in which a light emitting layer was formed by vapor deposition. The resulting organic electroluminescent device has a layer structure as with the organic electroluminescent device shown in FIG. 7, except for having a hole transport layer instead of the hole injection layer 3.

An indium-tin oxide (ITO) transparent electroconductive film deposited to a thickness of 150 nm on a glass substrate 1 (sputtered film; sheet resistance: 15Ω) was patterned in a 2-mm width striped pattern using a common photolithography technique and etching with hydrochloric acid, thereby forming an anode 2. The patterned ITO substrate was rinsed by sequentially carrying out ultrasonic cleaning in acetone, rinsing with pure water, and ultrasonic cleaning in isopropyl alcohol, followed by drying in a nitrogen blow and UV/ozone cleaning.

Next, a hole injection layer 3 was formed by wet coating in the following manner. As materials for the hole injection layer 3, a polymeric compound (PB-2) having a weight-average molecular weight of 29400 and a number-average molecular weight of 12600 and containing an aromatic amino group of the following structural formula, and an electron-acceptor (A-2) of the following structural formula were applied by spin coating under the following conditions.

[Chemical Formula 52]

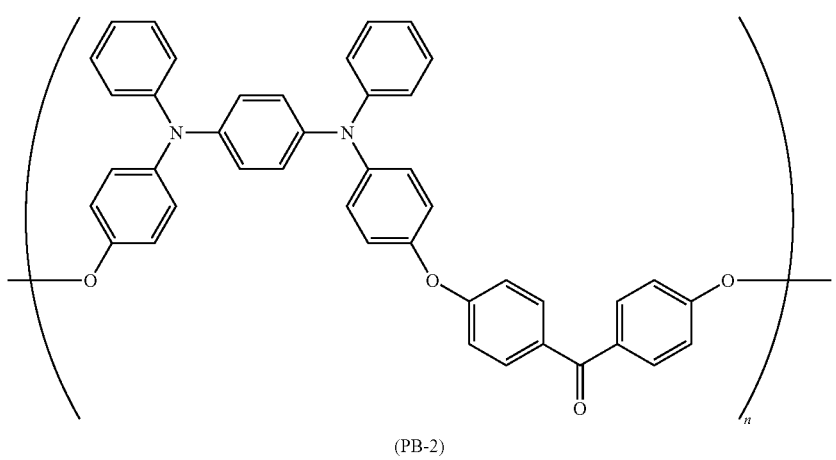

(PB-2)

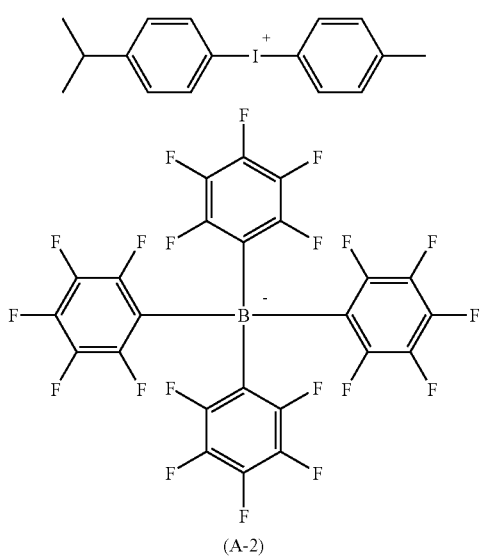

(A-2)

<Conditions of Spin Coating>

Solvent: ethyl benzoate

Concentrations in coating composition: 2.0 percent by weight of PB-2

0.4 percent by weight of A-2

Revolution number of spinner: 1500 rpm

Revolution time of spinner: 30 seconds

Drying condition: drying at 230° C. for 15 minutes

A uniform thin film 30 nm thick was formed by the spin coating.

Subsequently, the following amine derivative (T11) was deposited as a hole transport layer at a crucible temperature of 254° C. to 274° C. and a deposition rate of 0.09 to 0.13 nm per second to a thickness of 40 nm. The vacuum deposition was conducted at a degree of vacuum of 5.2 to 5.3×10$^{-5}$ Pa (about 3.9 to 4.0×10$^{-7}$ Torr).

[Chemical Formula 53]

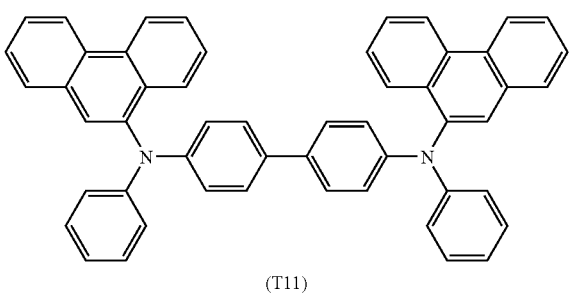

(T11)

Next, the following compound (T10) together with an iridium complex (D5) of the following structural formula was deposited as an organic light emitting layer 4 by vacuum deposition. The vacuum deposition was carried out at a crucible temperature of 288° C. to 293° C. and a deposition rate of 0.08 to 0.09 nm per second for the compound (T10), and at a crucible temperature of 247° C. to 248° C. and a deposition rate of 0.005 nm per second for the compound (D5), to thereby yield a film 30 nm thick. The vacuum deposition was conducted at a degree of vacuum of 5.4 to 5.5×10$^{-5}$ Pa (about 4.1×10$^{-7}$ Torr). The compound (D5) has an oxidation potential of +0.71 V and a reduction potential of −2.3 V.

[Chemical Formula 54]

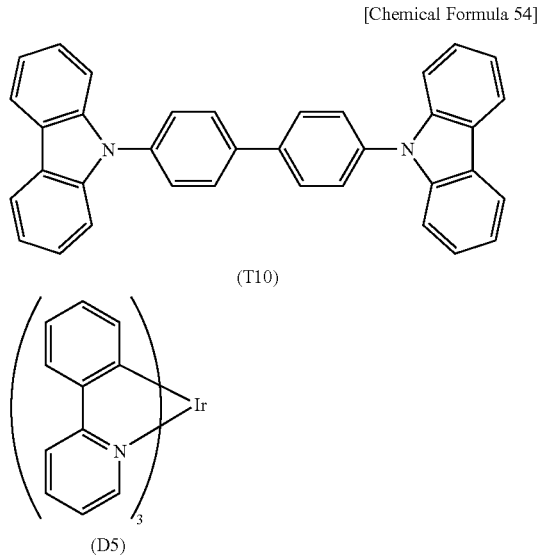

Next, the pyridine derivative (HB-1) was deposited as a hole blocking layer 9 to a thickness of 5 nm. The vacuum deposition was conducted at a crucible temperature of 230° C. to 233° C., a deposition rate of 0.09 to 0.11 nm per second, and a degree of vacuum of 5.3 to 5.1×10$^{-5}$ Pa (about 4.0 to 3.8×10$^{-7}$ Torr).

Next, the aluminum 8-hydroxyquinoline complex (ET-1) was deposited as an electron transport layer 8 on the hole blocking layer 9 in the same manner. The temperature of the crucible for the aluminum 8-hydroxyquinoline complex in this procedure was controlled within the range of from 263° C. to 259° C. The vacuum deposition was conducted at a degree of vacuum of 5.3 to 5.2×10$^{-5}$ Pa (about 4.0 to 3.9×10$^{-6}$ Torr) and a deposition rate of 0.1 to 0.13 nm per second to yield a film 30 nm thick.

The temperature of the substrate upon vacuum deposition of the hole blocking layer 9 and the electron transport layer 8 was kept to room temperature.

The device which had been subjected to vacuum deposition up to the electron transport layer 8 was once taken out of the vacuum deposition apparatus into the atmosphere. A 2-mm width striped shadow mask as a mask for vacuum deposition of a cathode was brought into intimate contact with the device perpendicularly to the ITO stripe of the anode 2, and the device was placed in another vacuum deposition apparatus. The apparatus was evacuated to a degree of vacuum of 1.4×10$^{-6}$ Torr (about 1.9×10$^{-4}$ Pa) or less in the same manner as with the organic layers.

As an electron injection layer 5, lithium fluoride (LiF) was deposited to a thickness of 0.5 nm on the electron transport layer 8. The vacuum deposition was conducted at a deposition rate of 0.6 nm per second and a degree of vacuum of 2.2×10$^{-6}$ Torr (about 2.9×10$^{-4}$ Pa) using a molybdenum boat. Next, aluminum was heated in the same manner using a molybdenum boat and was deposited at a deposition rate of 0.1 to 0.5 nm per second and a degree of vacuum of 4.8 to 10.0×10$^{-6}$ Torr (about 6.4 to 13.3×10$^{-4}$ Pa) to yield an aluminum layer 80 nm thick. A cathode 6 was thus completed.

The temperature of the substrate upon vacuum deposition of the two-layered cathode 6 was kept to room temperature.

Thus, an organic electroluminescent device having a light-emitting area of 2 mm wide and 2 mm long was prepared. The maximal wavelength in emission spectrum of the device was 512 nm, which was identified as being from the iridium complex (D5). The chromaticity in terms of CIE (x, y) was (0.294, 0.588).

Referential Example 2

An organic electroluminescent device was prepared in the same manner as with Referential Example 1, except for forming an organic light emitting layer 4 by vacuum deposition under the following conditions using the following compound (T5) and an iridium complex (D5) of the following structural formula.

The vacuum deposition was conducted at a crucible temperature of 428° C. to 425° C. and a deposition rate of 0.09 to 0.08 nm per second for the compound (T5), and at a crucible temperature of 251° C. to 254° C. and a deposition rate of 0.005 nm per second for the compound (D5), to yield a film 30 nm thick. The vacuum deposition was conducted at a degree of vacuum of 6.0 to 6.1×10$^{-5}$ Pa (about 4.5 to 4.6×10$^{-7}$ Torr).

[Chemical Formula 55]

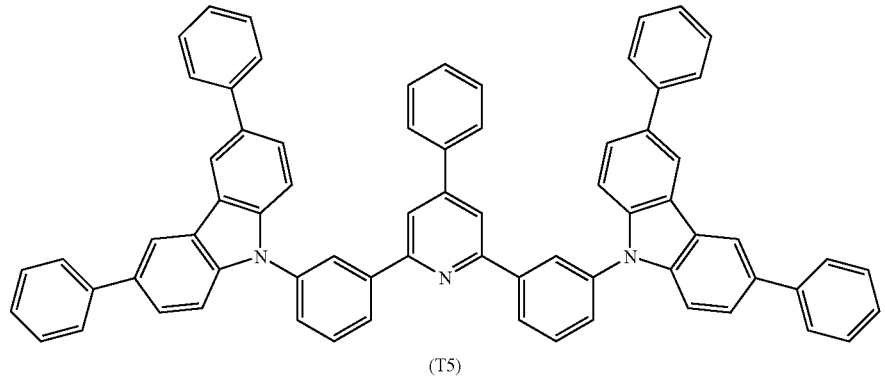

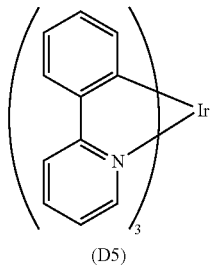

(D5)

The maximal wavelength in emission spectrum of the device was 513 nm, which was identified as being from the iridium complex (D5). The chromaticity in terms of CIE (x, y) was (0.301, 0.597).

Table 6 shows, of the devices produced by vacuum deposition, the current efficiencies and drive voltages at a luminance of 100 cd/m², and the normalized luminance half-lives when driven at a constant current provided that the initial luminance is 2500 cd/m².

TABLE 6

|  | Current Efficiency (cd/A) | Drive Voltage (V) | Normalized Luminance Half-life | Initial Luminance (cd/m²) |
|---|---|---|---|---|
| Referential Example 1 | 28.8 | 5.0 | 1 | 2500 |
| Referential Example 2 | 22.4 | 6.1 | 0.64 | 2500 |

The results in Table 6 demonstrate that there is not so much difference between effects of the devices prepared according to vacuum deposition, regardless of whether or not the condition as specified in the present invention is satisfied.

While the present invention has been shown and described in detail with reference to specific embodiments thereof, it will be understood by those skilled in the art that various changes and modifications may be made without departing from the spirit and scope of the present invention.

The present application is based on Japanese Patent Application No. 2005-044250 filed on Feb. 21, 2005, the entire contents of which being incorporated herein by reference.

The invention claimed is:

1. A composition for an organic electroluminescent device, comprising a phosphorescent material, a charge transport material, and a solvent,
wherein each of the phosphorescent material and the charge transport material is independently an unpolymerized organic compound,
wherein at least one of the phosphorescent material and the charge transport material comprises two or more different materials,
wherein the first oxidation potential of the phosphorescent material $E_{D+}$,
the first reduction potential of the phosphorescent material $E_{D-}$,
the first oxidation potential of the charge transport material $E_{T+}$, and
the first reduction potential of the charge transport material $E_{T-}$
satisfy the following condition:

$E_{D-}+0.1 \leq E_{T-} < E_{D+} \leq E_{T+} - 0.1$, wherein when the composition contains two or more different charge transport materials, the first oxidation potential of the charge transport material $E_{T+}$ refers to the first oxidation potential of a charge transport material which has the smallest first oxidation potential, and the first reduction potential of the charge transport material $E_{T-}$ refers to the first reduction potential of a charge transport material which has the largest first reduction potential,
wherein when the composition contains two or more different phosphorescent materials, the first oxidation potential of the phosphorescent material $E_{D+}$ refers to the first oxidation potential of a phosphorescent material which has the smallest first oxidation potential, and the first reduction potential of the phosphorescent material $E_{D-}$ refers to the first reduction potential of a phosphorescent material which has the largest first reduction potential,
wherein the phosphorescent material or each of the two or more different phosphorescent materials is represented by the following Formulae (4a), (4b), or (4c):

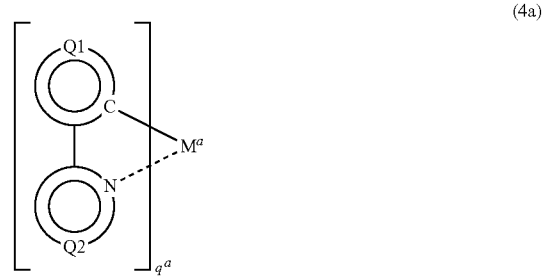

(4a)

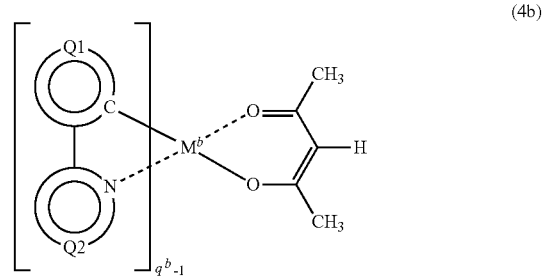

(4b)

-continued

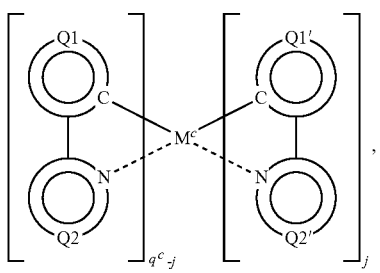

(4c)

wherein each of Rings Q1 and Q1' are independently a phenyl group which can be optionally substituted,
wherein Ring Q2 and Ring Q2' are each independently a pyridyl group which can be optionally substituted,
wherein Ring Q2, Ring Q2', or both are optionally substituted,
wherein each of $M^a$, $M^b$, and $M^c$ are iridium, and
wherein each $q^a$, $q^b$, and $q^c$ represents the valency of the metal $M^a$, $M^b$, and $M^c$, respectively,
wherein the charge transport material or each of the two or more different charge transport materials is an organic compound represented by the following formula:

(A)n-Z, wherein "A" represents an aromatic hydrocarbon group having from 6 to 30 carbon atoms, or an aromatic heterocyclic group having from 1 to 29 carbon atoms,
"n" is an integer from 2 to 6;
"Z" is an aromatic hydrocarbon group having from 6 to 20 carbon atoms, an aromatic heterocyclic group having from 3 to 19 carbon atoms, or an amino group substituted with an alkyl group having from 1 to 36 carbon atoms or an aromatic hydrocarbon group having from 6 to 36 carbon atoms;
wherein plural "A"s may be the same or different from each other,
wherein a molecular weight of "A" is 2000 or less, and
wherein a molecular weight of "Z" is 2000 or less,
"A" and "Z" may each further be substituted with a linear or branched alkyl group having from 1 to 12 carbon atoms, an aromatic hydrocarbon group having from 6 to 14 carbon atoms, or an aromatic heterocyclic group having from 3 to 13 carbon atoms,
wherein a molecular weight of the phosphorescent material is from 400 to 3000,
wherein a molecular weight of the charge transport material is from 500 to 3000, and
wherein the first oxidation potential and the first reduction potential are determined by cyclic voltammetry, wherein a tested material is dissolved in an organic solvent containing 0.1 mol/L of a supporting electrolyte to yield a 0.1 to 2 mM solution, oxygen is removed from the solution by bubbling of dry nitrogen, degassing under reduced pressure, or application of ultrasound, the solution in an electrically neutral state is subjected to electrolytic oxidation or reduction using a working electrode and a counter electrode at a sweep rate of 100 mV/sec, the potential of a first peak detected in the electrolytic oxidation or reduction is compared with the oxidation/reduction potential of a reference material, thereby determining the oxidation or reduction potential of the tested material, and the oxidation or reduction potential thus determined is further converted into a value versus saturated calomel electrode (SCE) as the reference electrode, and the converted value is defined as the first oxidation or reduction potential.

2. The composition for an organic electroluminescent device according to claim 1, wherein each of the phosphorescent material and the charge transport material independently has a molecular weight of 100 to 10000.

3. The composition for an organic electroluminescent device according to claim 1, wherein the composition has a water content of 1 percent by weight or less.

4. A thin film for an organic electroluminescent device formed from the composition for an organic electroluminescent device of claim 1 by a wet coating process.

5. The thin film for an organic electroluminescent device according to claim 4, wherein the thin film has a refractive index of 1.78 or less with respect to light having a wavelength of 500 nm to 600 nm.

6. A transfer member for a thin film for an organic electroluminescent device, comprising a base material and a thin film arranged on the base material, wherein the thin film is formed from the composition for an organic electroluminescent device of claim 1 by a wet coating process.

7. An organic electroluminescent device comprising a substrate bearing an anode, a cathode, and an organic light emitting layer arranged between the two electrodes, wherein the organic light emitting layer is a layer formed by using the transfer member for a thin film for an organic electroluminescent device of claim 6.

8. An organic electroluminescent device comprising a substrate bearing an anode, a cathode, and an organic light emitting layer arranged between the anode and cathode, wherein the organic light emitting layer is a layer formed from the composition for an organic electroluminescent device of claim 1 by a wet coating process.

9. The organic electroluminescent device according to claim 7, further comprising a hole injection layer between the organic light emitting layer and the anode.

10. The organic electroluminescent device according to claim 8, further comprising a hole injection layer between the organic light emitting layer and the anode.

11. The organic electroluminescent device according to claim 7, further comprising an electron injection layer between the organic light emitting layer and the cathode.

12. The organic electroluminescent device according to claim 8, further comprising an electron injection layer between the organic light emitting layer and the cathode.

13. A method of manufacturing an organic electroluminescent device, wherein the device comprises a substrate bearing an anode, a cathode, and an organic light emitting layer arranged between the anode and cathode, the method comprising forming the organic light emitting layer by a wet coating process using the composition for an organic electroluminescent device of claim 1.

14. A composition for an organic electroluminescent device, comprising a phosphorescent material, a charge transport material, and a solvent,
wherein each of the phosphorescent material and the charge transport material is independently an unpolymerized organic compound, and
wherein the first oxidation potential of the phosphorescent material $ED^+$,
the first reduction potential of the phosphorescent material $ED^-$,
the first oxidation potential of the charge transport material $ET^+$, and the first reduction potential of the charge transport material $E_T^-$
satisfy the following condition:

$$E_D\text{-}+0.1 \le E_T\text{-} < E_{D^+} \le E_{T^+}-0.1$$

wherein the phosphorescent material is represented by at least one formula selected from the group consisting of (D1), (D2), and (D3), and the charge transporting material is represented by at least one formula selected from the group consisting of (T1) to (T8):

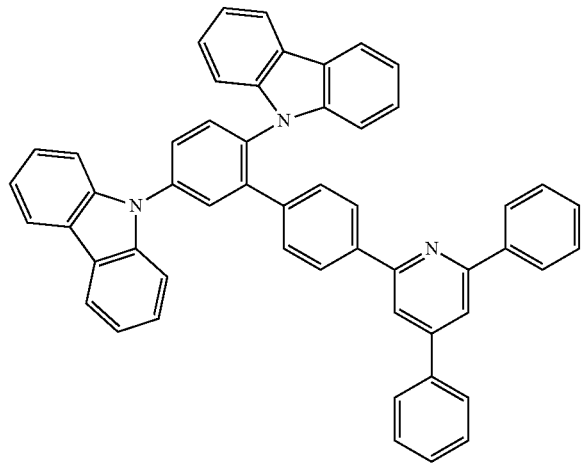

(T1)

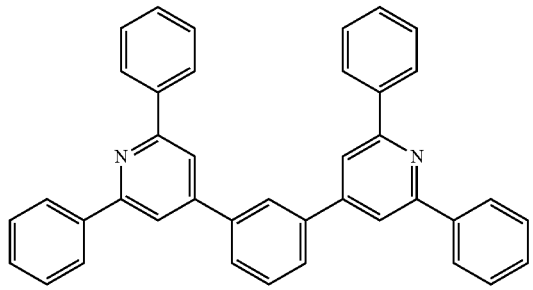

(T2)

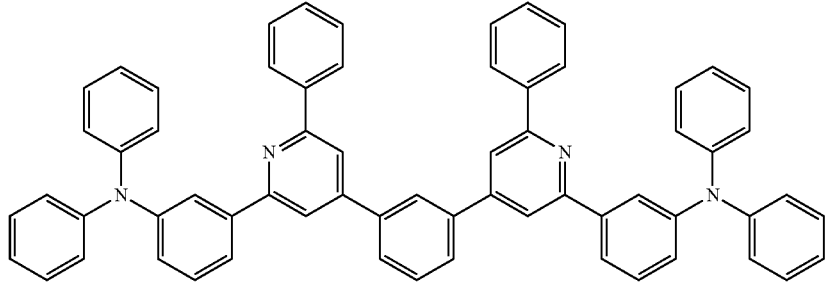

(T3)

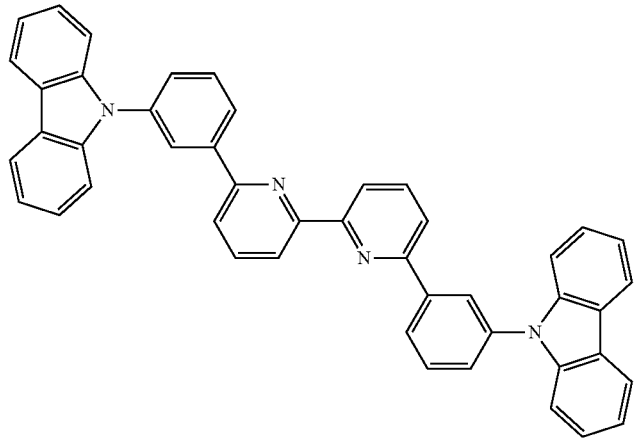

(T4)

(T5)
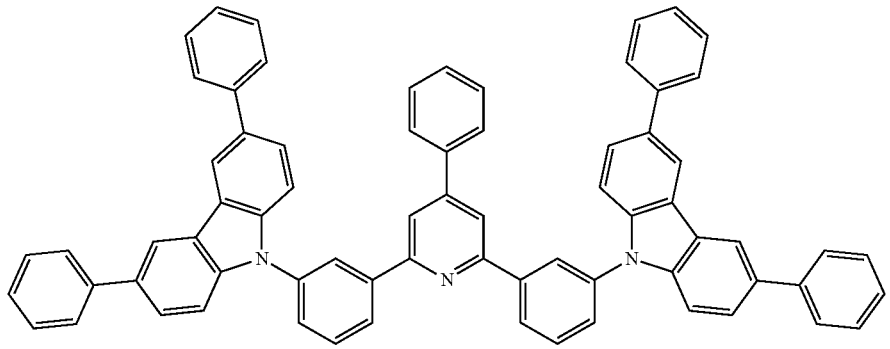
(T6)
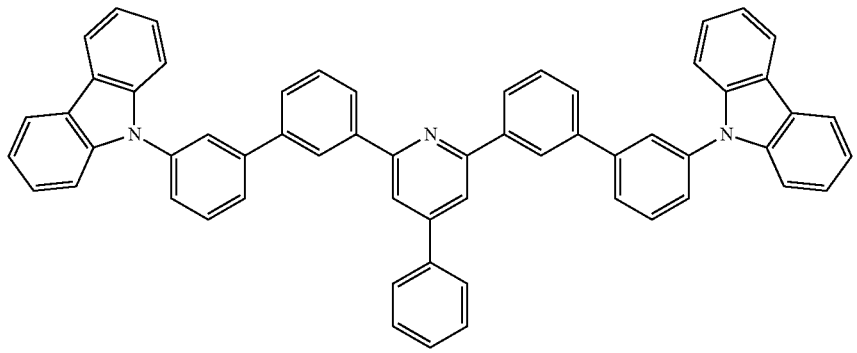
(T7)
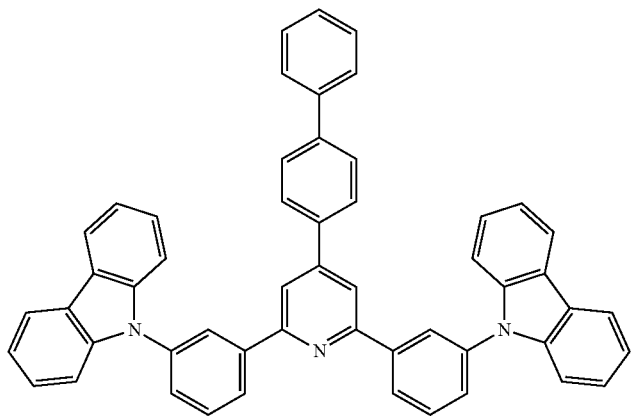
(T8)
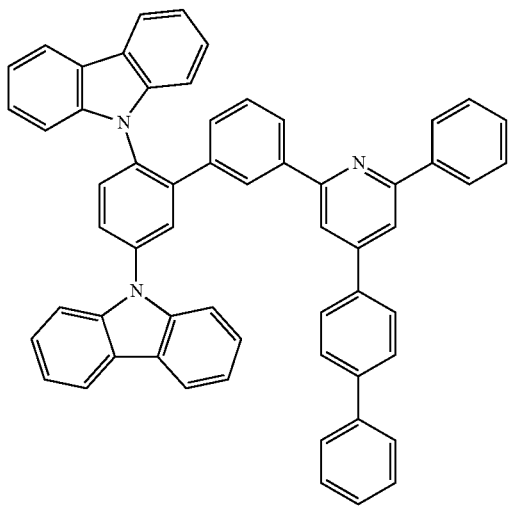

-continued (D1)
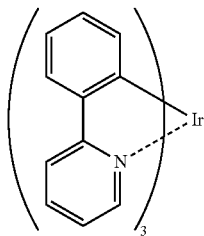

(D2)
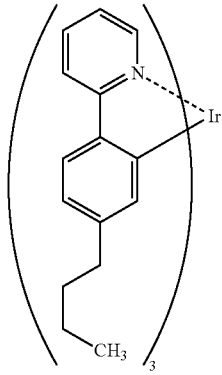

(D3)
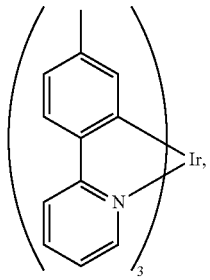

wherein the first oxidation potential and the first reduction potential are determined by cyclic voltammetry, wherein a tested material is dissolved in an organic solvent containing 0.1 mol/L of a supporting electrolyte to yield a 0.1 to 2 mM solution, oxygen is removed from the solution by bubbling of dry nitrogen, degassing under reduced pressure, or application of ultrasound, the solution in an electrically neutral state is subjected to electrolytic oxidation or reduction using a working electrode and a counter electrode at a sweep rate of 100 mV/sec, the potential of a first peak detected in the electrolytic oxidation or reduction is compared with the oxidation/reduction potential of a reference material, thereby determining the oxidation or reduction potential of the tested material, and the oxidation or reduction potential thus determined is further converted into a value versus saturated calomel electrode (SCE) as the reference electrode, and the converted value is defined as the first oxidation or reduction potential.

\* \* \* \* \*